United States Patent [19]
Hasegawa et al.

[11] Patent Number: 5,892,724
[45] Date of Patent: Apr. 6, 1999

[54] NAND-TYPE DYNAMIC RAM HAVING TEMPORARY STORAGE REGISTER AND SENSE AMPLIFIER COUPLED TO MULTI-OPEN BIT LINES

[75] Inventors: Takehiro Hasegawa; Yukihito Oowaki; Fujio Masuoka, all of Yokohama; Ryu Ogiwara, Kawasaki; Shinichiro Shiratake, Tokyo; Shigeyoshi Watanabe, Yokohama, all of Japan

[73] Assignee: Kabushiki Kaisha Toshiba, Kawasaki, Japan

[21] Appl. No.: 848,152

[22] Filed: Apr. 29, 1997

Related U.S. Application Data

[62] Division of Ser. No. 446,291, May 22, 1995, Pat. No. 5,625,602, which is a continuation of Ser. No. 154,124, Nov. 18, 1993, abandoned, which is a continuation-in-part of Ser. No. 978,508, Nov. 18, 1992, abandoned.

[30] Foreign Application Priority Data

| Nov. 18, 1991 | [JP] | Japan | 3-329474 |
| Mar. 23, 1992 | [JP] | Japan | 4-65122 |
| Nov. 10, 1992 | [JP] | Japan | 4-299867 |
| Nov. 18, 1992 | [JP] | Japan | 4-331238 |

[51] Int. Cl.$^6$ .................................................. G11C 8/00
[52] U.S. Cl. .............................. 365/230.03; 365/189.05
[58] Field of Search ........................... 365/149, 230.03, 365/189.05, 196, 230.06

[56] References Cited

U.S. PATENT DOCUMENTS

| 4,616,343 | 10/1986 | Ogawa | 365/203 |
| 4,648,073 | 3/1987 | Kenney | 365/149 |
| 4,858,190 | 8/1989 | Yamaguchi et al. | 365/189.05 |
| 4,947,373 | 8/1990 | Yamaguchi et al. | 365/189.04 |
| 5,111,386 | 5/1992 | Fujishima et al. | 395/425 |
| 5,274,585 | 12/1993 | Suyama et al. | 365/149 |
| 5,299,157 | 3/1994 | Kimura et al. | 365/189.02 |
| 5,299,165 | 3/1994 | Kimura et al. | 365/210 |
| 5,341,326 | 8/1994 | Takase et al. | 365/149 |
| 5,369,612 | 11/1994 | Furuyama | 365/189.05 |

FOREIGN PATENT DOCUMENTS

| 0499224 | 8/1992 | European Pat. Off. | 365/149 |
| 4-147490 | 5/1992 | Japan . | |
| 4212780 | 8/1992 | Japan | 365/149 |

OTHER PUBLICATIONS

1991 IEEE International Solid–State Circuits Conference Digest of Technical Papers, vol. 34, TA 6.2, pp. 106–107; 297, Katsutaka Kimura, et al., "A Block–Oriented RAM with Half–Sized DRAM Cell and Quasi–Folded Data–Line Architecture".

1993 IEEE International Solid–State Circuits Conference, Digest of Technical Papers, vol. 36, pp. 46–47, Takehiro Hasegawa, et al., "An Experimental DRAM with a NAND–Structured Cell".

*Primary Examiner*—David Nelms
*Assistant Examiner*—Andrew Q. Tran
*Attorney, Agent, or Firm*—Oblon, Spivak, McClelland, Maier & Neustadt, P.C.

[57] ABSTRACT

A sense amplifier is connected between memory cell arrays, a re-writing register is arranged adjacent to the sense amplifier, first transfer gates are disposed between the sense amplifier and the memory cell arrays, second transfer gates are provided between bit lines of the memory cell arrays and global bit lines, and a gate control circuit for controlling the transfer gates is provided. When readout data is written into the register, the node of the sense amplifier is electrically separated from the bit lines and global bit lines.

10 Claims, 72 Drawing Sheets

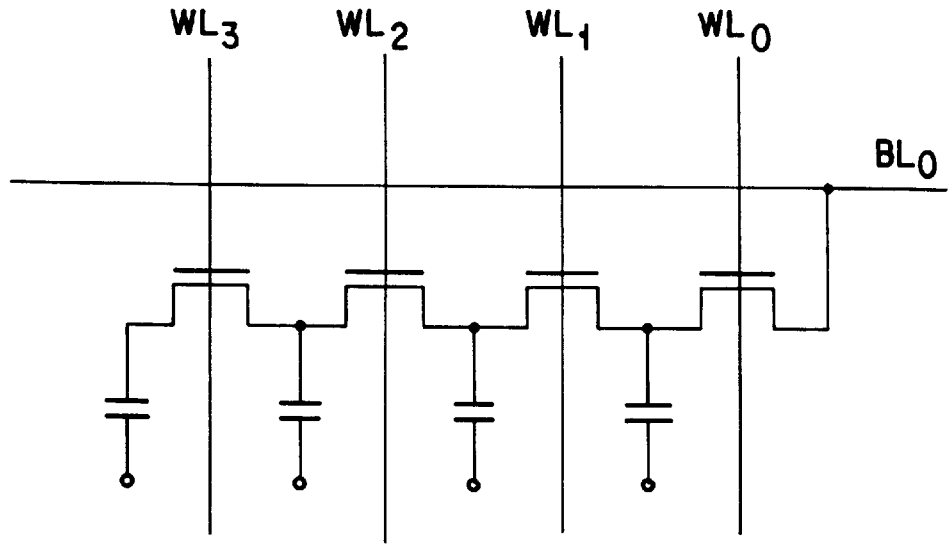
F I G. 3A
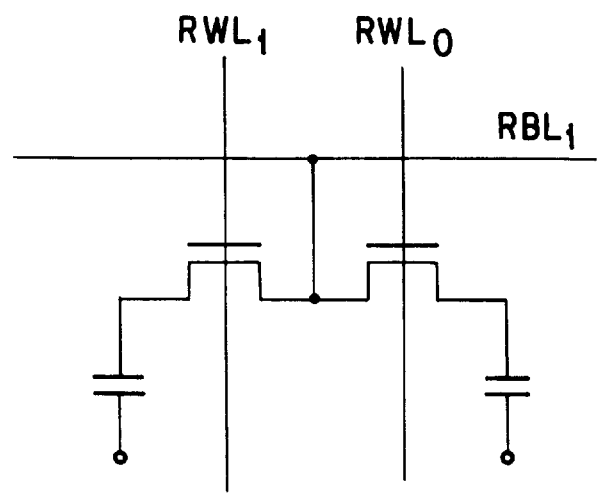
F I G. 3B

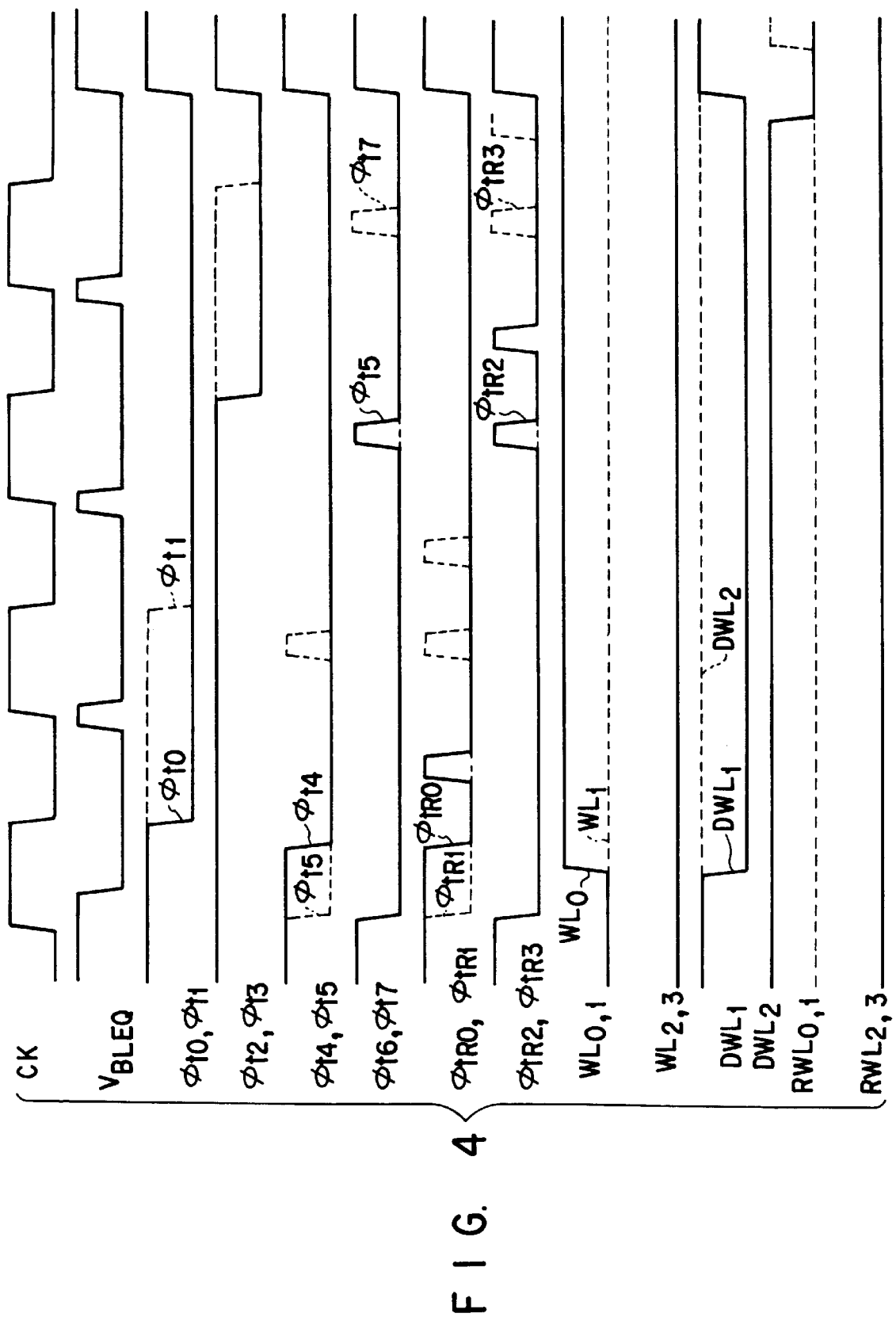
F I G. 4

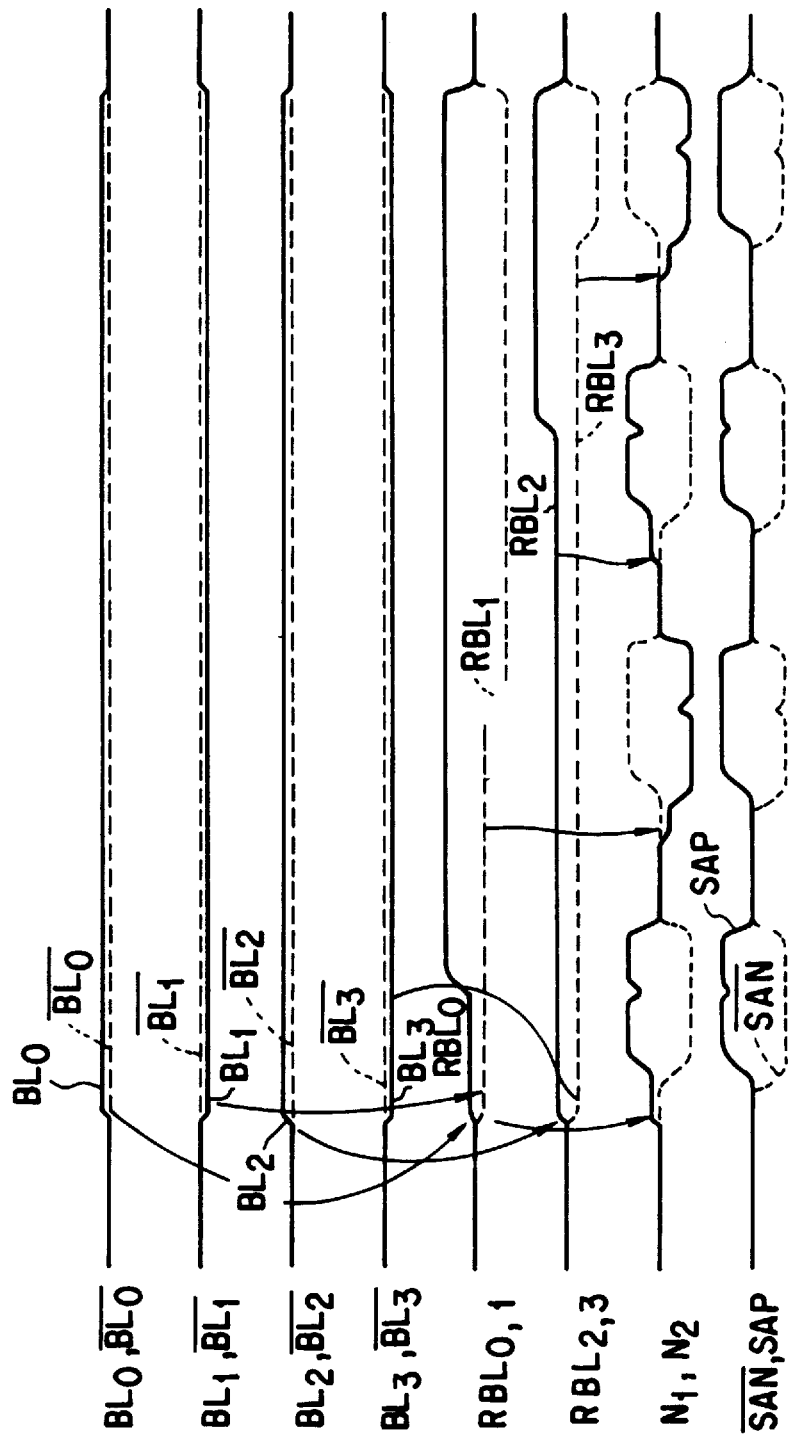
F I G. 5

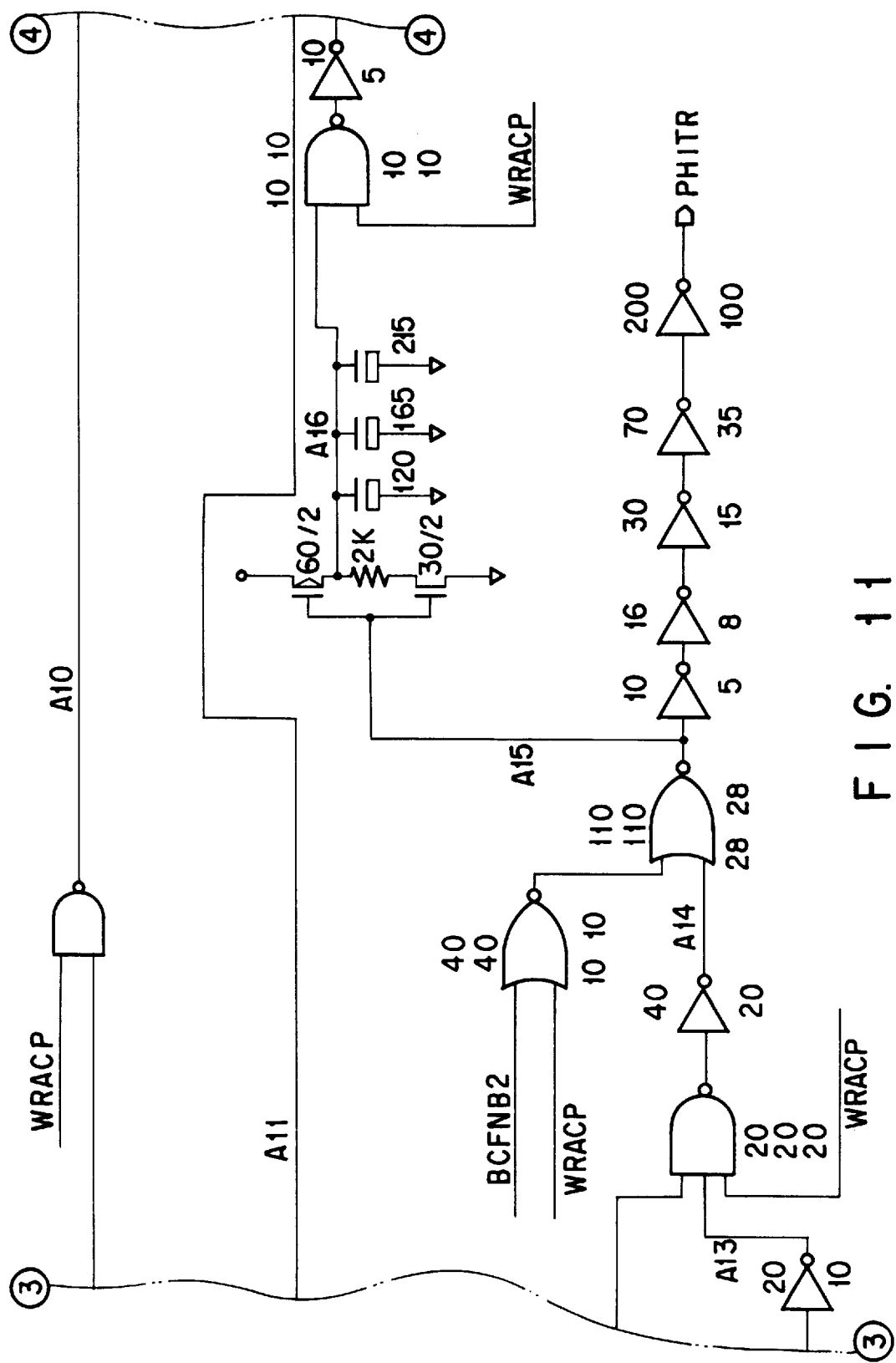
F I G. 11

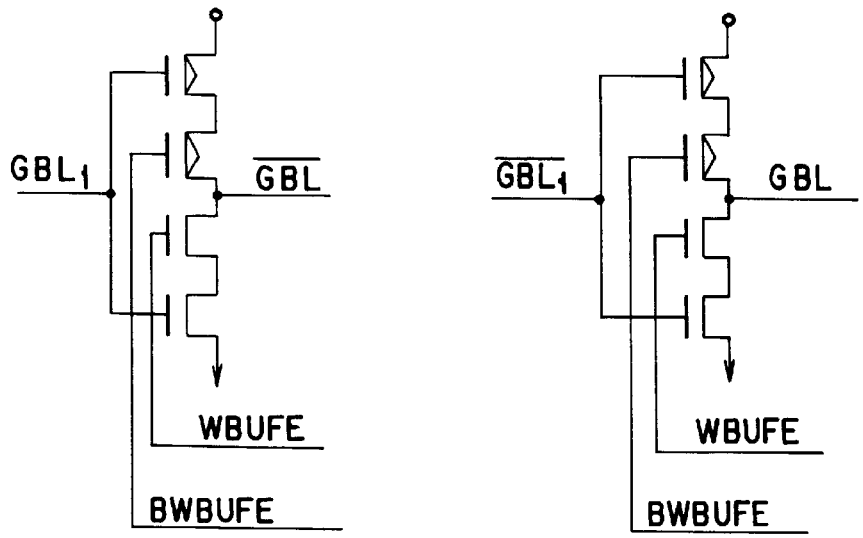
F I G. 13A    F I G. 13B
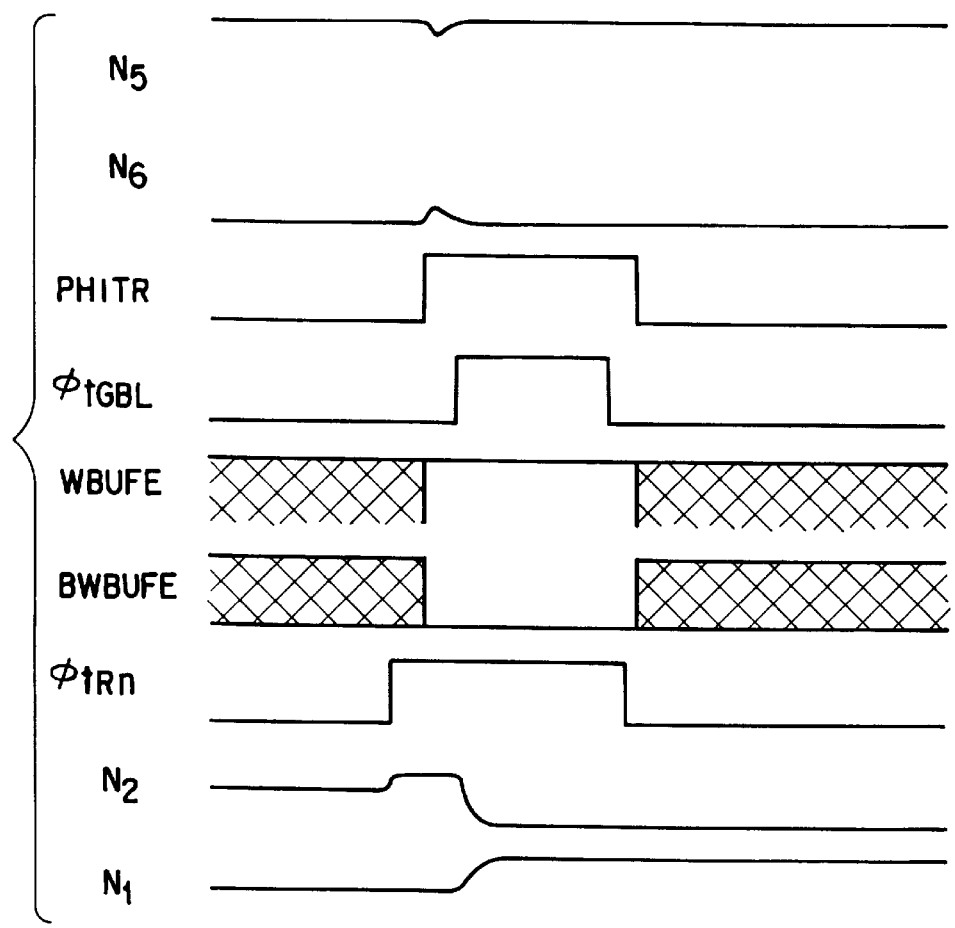
F I G. 14

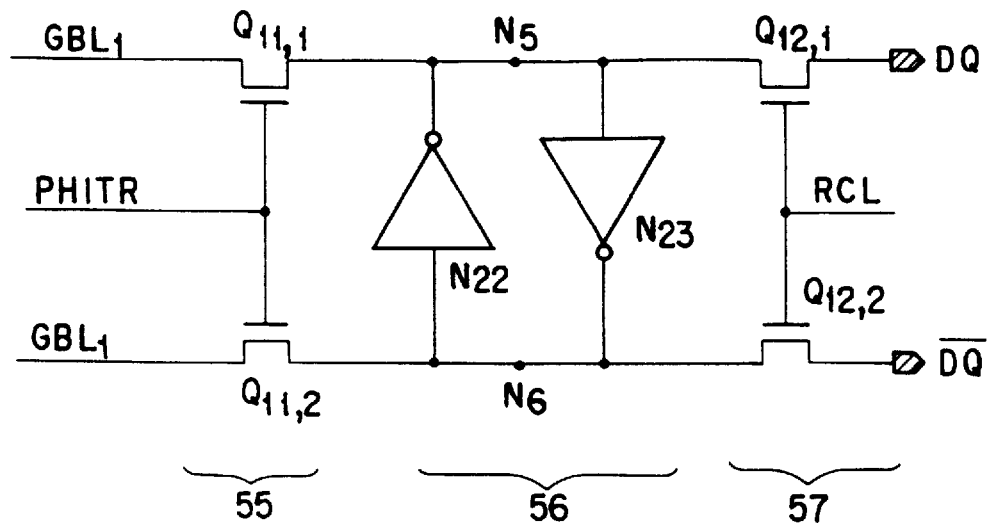
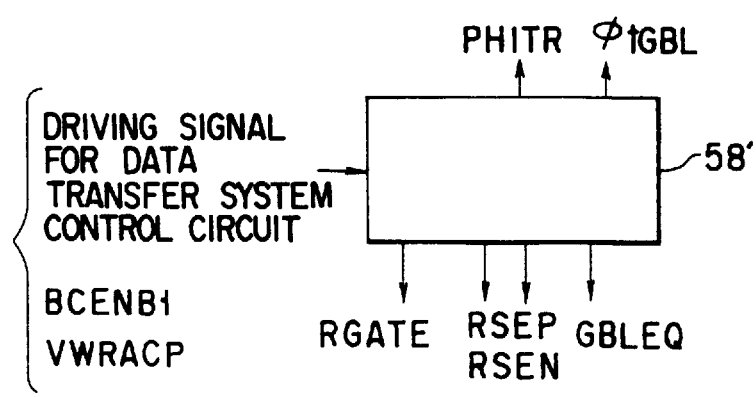
F I G. 16

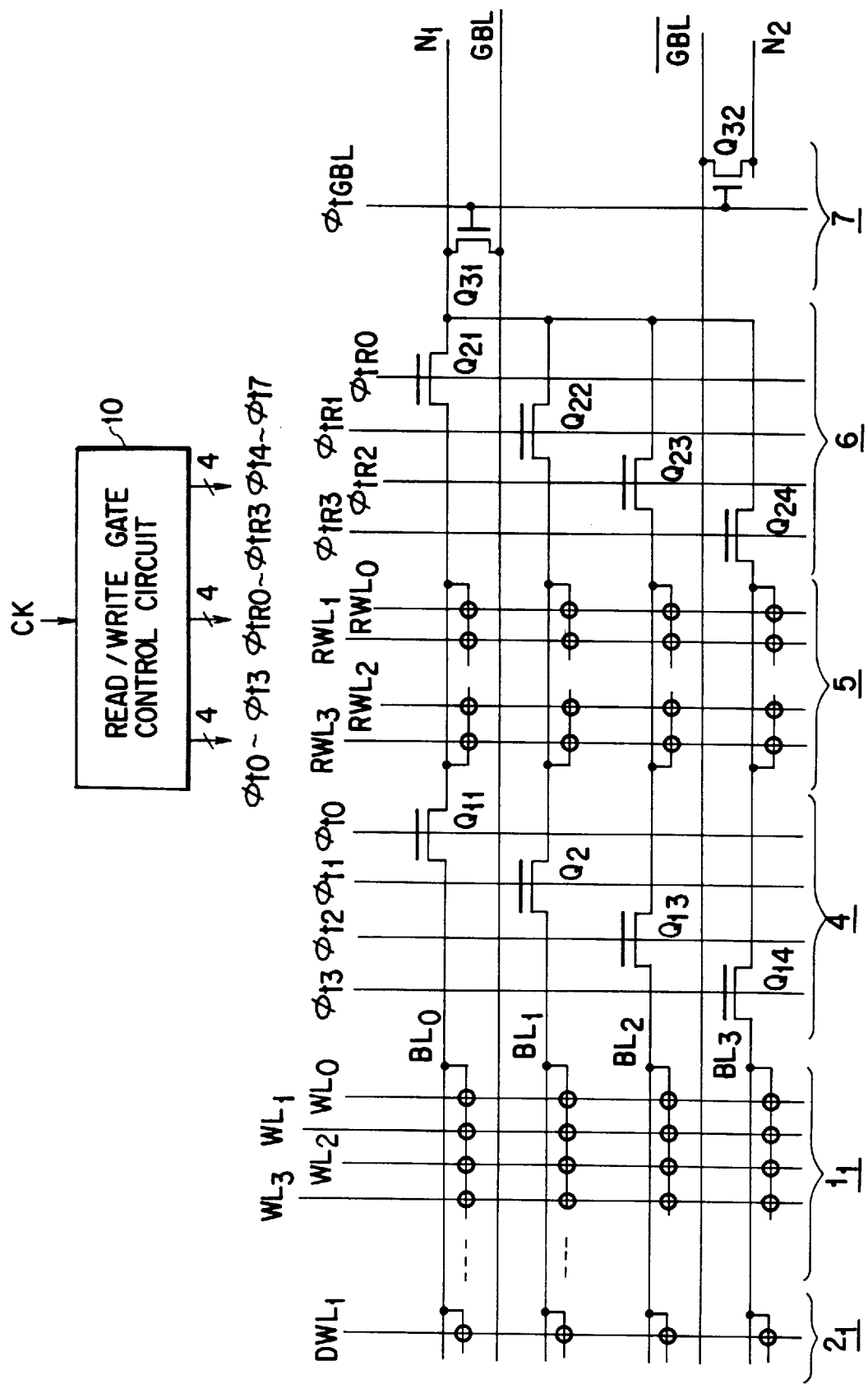
F I G. 20

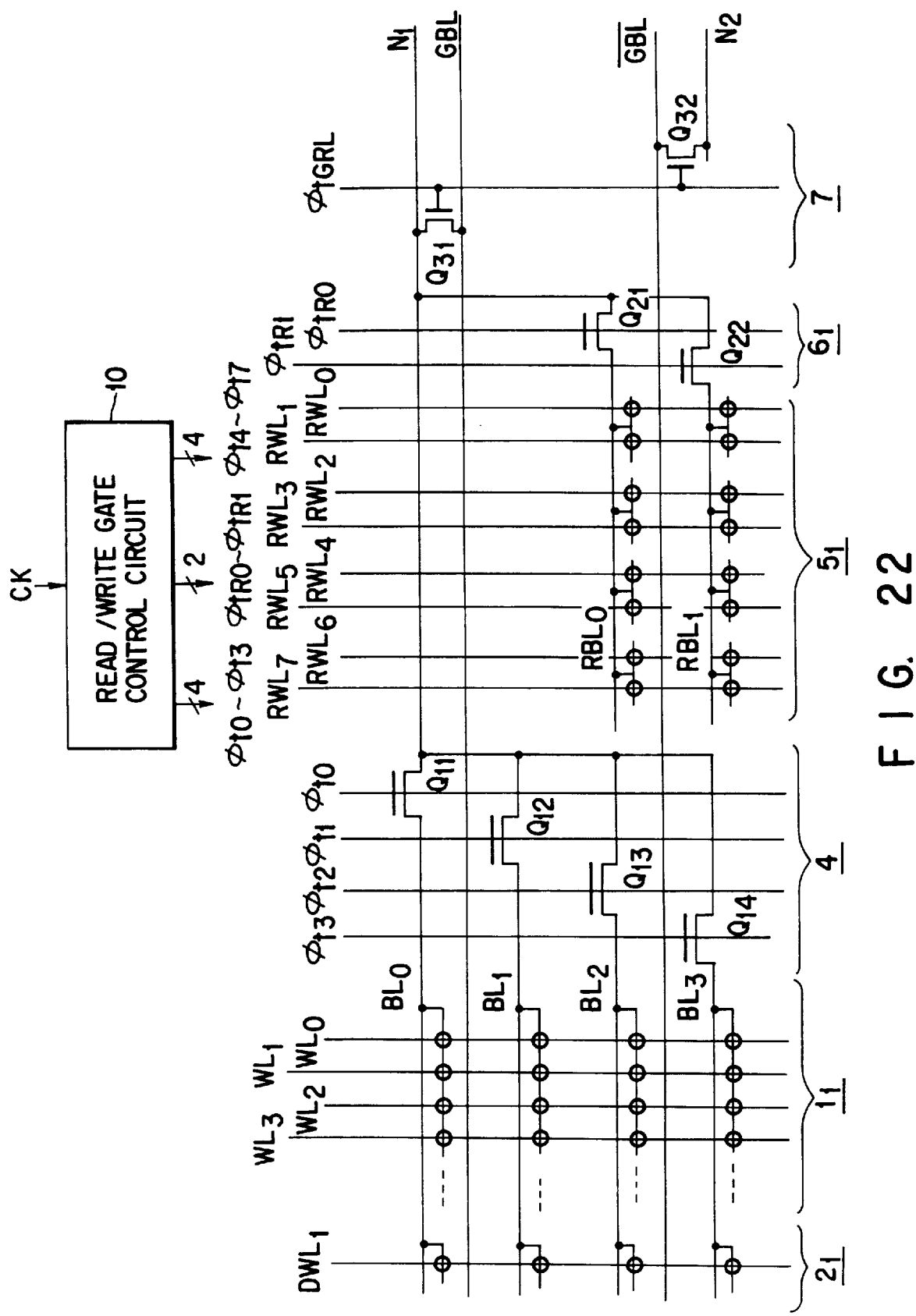
F I G. 22

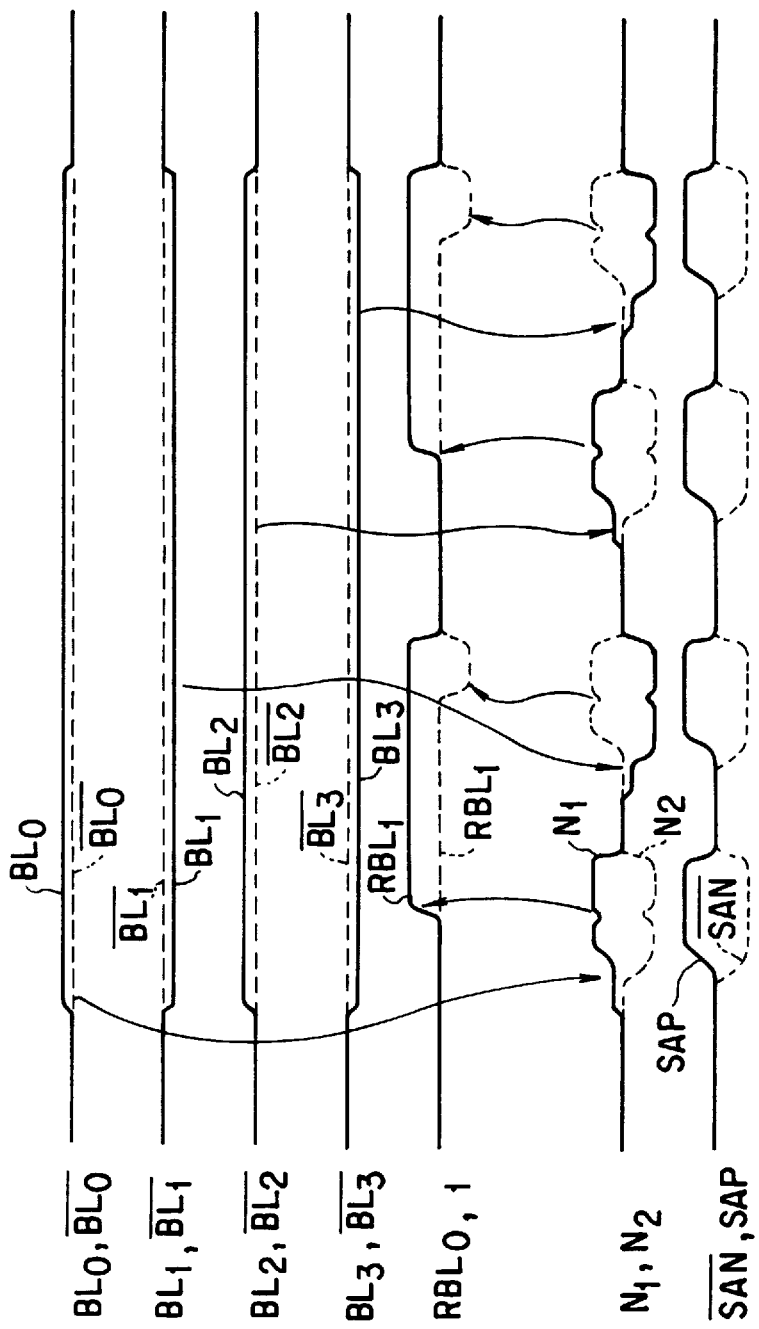
F I G. 25

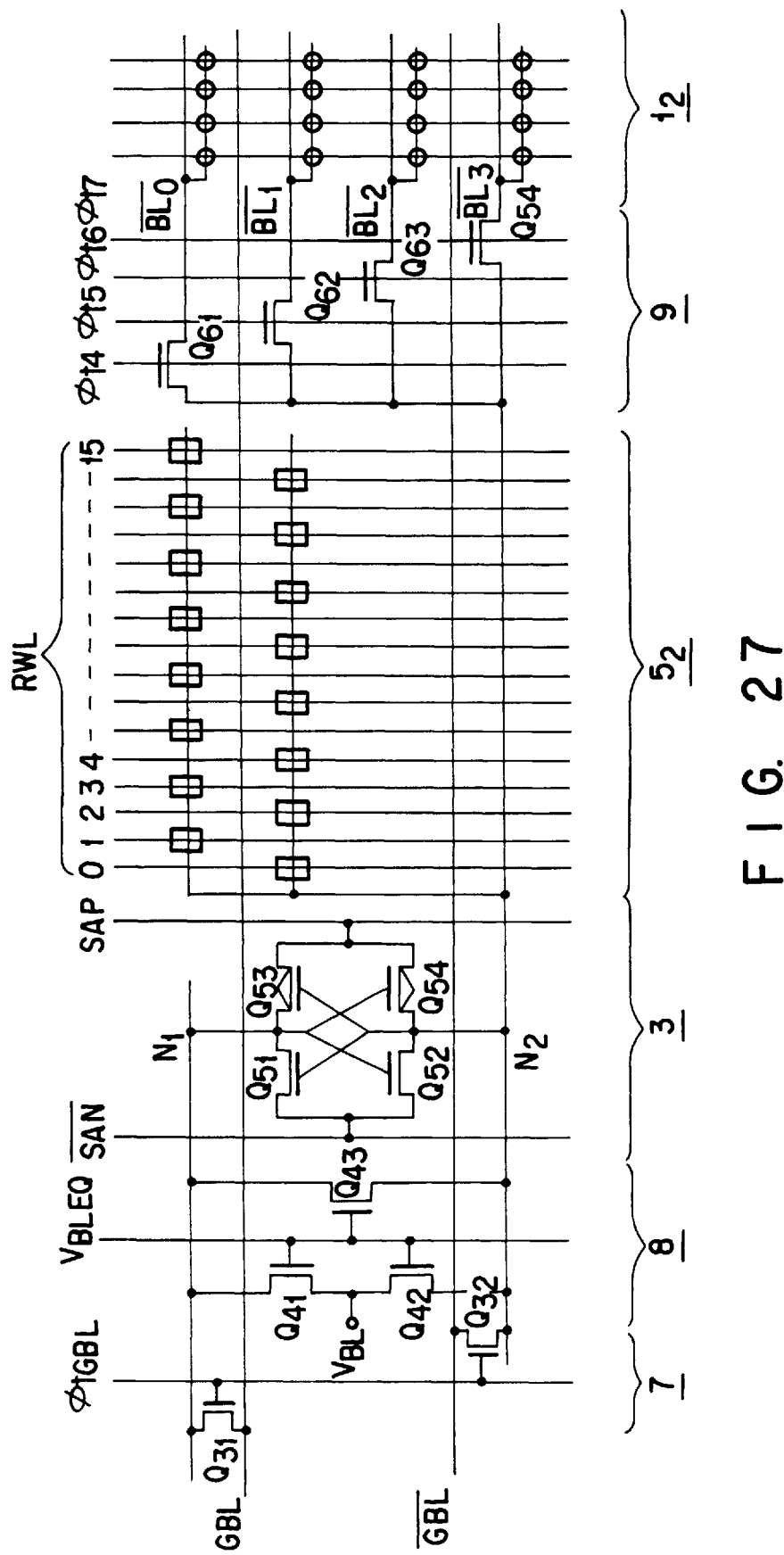
F I G. 27

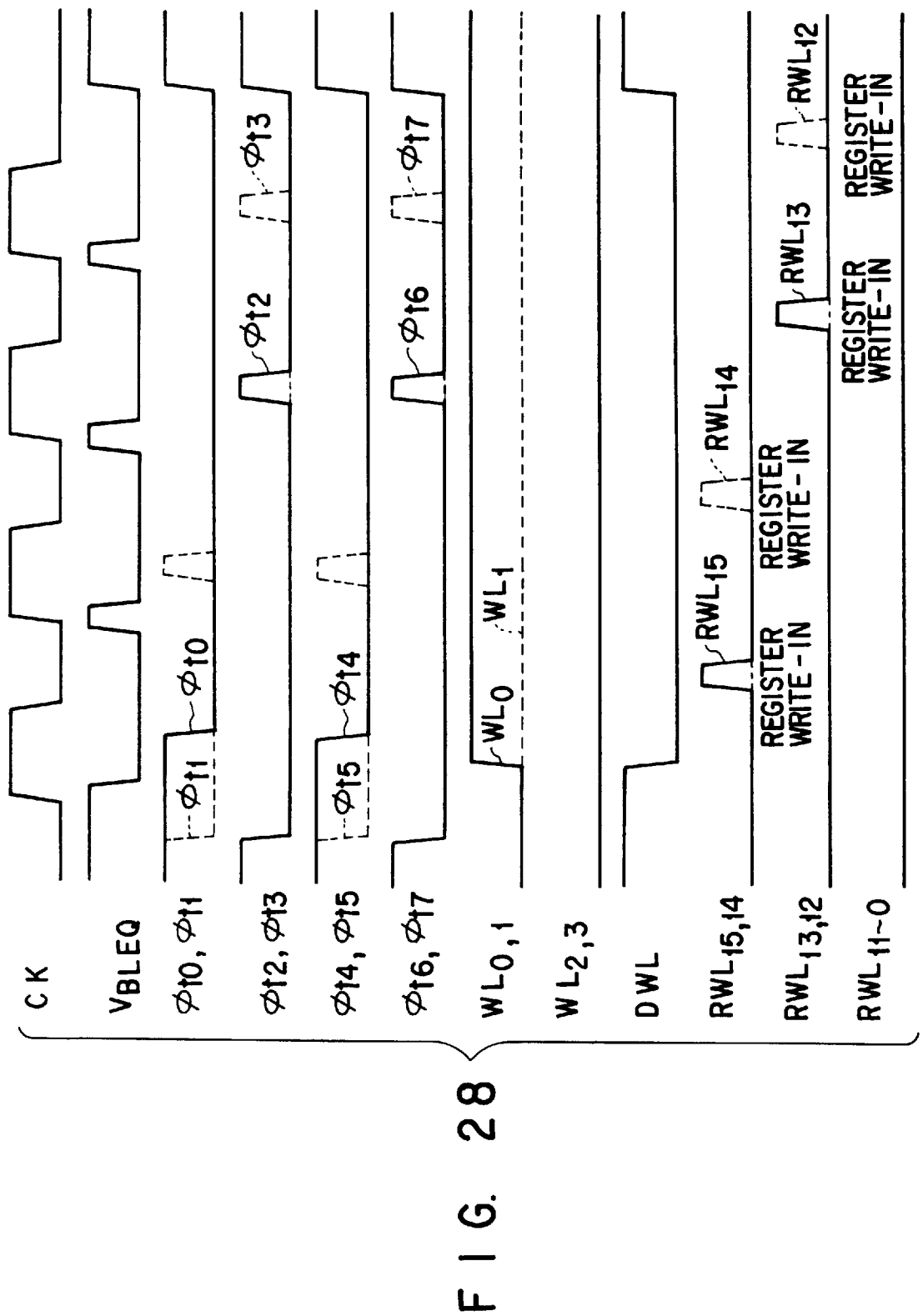
F I G. 28

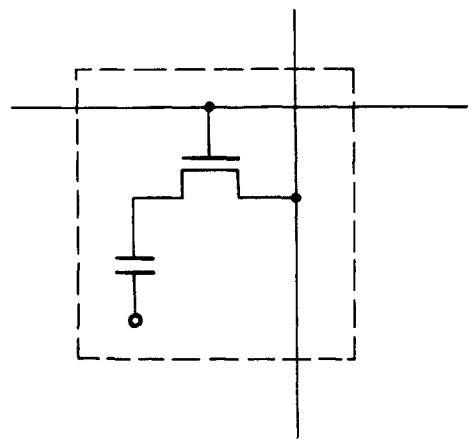
F I G. 30A
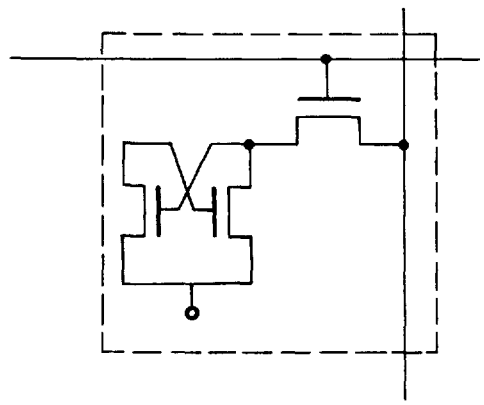
F I G. 30B

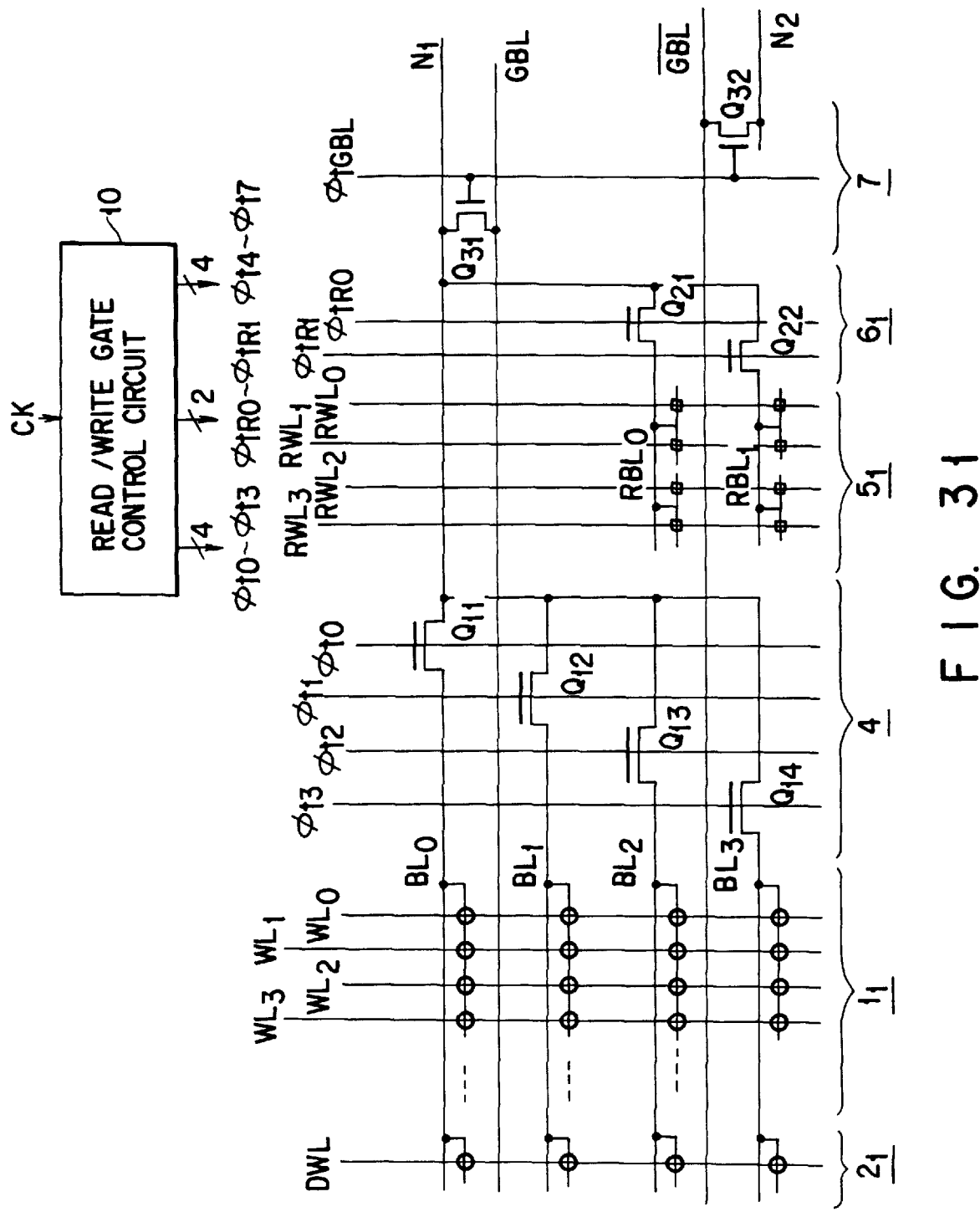
F I G. 31

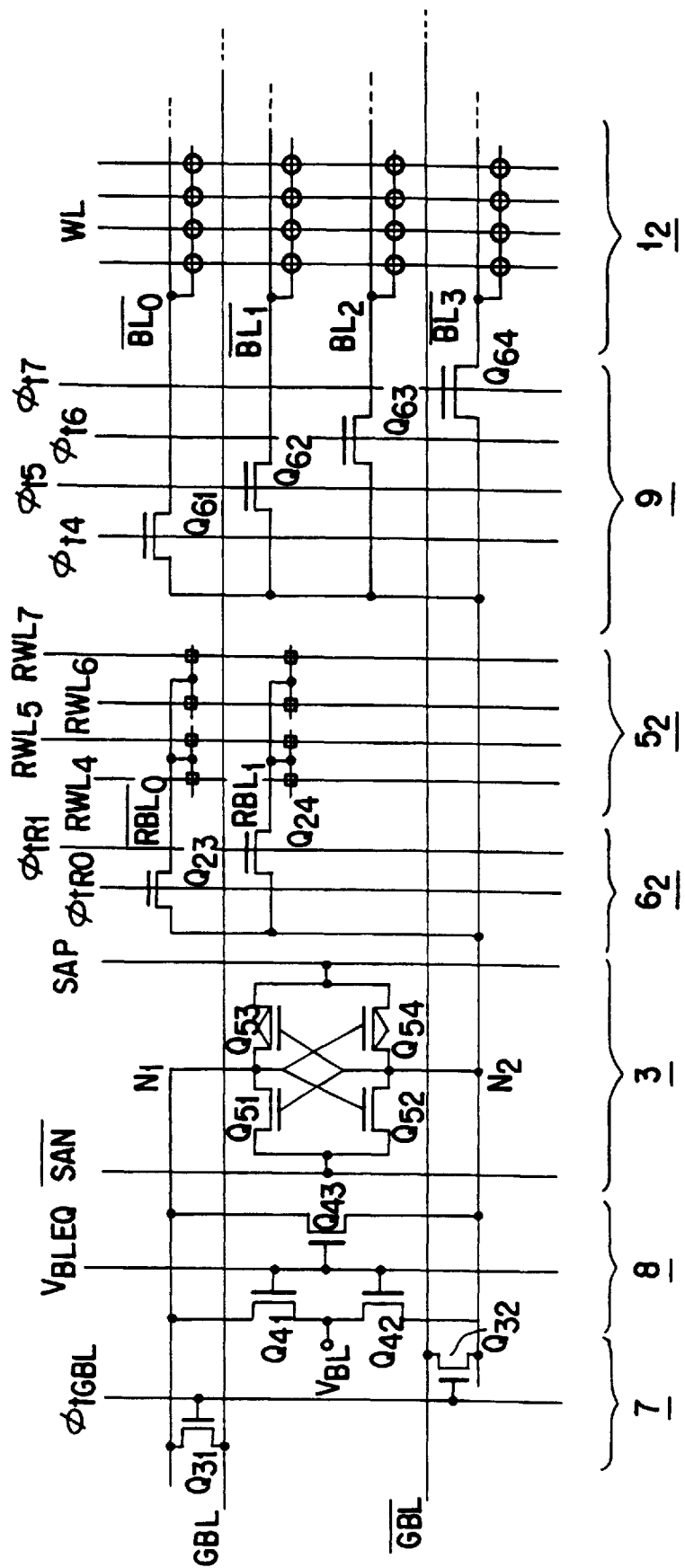
F I G. 32

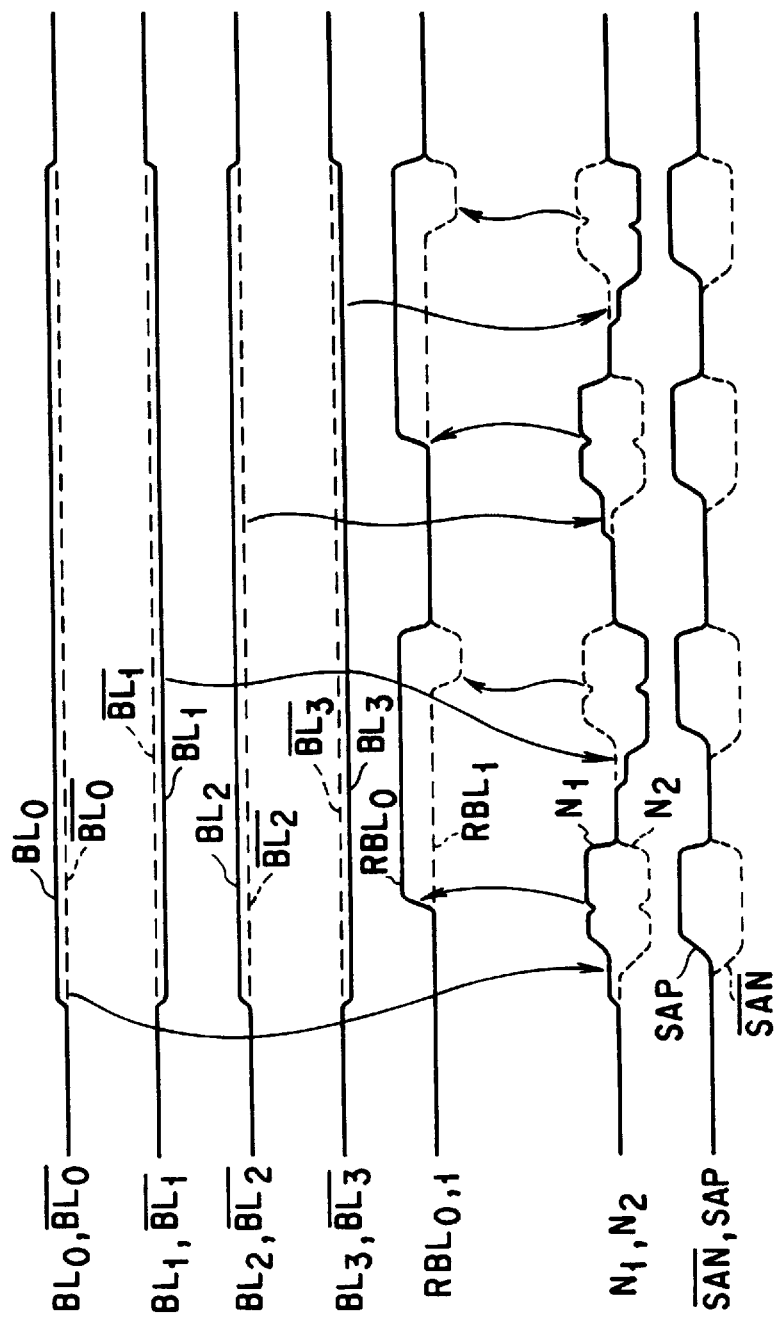
F I G. 34

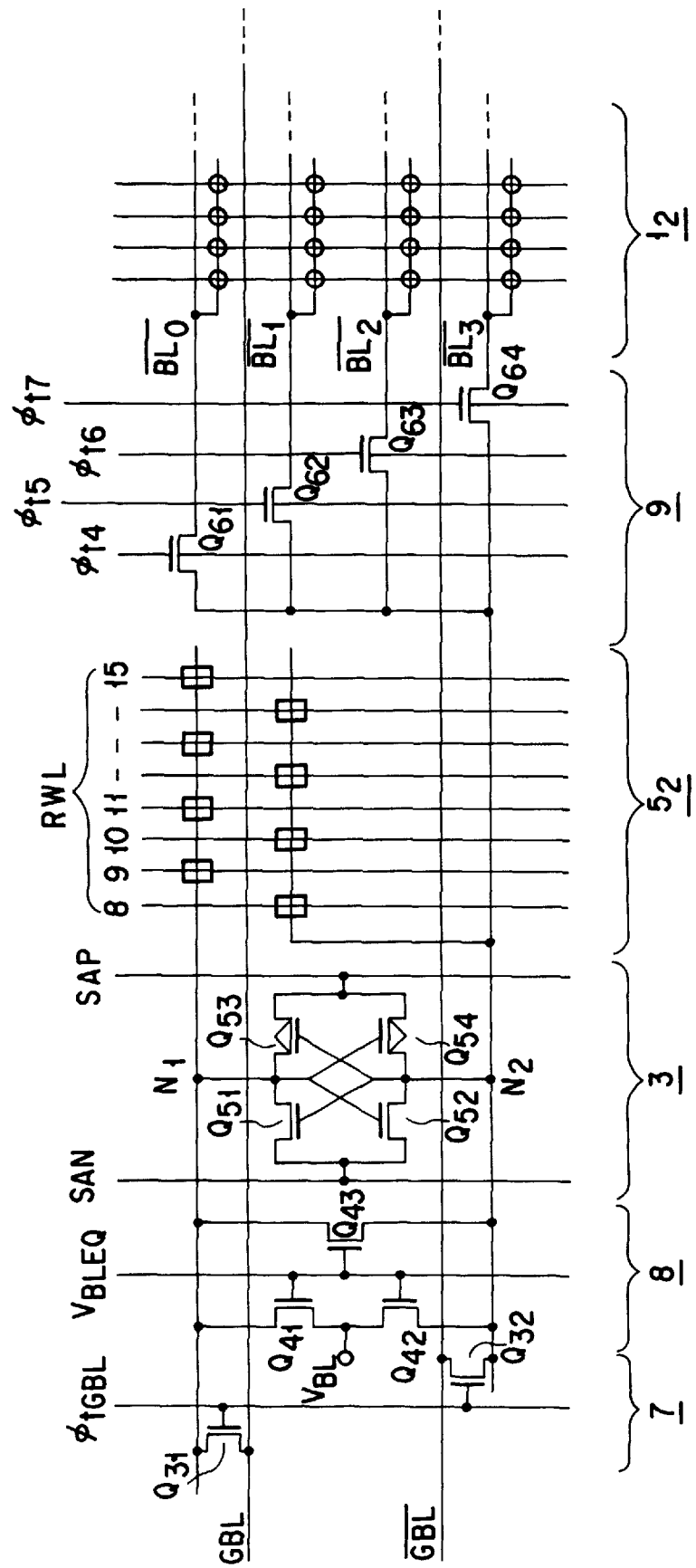
F I G. 40

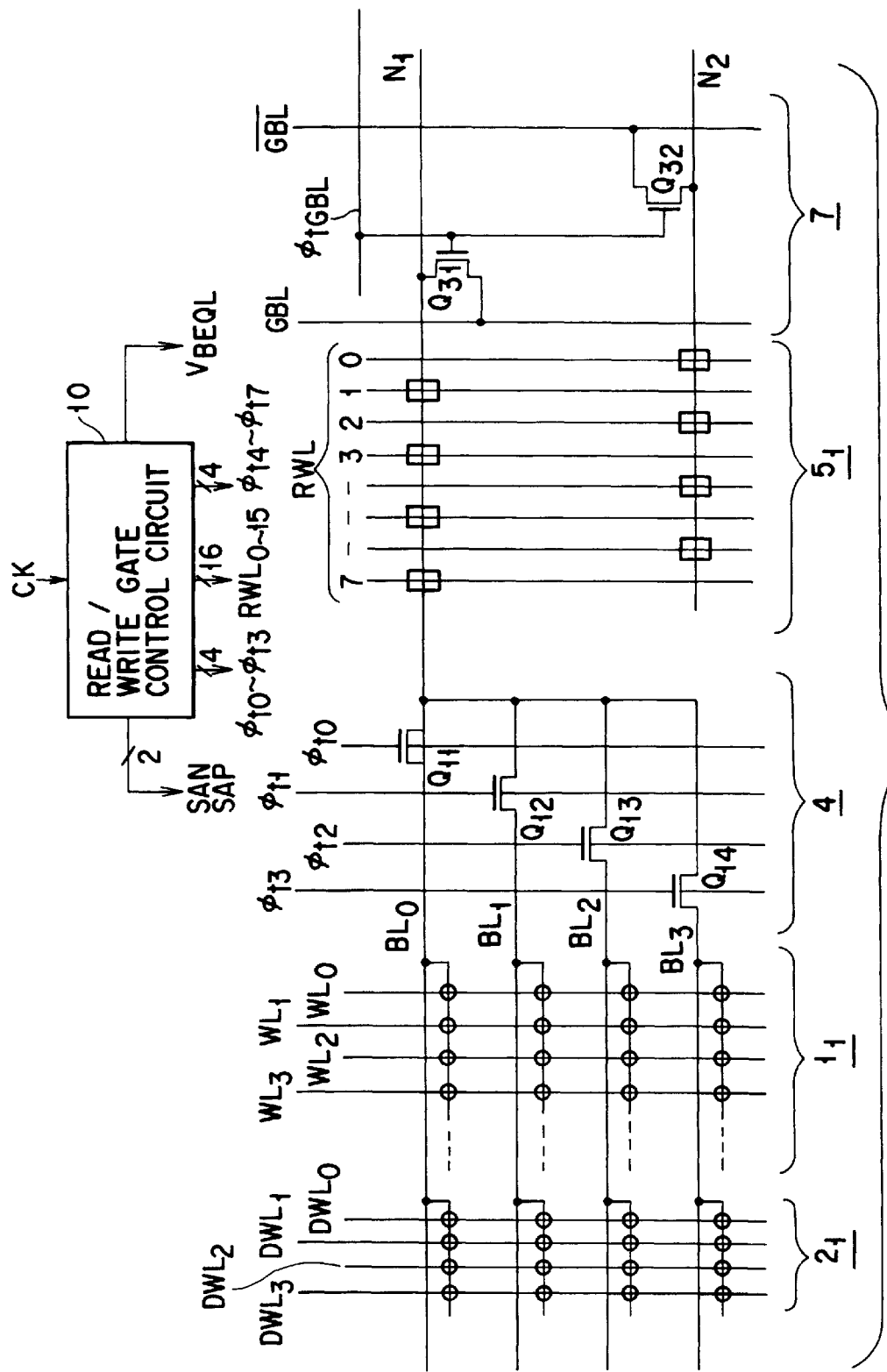
F I G. 41

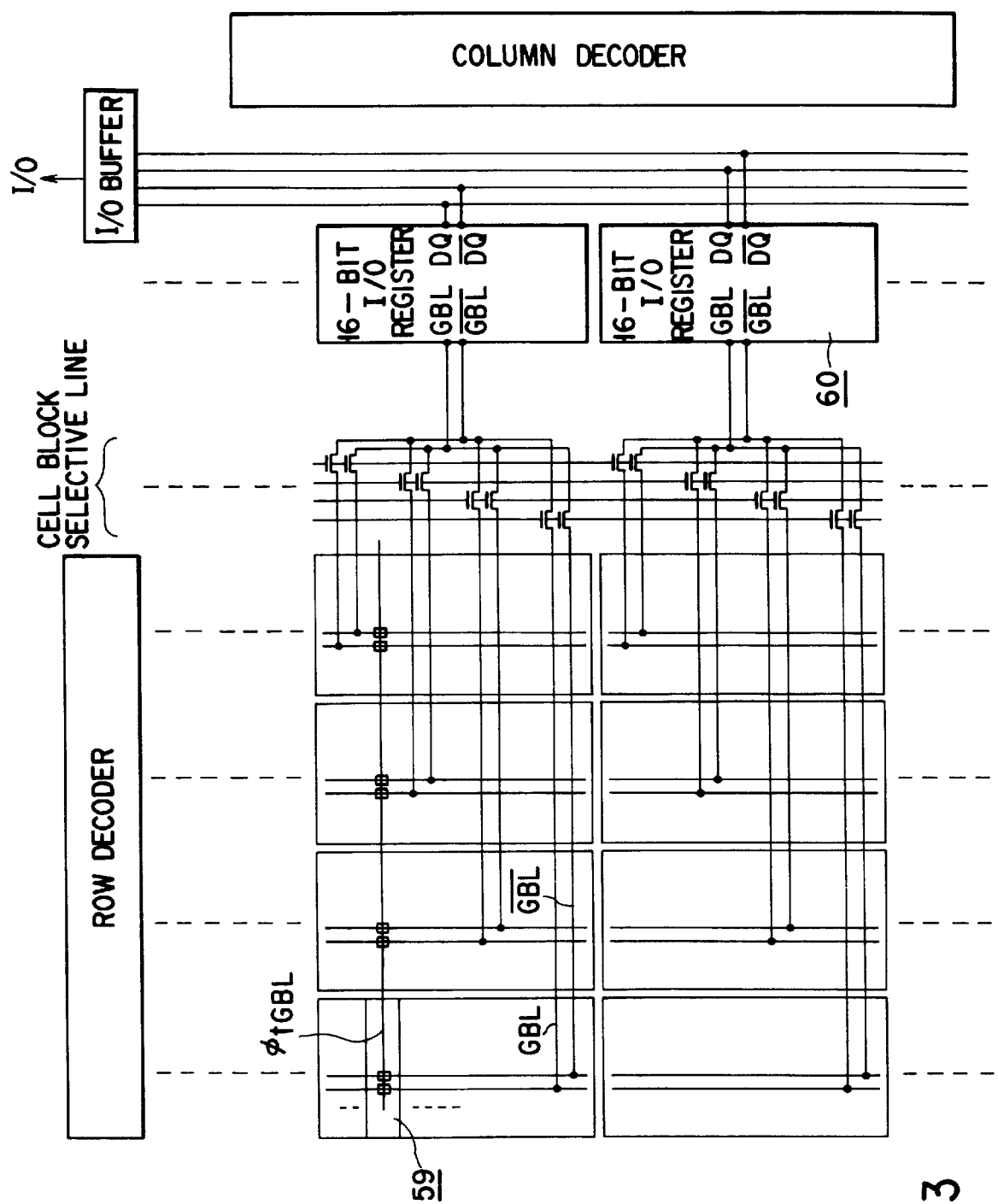
F I G. 43

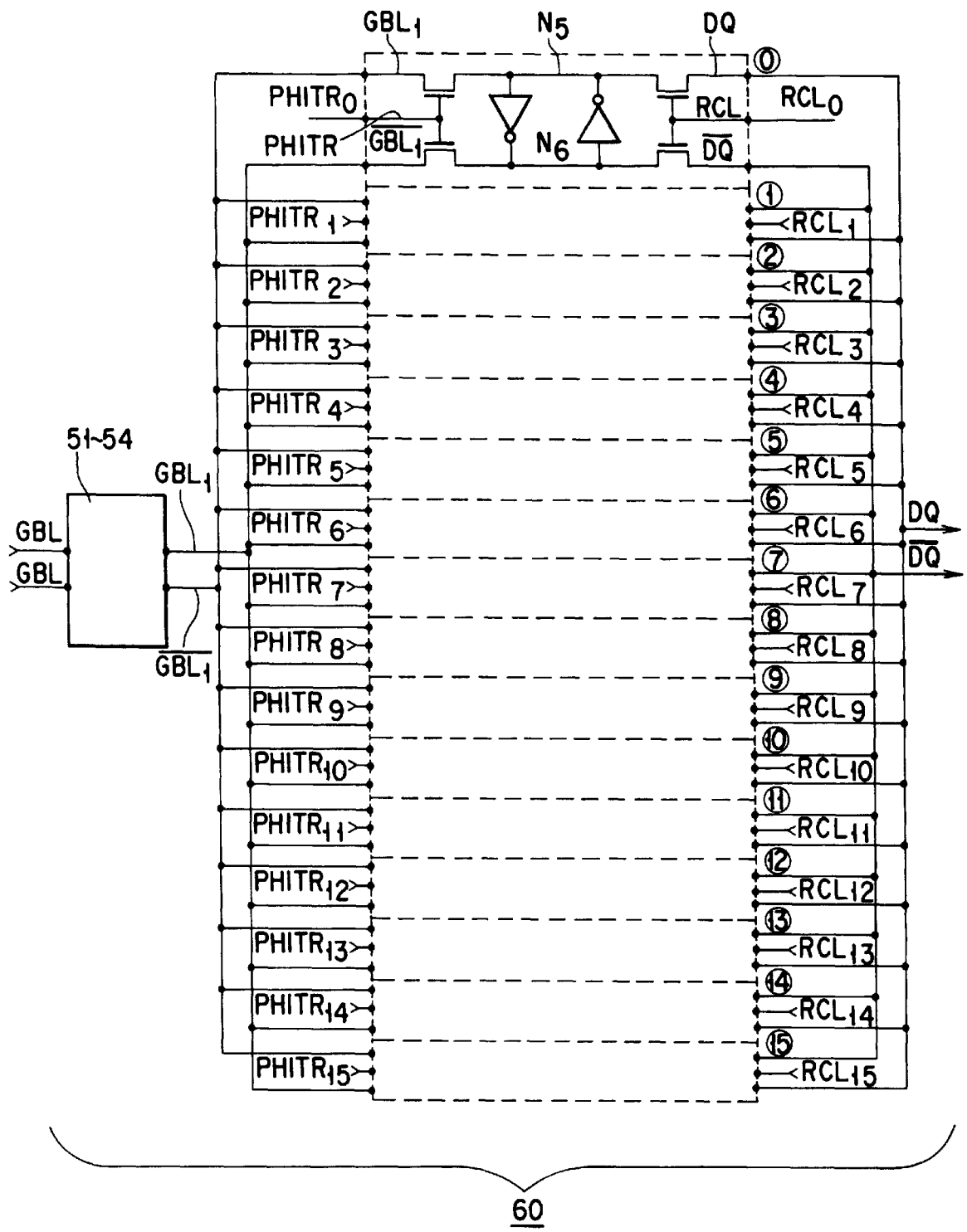
F I G. 44

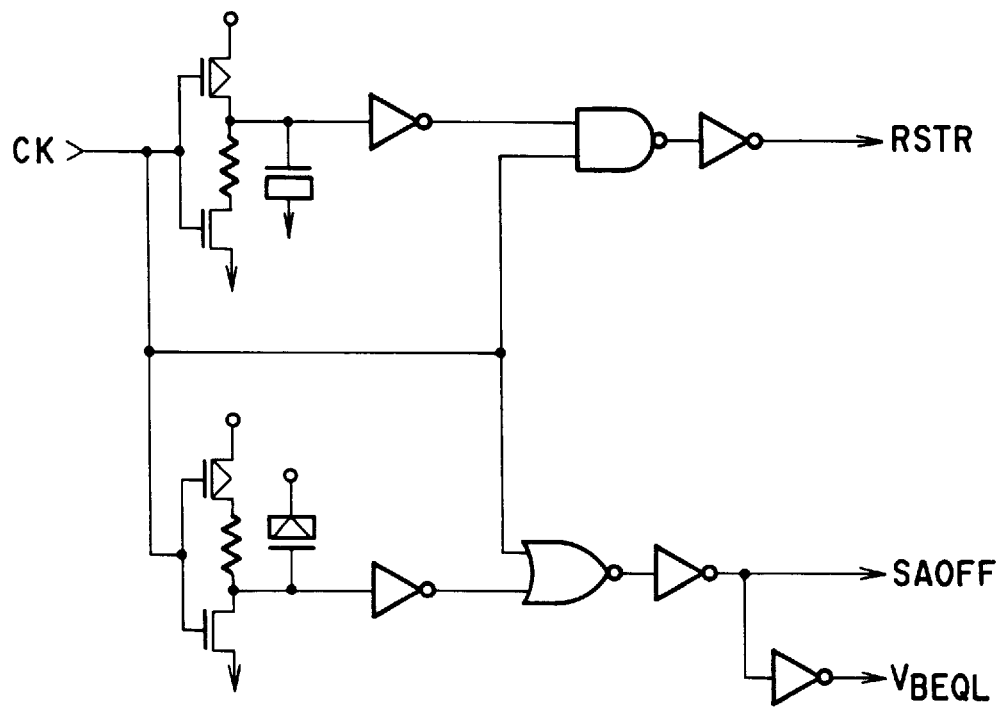
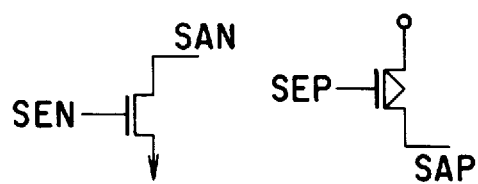
F I G. 45

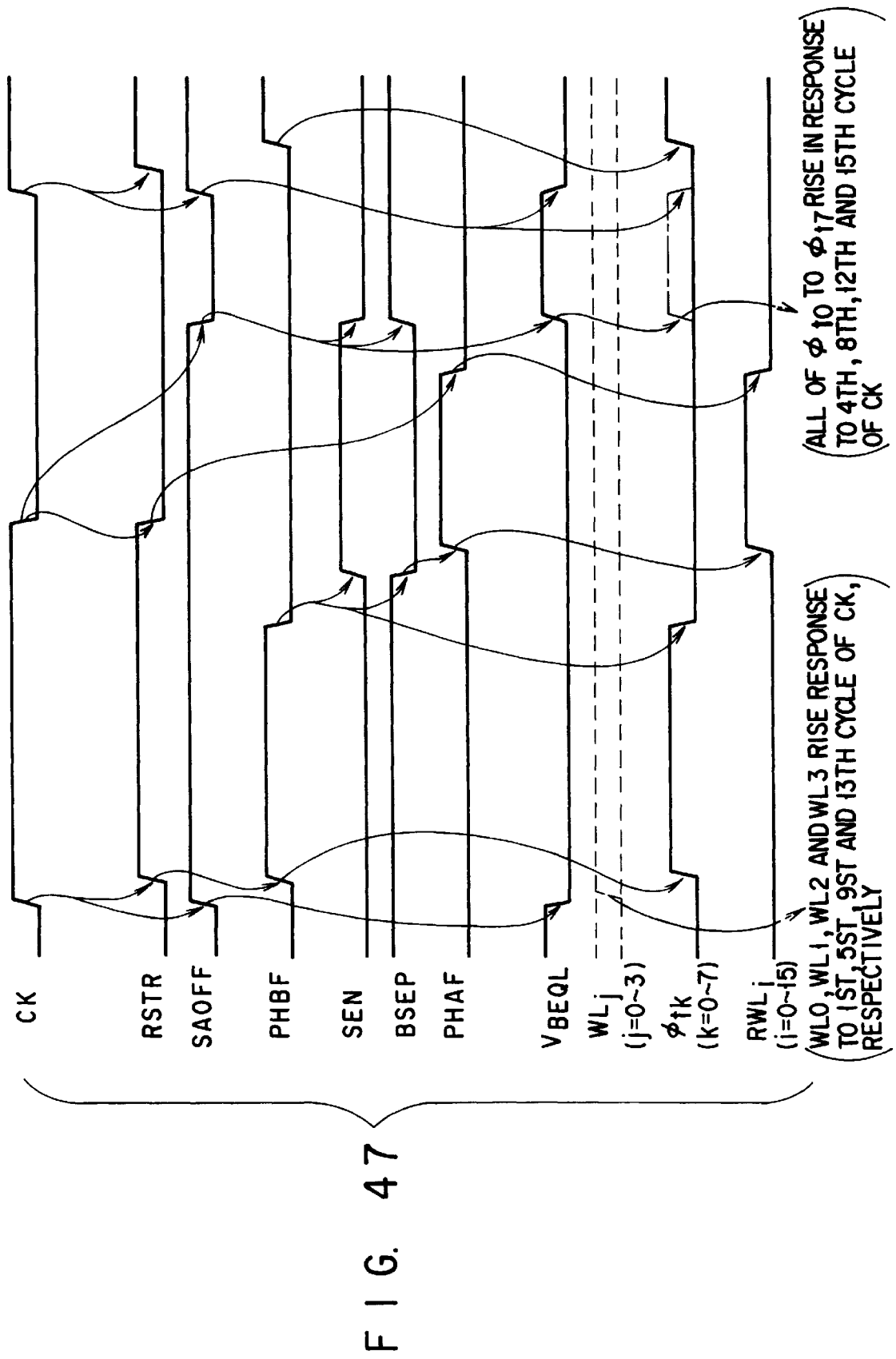
F I G. 47

| CYCLE OF CK | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| OUTPUT FROM COUNTER  1BIT | 0 | 1 | 0 | 1 | 0 | 1 | 0 | 1 | 0 | 1 | 0 | 1 | 0 | 1 | 0 | 1 |
| 2BIT | 0 | 0 | 1 | 1 | 0 | 0 | 1 | 1 | 0 | 0 | 1 | 1 | 0 | 0 | 1 | 1 |
| 3BIT | 0 | 0 | 0 | 0 | 1 | 1 | 1 | 1 | 0 | 0 | 0 | 0 | 1 | 1 | 1 | 1 |
| 4BIT | 0 | 0 | 0 | 0 | 0 | 0 | 0 | 0 | 1 | 1 | 1 | 1 | 1 | 1 | 1 | 1 |
| 5BIT | 0 | 0 | 0 | 0 | 0 | 0 | 0 | 0 | 0 | 0 | 0 | 0 | 0 | 0 | 0 | 0 |
| RWL_i | 0↑T | 1 | 2 | 3 | 4 | 5 | 6 | 7 | 8 | 9 | 10 | 11 | 12 | 13 | 14 | 15 |
| φ10 | 1 | 0 | 0 | 0 | 1 | 0 | 0 | 0 | 1 | 0 | 0 | 0 | 1 | 0 | 0 | 0 |
| φ11 | 0 | 1 | 0 | 0 | 0 | 1 | 0 | 0 | 0 | 1 | 0 | 0 | 0 | 1 | 0 | 0 |
| φ12 | 0 | 0 | 1 | 0 | 0 | 0 | 1 | 0 | 0 | 0 | 1 | 0 | 0 | 0 | 1 | 0 |
| φ13 | 0 | 0 | 0 | 1 | 0 | 0 | 0 | 1 | 0 | 0 | 0 | 1 | 0 | 0 | 0 | 1 |
| φ14 | 0 | 0 | 0 | 0 | 1 | 0 | 0 | 0 | 1 | 0 | 0 | 0 | 1 | 0 | 0 | 0 |
| φ15 | 0 | 0 | 0 | 0 | 0 | 1 | 0 | 0 | 0 | 1 | 0 | 0 | 0 | 1 | 0 | 0 |
| φ16 | 0 | 0 | 0 | 0 | 0 | 0 | 1 | 0 | 0 | 0 | 1 | 0 | 0 | 0 | 1 | 0 |
| φ17 | 0 | 0 | 0 | 0 | 0 | 0 | 0 | 1 | 0 | 0 | 0 | 1 | 0 | 0 | 0 | 1 |
| WL0 | 0 | 1 | 1 | 1 | 1 | 1 | 1 | 1 | 1 | 1 | 1 | 1 | 1 | 1 | 1 | 1 |
| WL1 | 0 | 0 | 0 | 0 | 0 | 0 | 0 | 1 | 1 | 1 | 1 | 1 | 1 | 1 | 1 | 1 |
| WL2 | 0 | 0 | 0 | 0 | 0 | 0 | 0 | 0 | 0 | 0 | 0 | 0 | 1 | 1 | 1 | 1 |
| WL3 | 0 | 0 | 0 | 0 | 0 | 0 | 0 | 0 | 0 | 0 | 0 | 0 | 0 | 0 | 0 | 0 |

FIG. 49

| CYCLE OF CK | 17 | 18 | 19 | 20 | 21 | 22 | 23 | 24 | 25 | 26 | 27 | 28 | 29 | 30 | 31 | 32 |
|---|---|---|---|---|---|---|---|---|---|---|---|---|---|---|---|---|
| 1 BIT | 0 | 1 | 0 | 1 | 0 | 1 | 0 | 1 | 0 | 1 | 0 | 1 | 0 | 1 | 0 | 1 |
| 2 BIT | 0 | 0 | 1 | 1 | 0 | 0 | 1 | 1 | 0 | 0 | 1 | 1 | 0 | 0 | 1 | 1 |
| 3 BIT | 0 | 0 | 0 | 0 | 1 | 1 | 1 | 1 | 0 | 0 | 0 | 0 | 1 | 1 | 1 | 1 |
| 4 BIT | 0 | 0 | 0 | 0 | 0 | 0 | 0 | 0 | 1 | 1 | 1 | 1 | 1 | 1 | 1 | 1 |
| 5 BIT | 1 | 1 | 1 | 1 | 1 | 1 | 1 | 1 | 1 | 1 | 1 | 1 | 1 | 1 | 1 | 1 |
| RWL_i | 15 | 14 | 13 | 12 | 11 | 10 | 9 | 8 | 7 | 6 | 5 | 4 | 3 | 2 | 1 | 0 |
| φt0 | 0 | 0 | 0 | 1 | 0 | 0 | 0 | 1 | 0 | 0 | 0 | 1 | 0 | 0 | 0 | 1 |
| φt1 | 0 | 0 | 0 | 0 | 0 | 0 | 1 | 0 | 0 | 0 | 1 | 0 | 0 | 0 | 1 | 0 |
| φt2 | 0 | 1 | 0 | 0 | 0 | 1 | 0 | 0 | 0 | 1 | 0 | 0 | 0 | 1 | 0 | 0 |
| φt3 | 1 | 0 | 0 | 0 | 1 | 0 | 0 | 0 | 1 | 0 | 0 | 0 | 1 | 0 | 0 | 0 |
| φt4 | 0 | 0 | 0 | 1 | 0 | 0 | 0 | 1 | 0 | 0 | 0 | 1 | 0 | 0 | 0 | 1 |
| φt5 | 0 | 0 | 0 | 0 | 0 | 0 | 1 | 0 | 0 | 0 | 1 | 0 | 0 | 0 | 1 | 0 |
| φt6 | 0 | 1 | 0 | 0 | 0 | 1 | 0 | 0 | 0 | 1 | 0 | 0 | 0 | 1 | 0 | 0 |
| φt7 | 1 | 0 | 0 | 0 | 1 | 0 | 0 | 0 | 1 | 0 | 0 | 0 | 1 | 0 | 0 | 0 |
| WL0 | 1 | 1 | 1 | 1 | 1 | 1 | 1 | 1 | 1 | 1 | 1 | 1 | 1 | 1 | 1 | 1→0 |
| WL1 | 1 | 1 | 1 | 1 | 1 | 1 | 1 | 1 | 1 | 1 | 1 | 1 | 1 | 0 | 0 | 0 |
| WL2 | 1 | 1 | 1 | 1 | 1 | 1 | 1 | 1 | 0 | 0 | 0 | 0 | 0 | 0 | 0 | 0 |
| WL3 | 1 | 1 | 1 | 1 | 0 | 0 | 0 | 0 | 0 | 0 | 0 | 0 | 0 | 0 | 0 | 0 |

F I G. 50

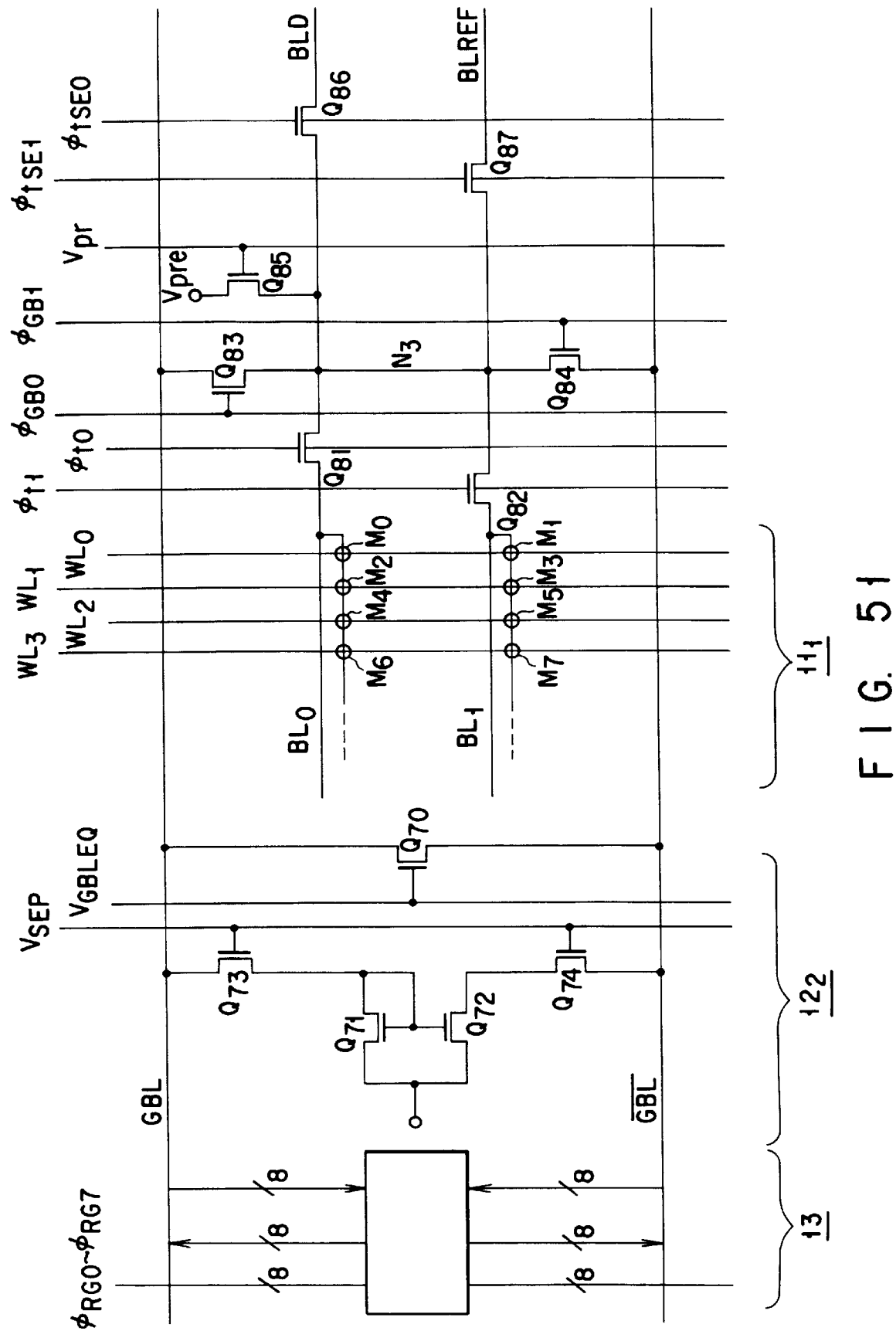
F I G. 51

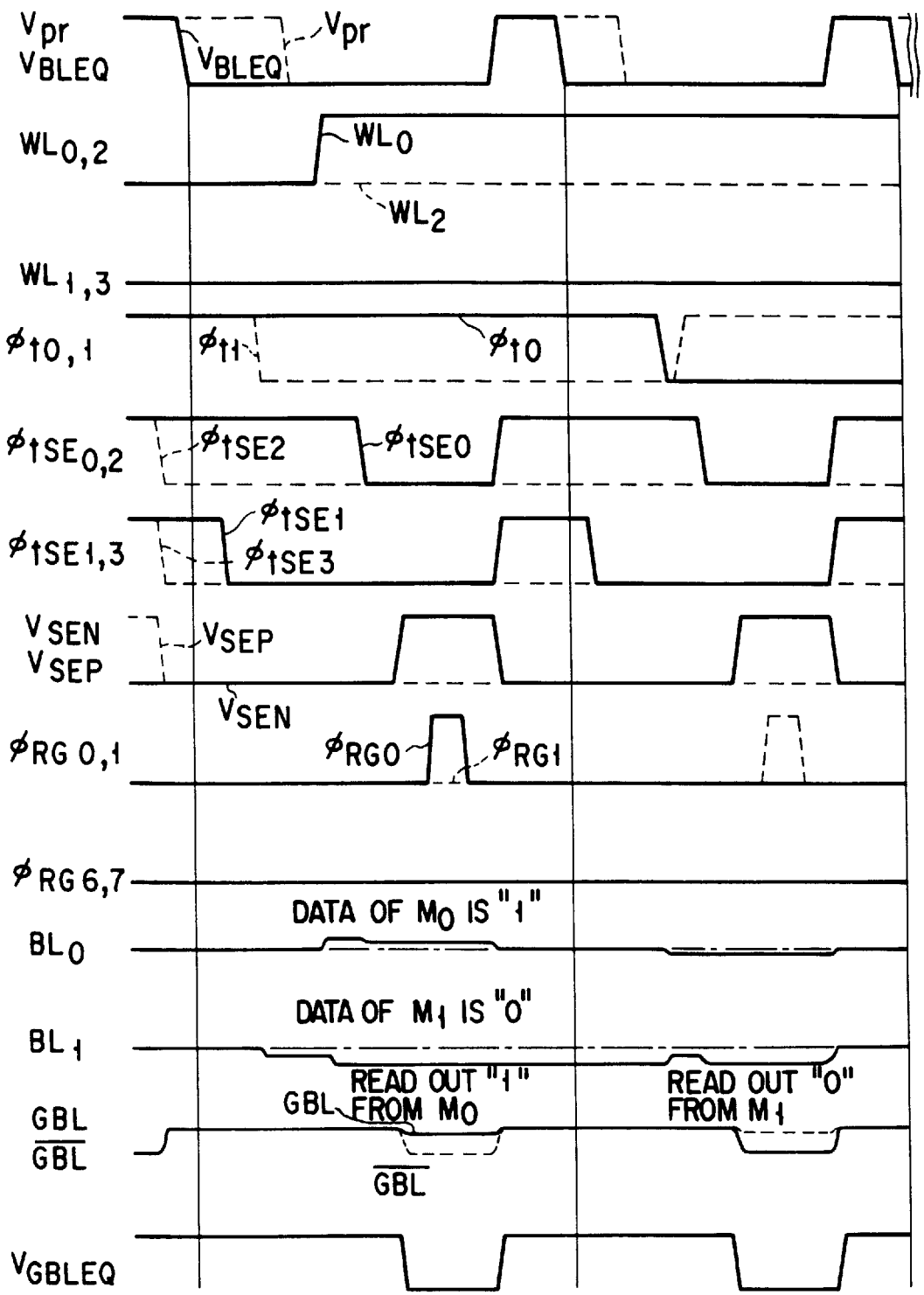
F I G. 53

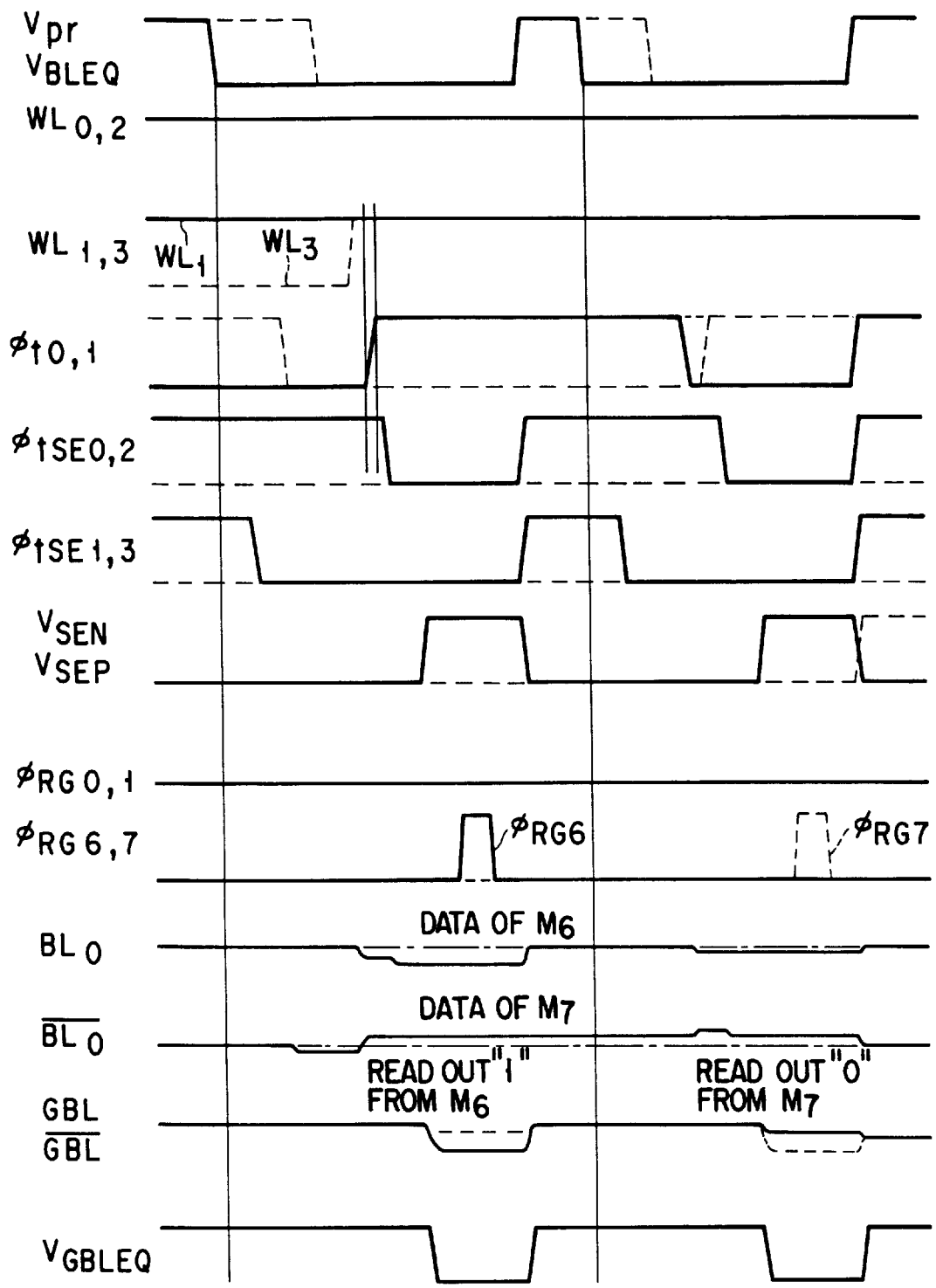
F I G. 54

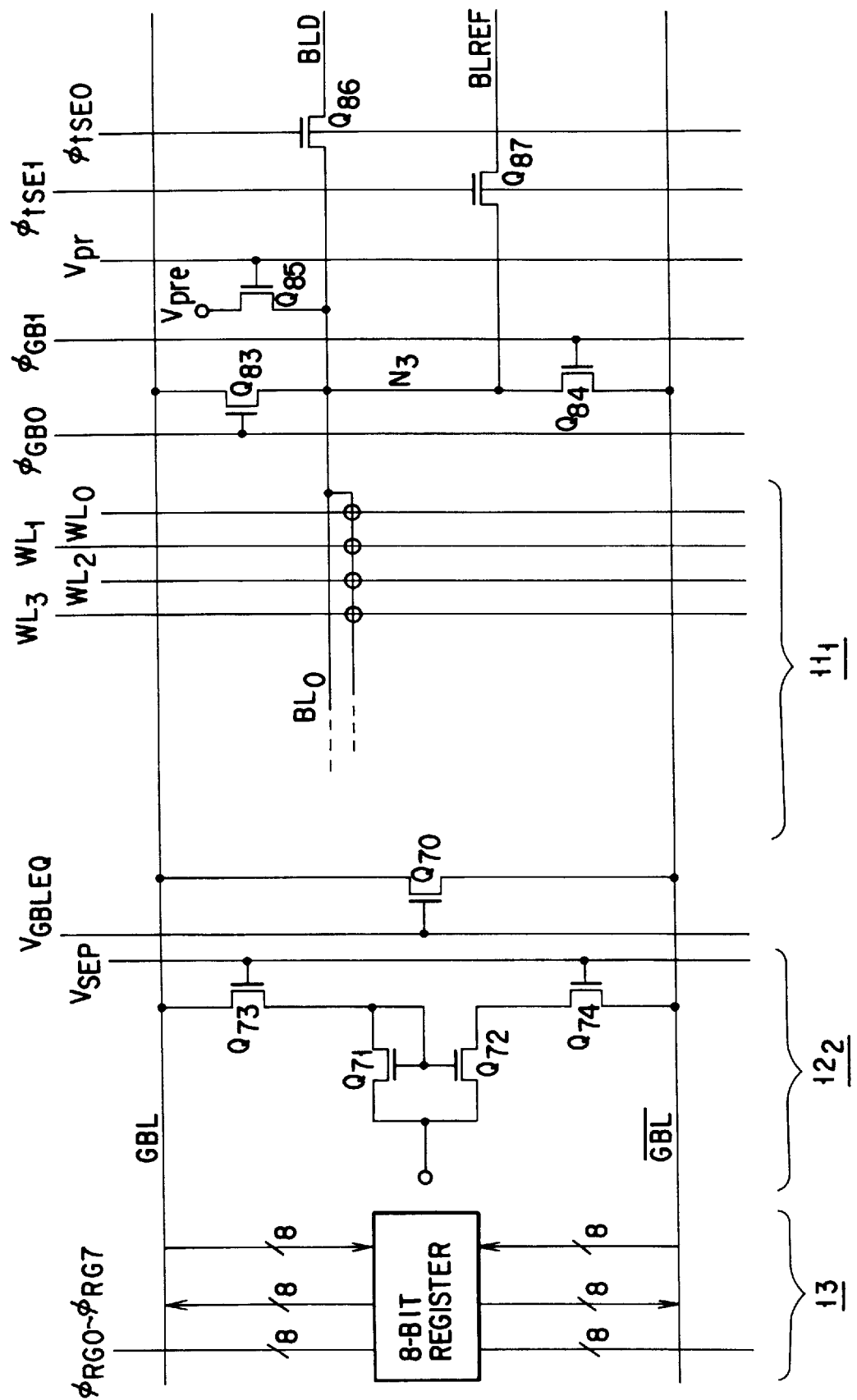
F I G. 56

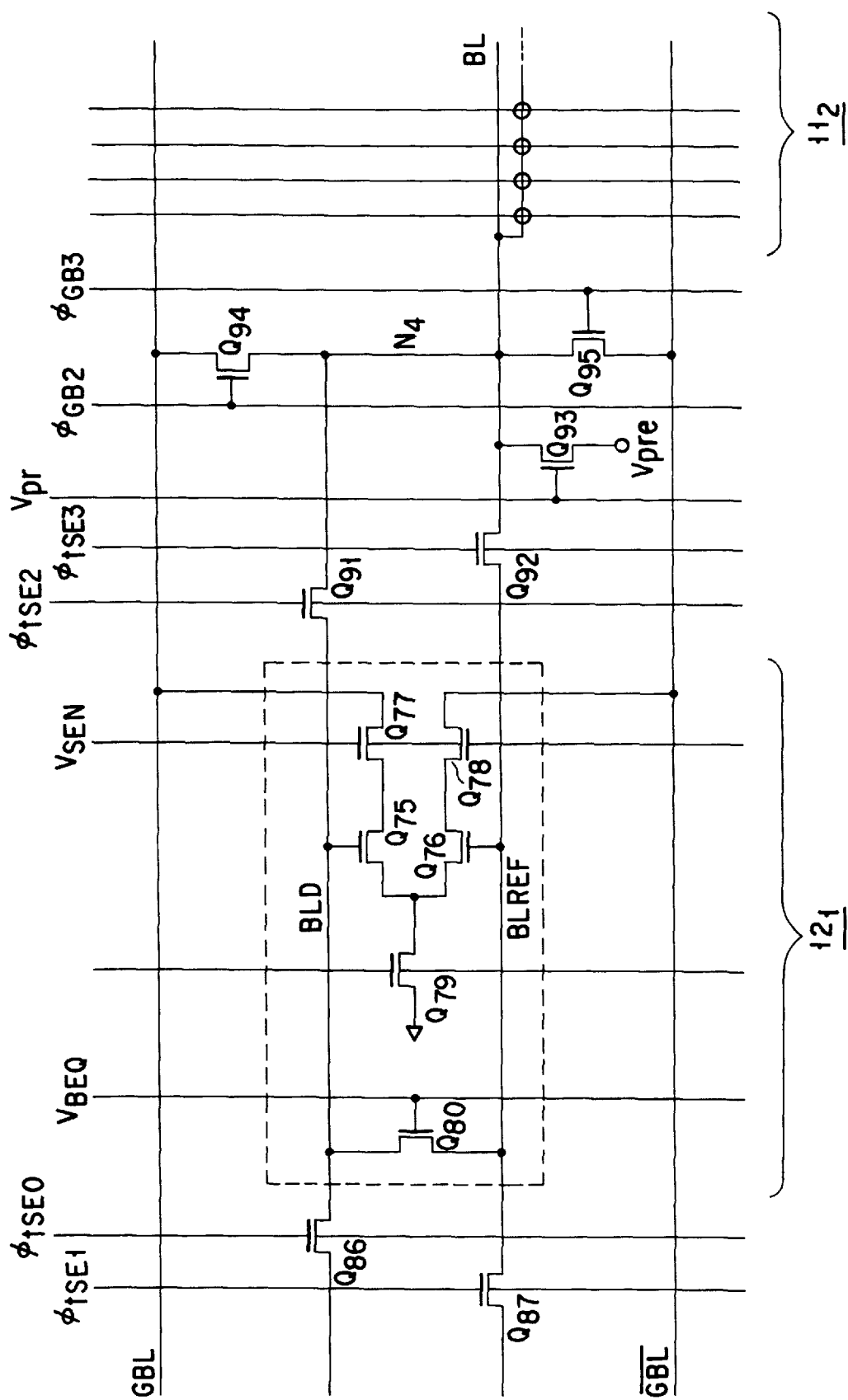
F I G. 57

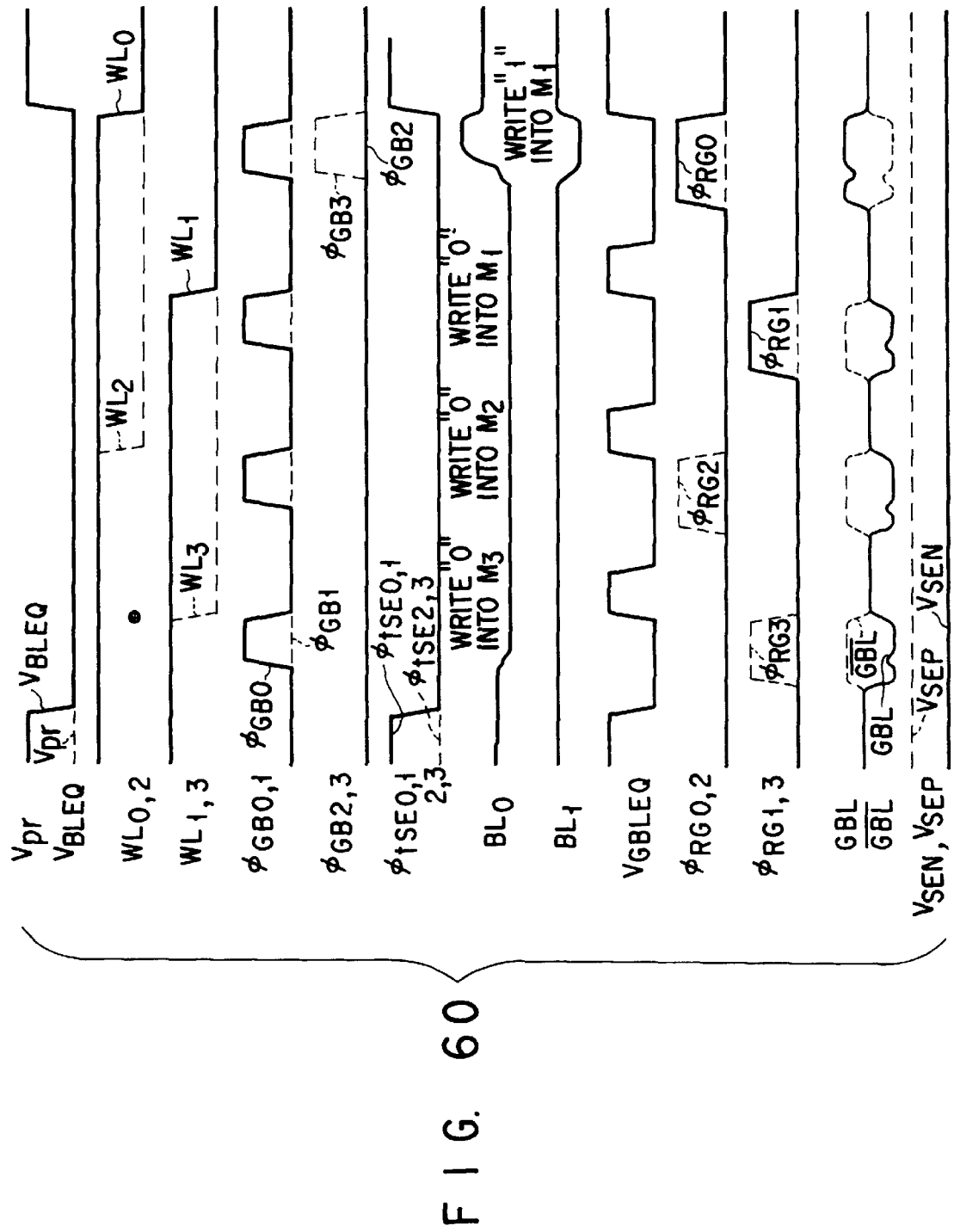
F I G. 60

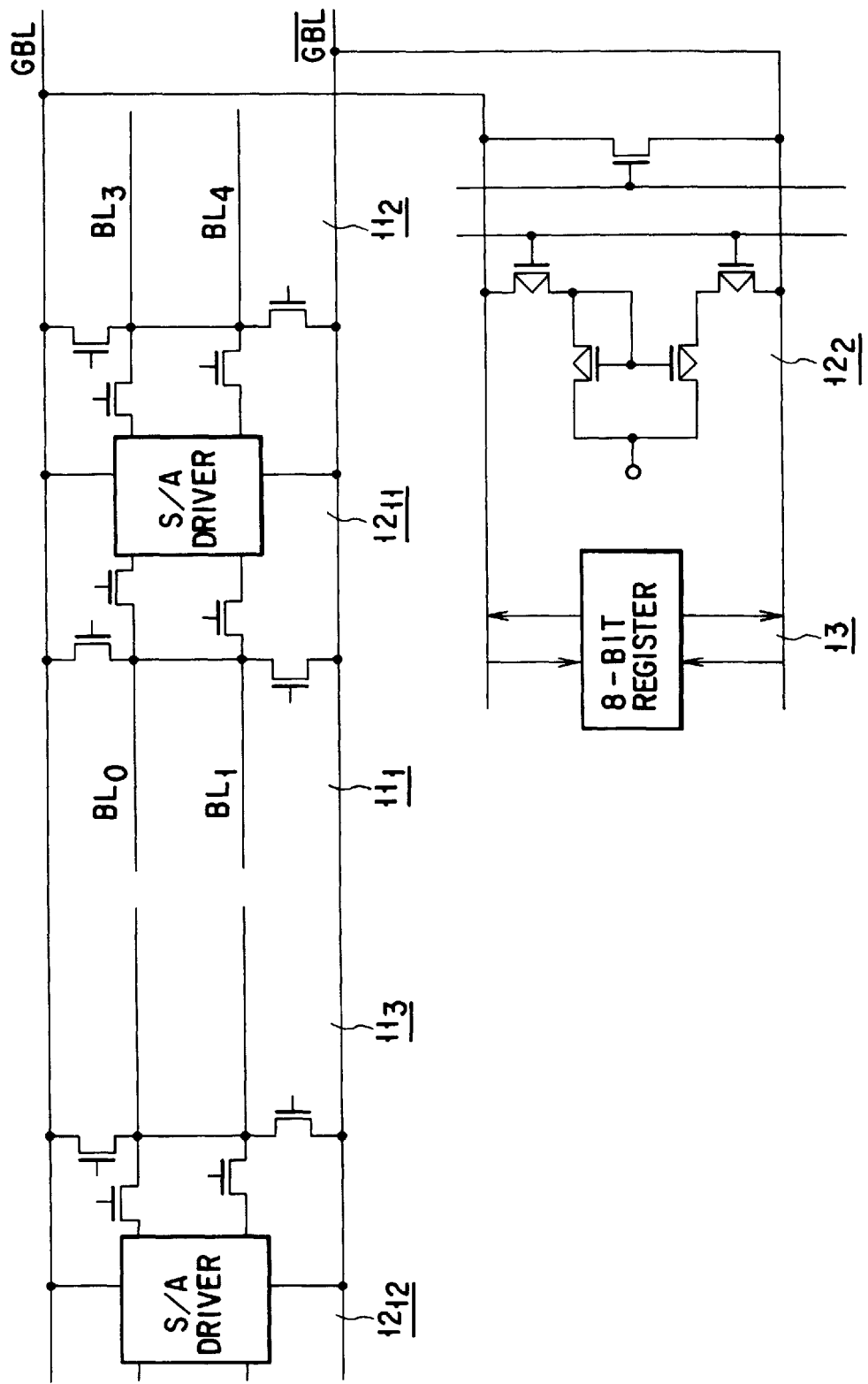
F I G. 61

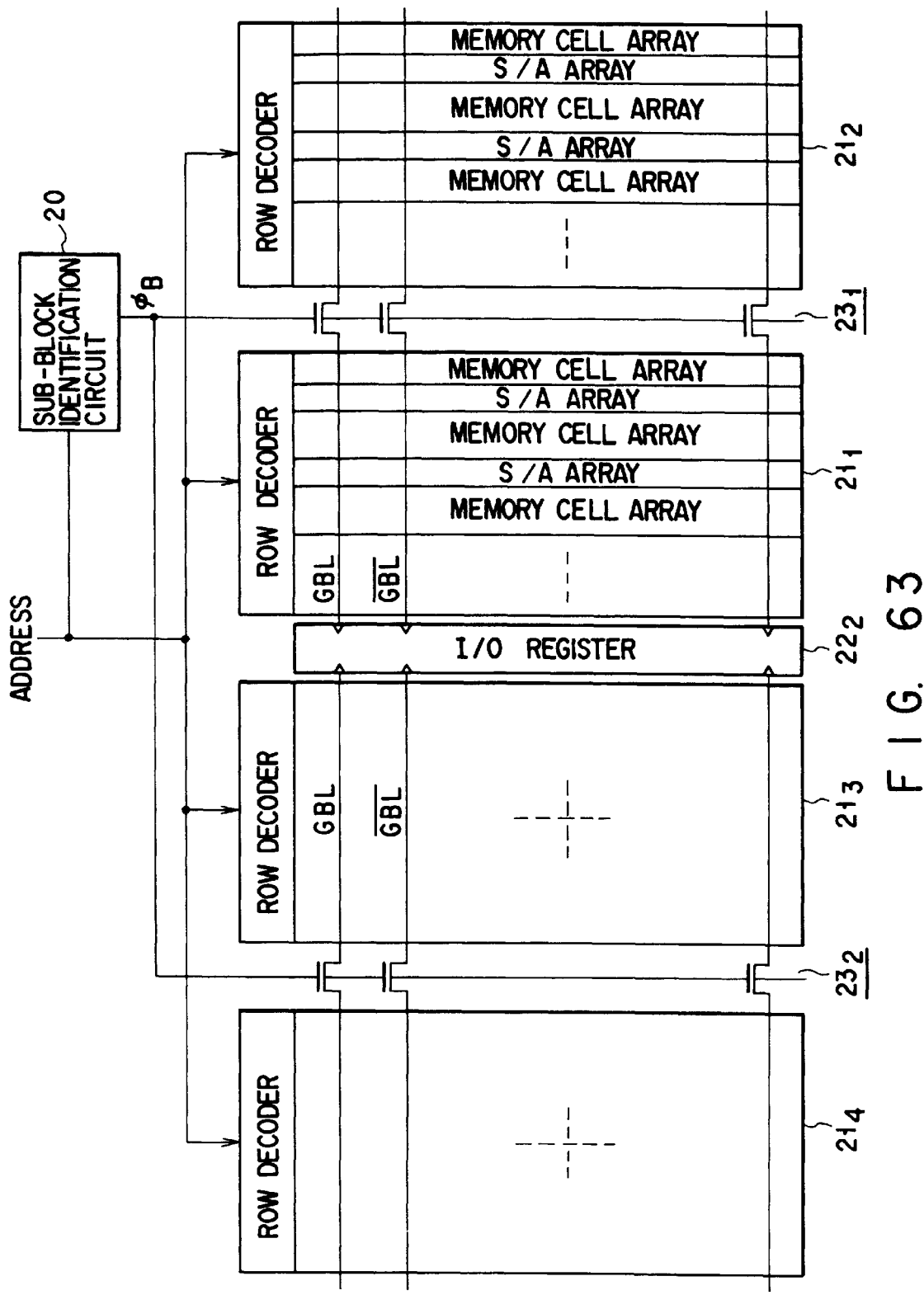
F I G. 63

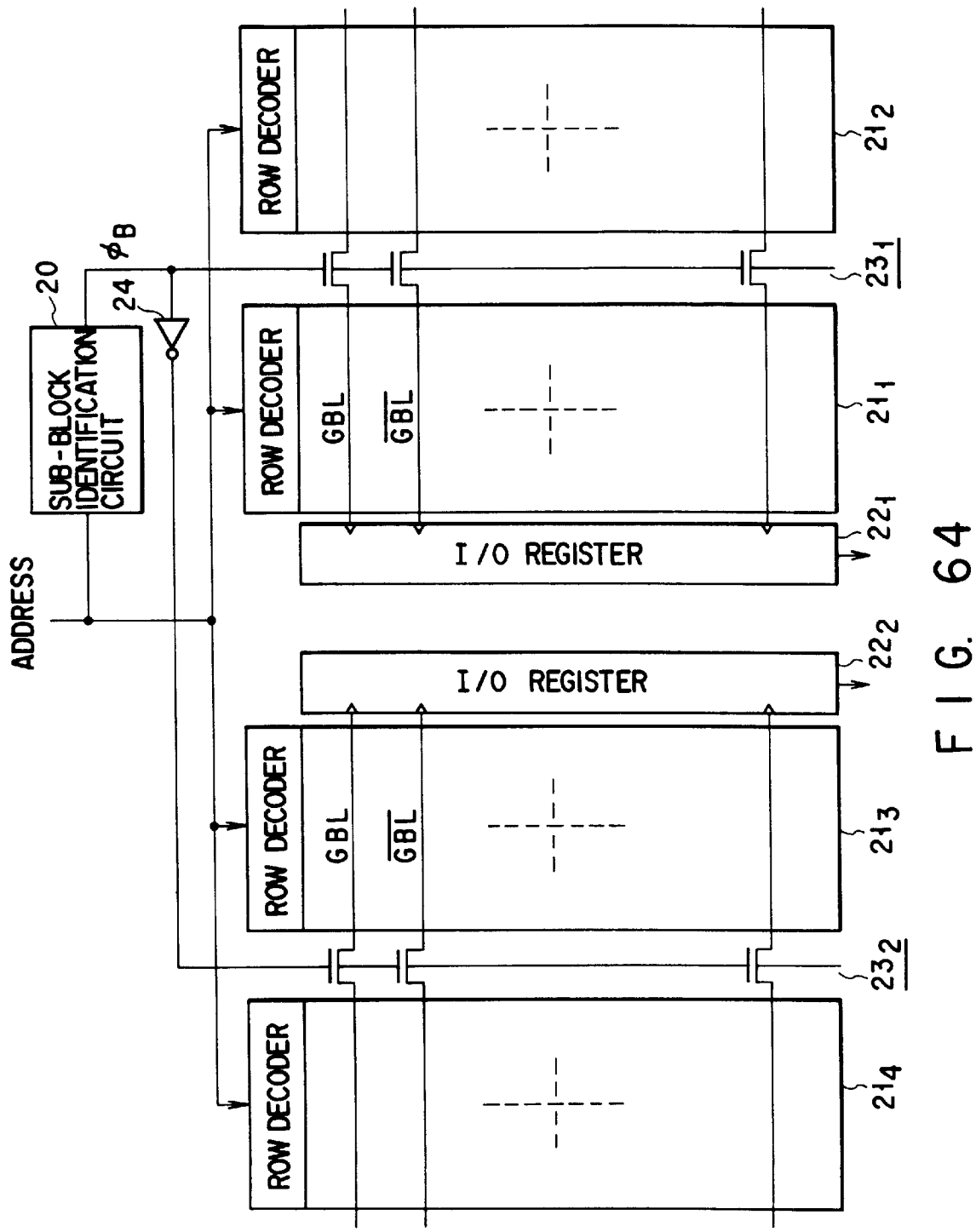
F I G. 64

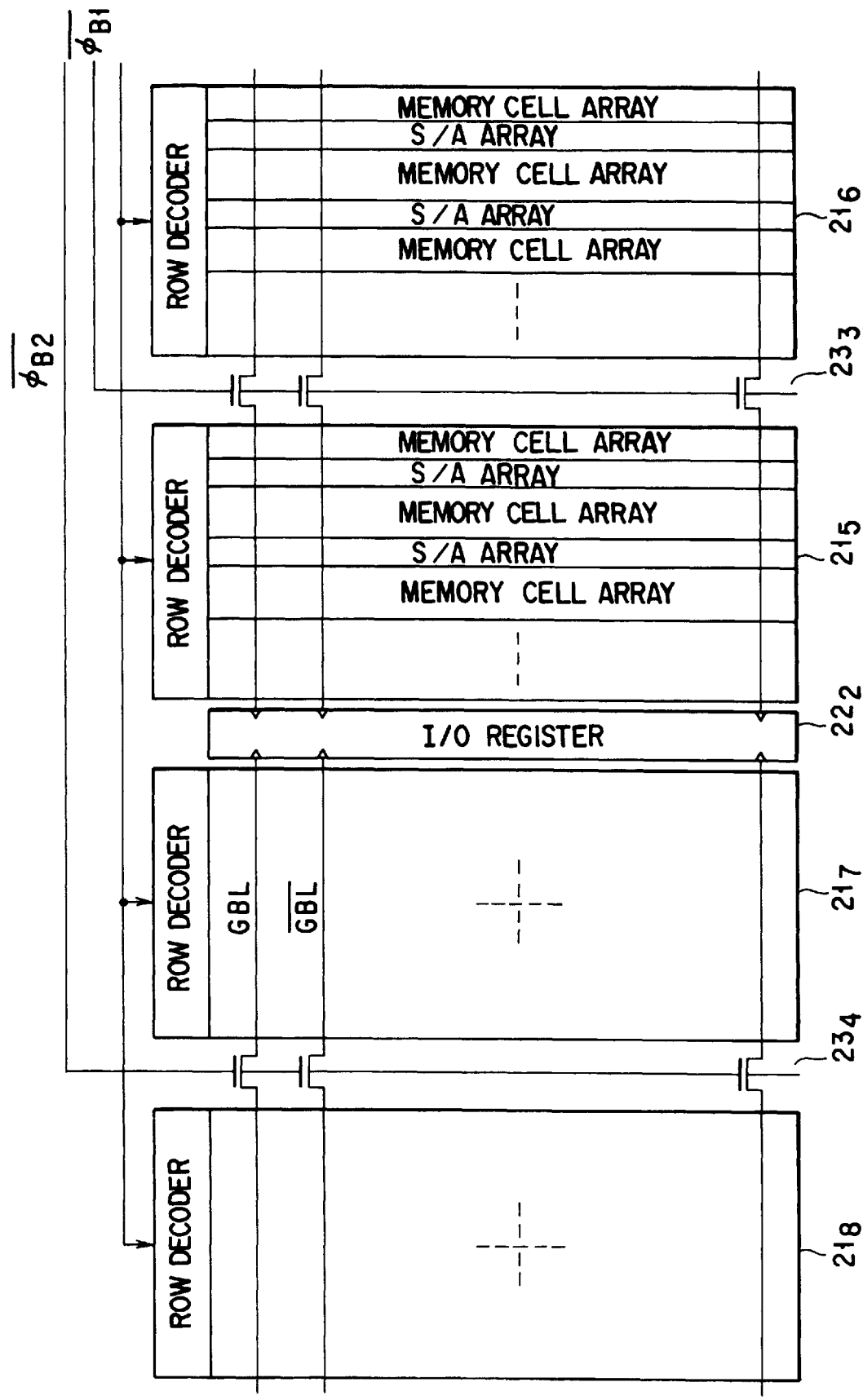
F I G. 66

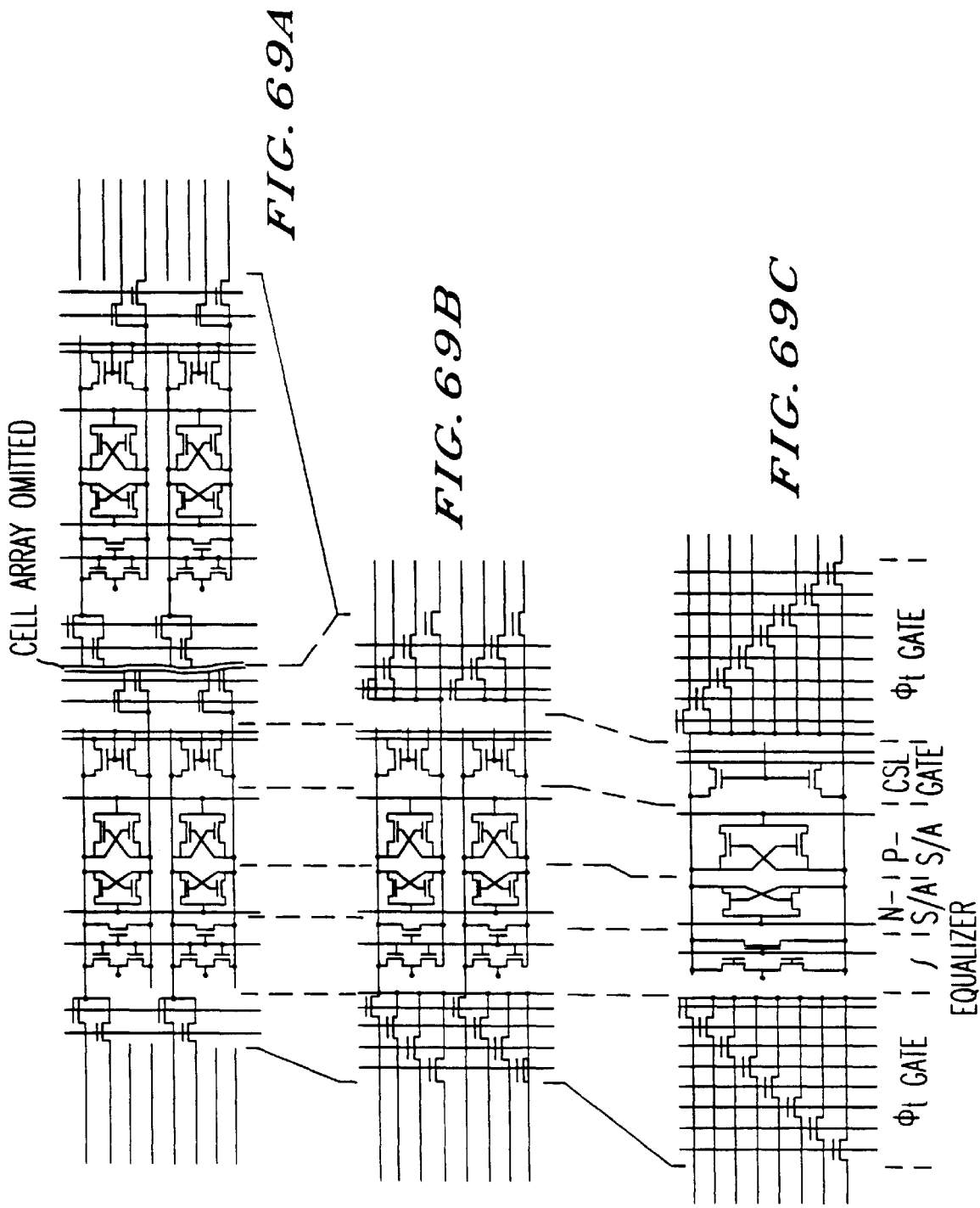

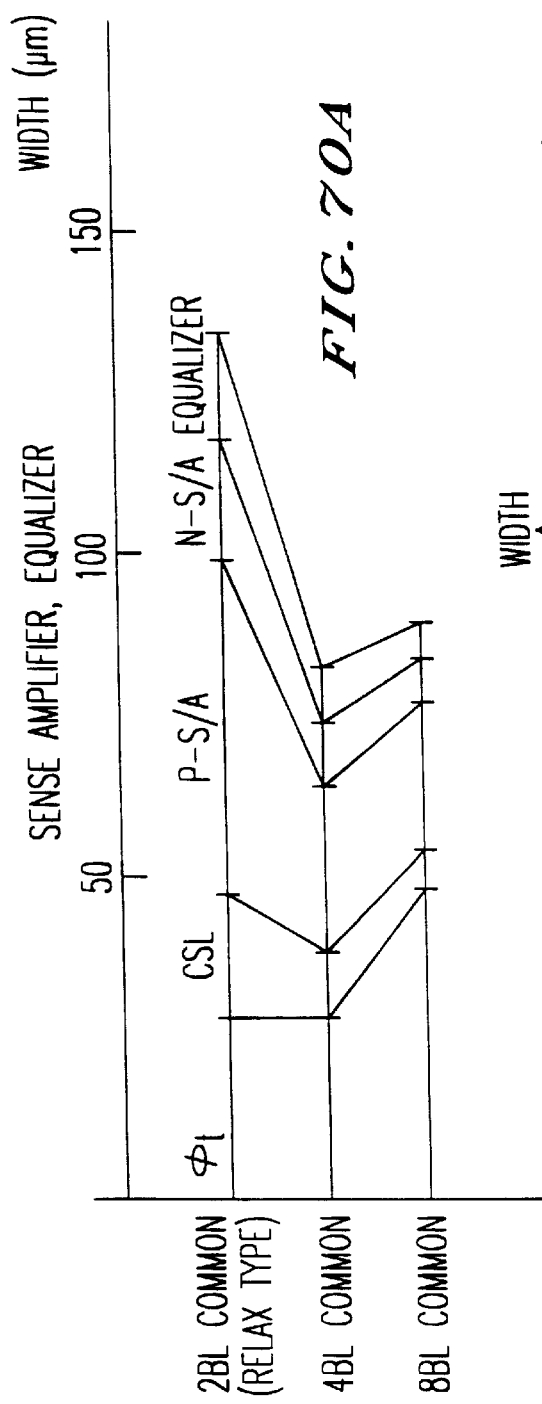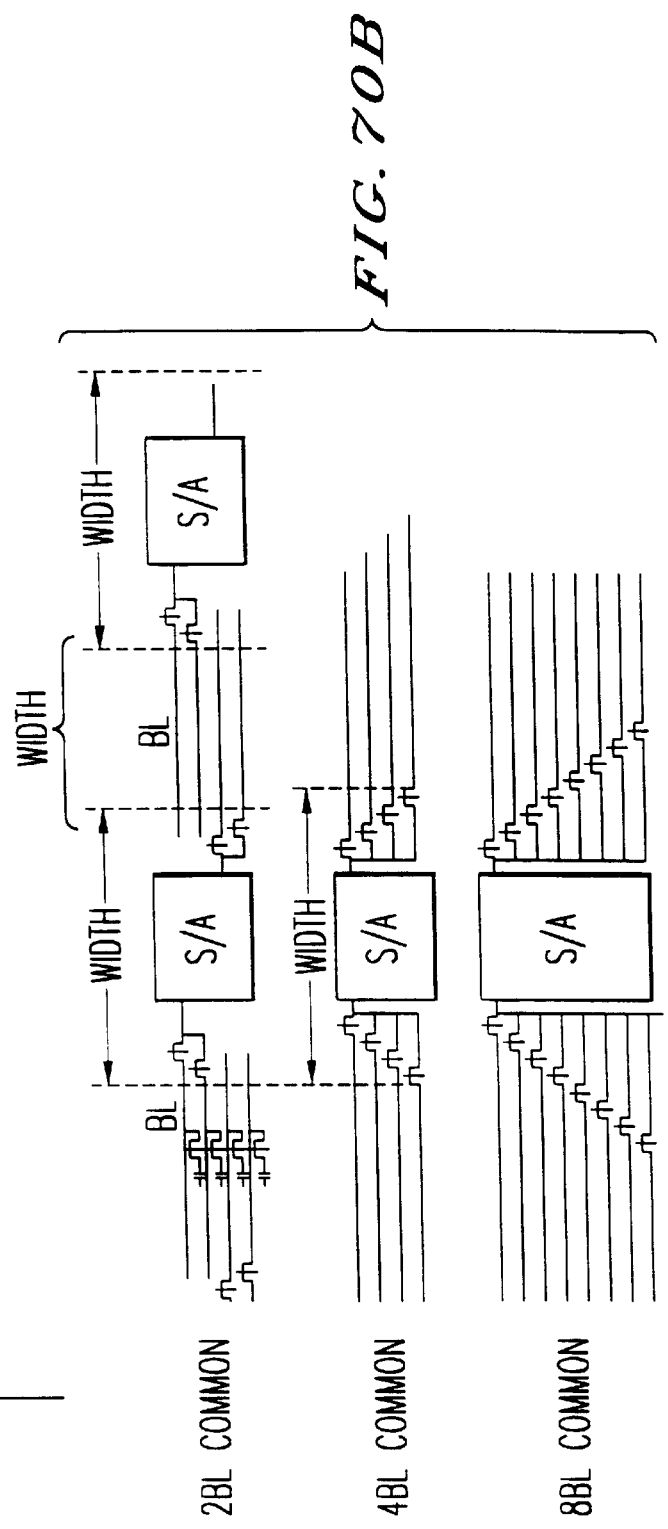

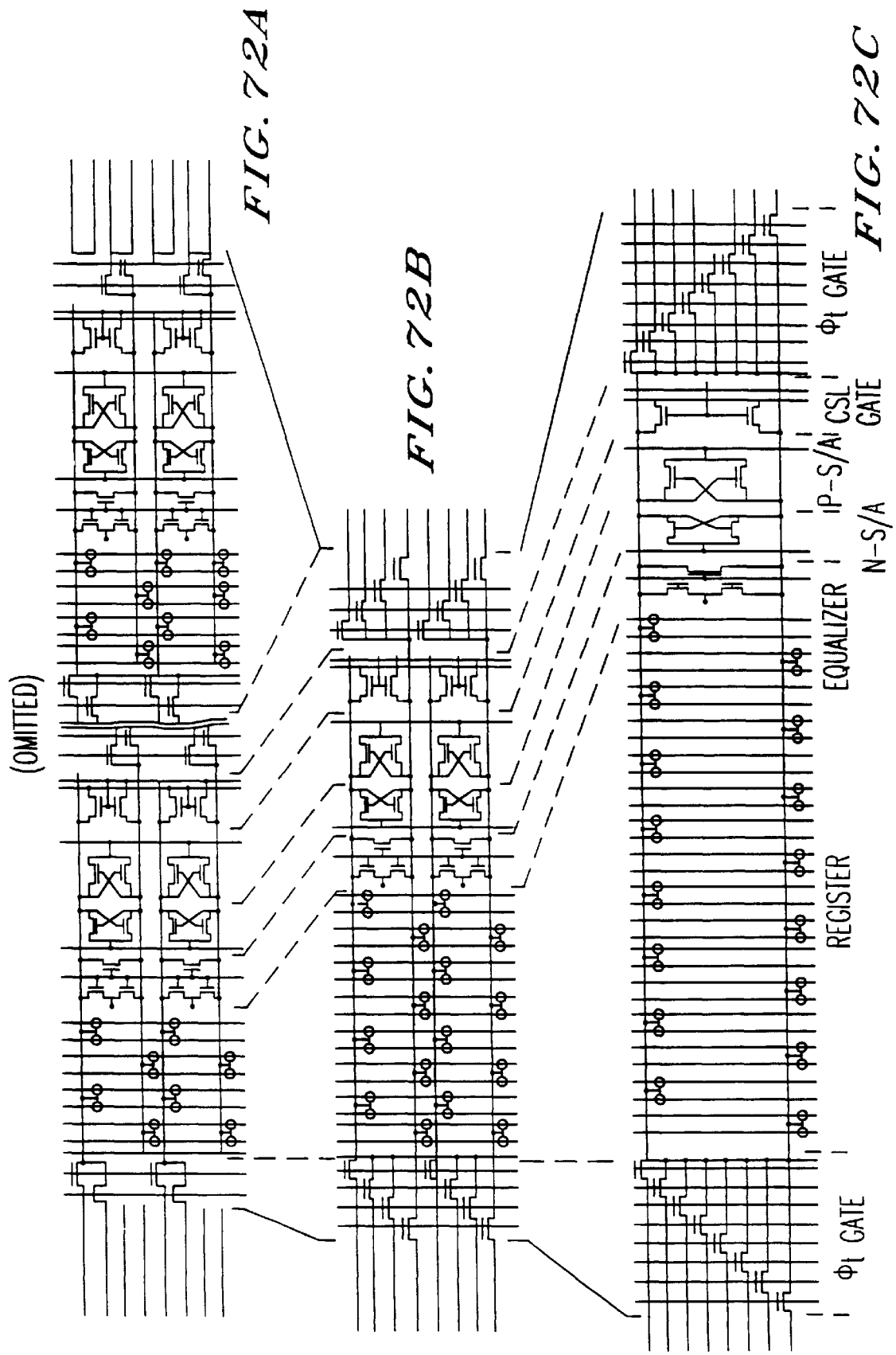

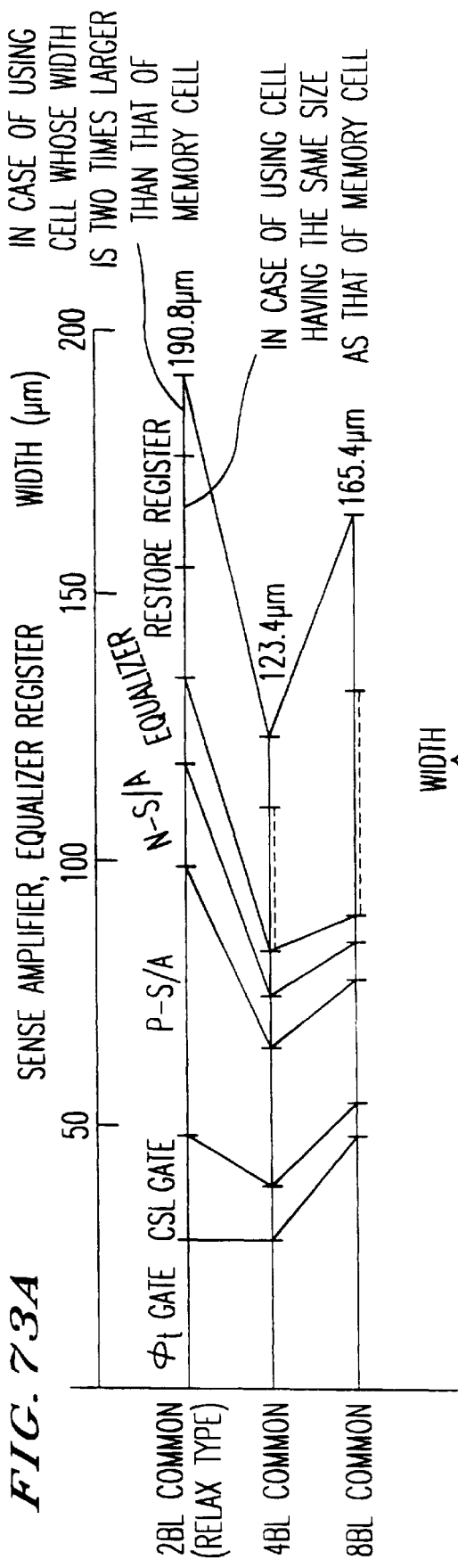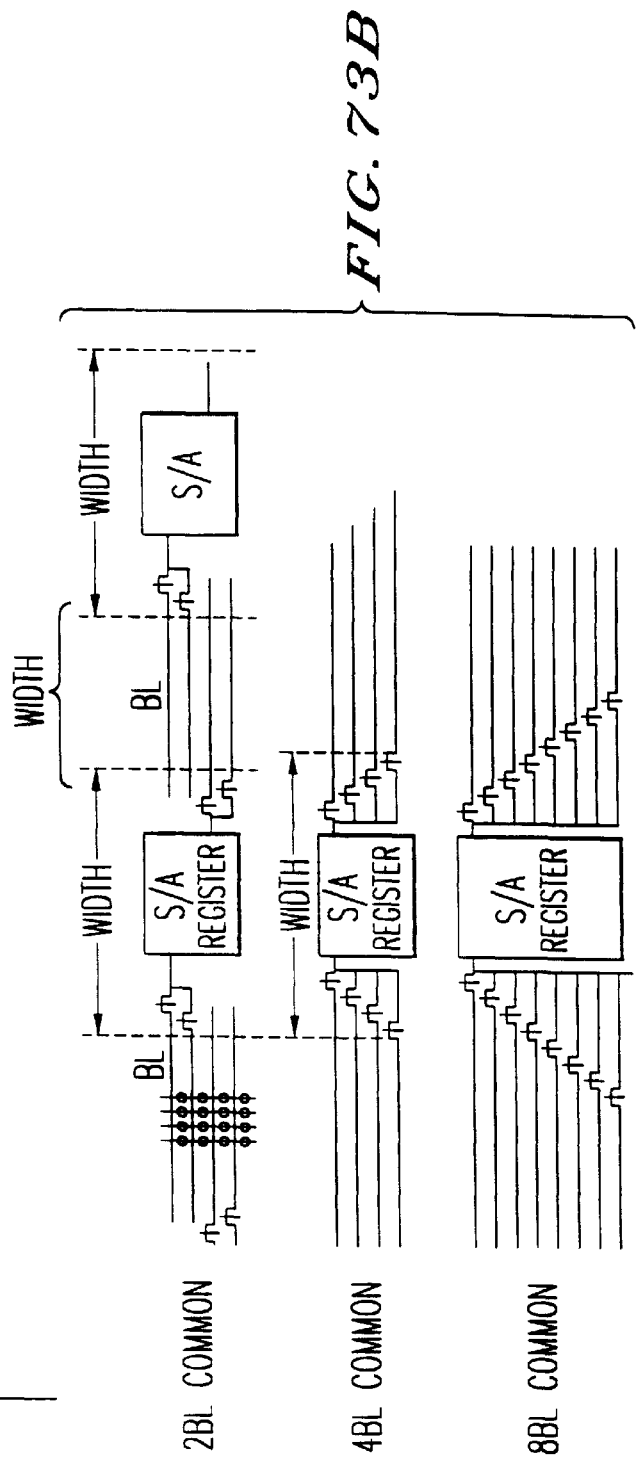

NAND-TYPE DYNAMIC RAM HAVING TEMPORARY STORAGE REGISTER AND SENSE AMPLIFIER COUPLED TO MULTI-OPEN BIT LINES

This is a Division of application Ser. No. 08/446,291, filed on May 22, 1995, now U.S. Pat. No. 5,625,602, which is a Continuation of application Ser. No. 08/154,124, filed on Nov. 18, 1993, now abandoned, which is a Continuation-In-Part of application Ser. No. 07/978,508, filed on Nov. 18, 1992, now abandoned.

BACKGROUND OF THE INVENTION

1. Field of the Invention

This invention relates to a dynamic semiconductor memory device (DRAM).

2. Description of the Related Art

A DRAM having a memory cell array which is constructed by forming a plurality of NAND memory cell units each of which is constructed by a plurality of series-connected memory cells and connecting a plurality of memory cell units to bit lines is known in the prior art. In this memory cell array system, the number of bit line contacts can be made small in comparison with a system in which memory cells are individually connected to bit lines and therefore the cell area can be reduced.

With the above NAND cell array system, when data is read out from a memory cell of the memory cell unit which lies at a long distance from the bit line, data of memory cell or cells lying between the readout memory cell and the bit line must be destroyed. Therefore, it becomes necessary to use a register for temporarily holding the data of the memory cell unit and re-write the data (for example, refer to IEEE ISSCC DIGEST OF TECHNICAL PAPERS, VOL. 34, p106, TAM.2, 1991).

As the layout method for the above temporary storing register, a method of commonly using a register for a plurality of memory cell arrays is provided. In this method, a global bit line is arranged to cross a plurality of memory cell arrays, nodes of a plurality of sense amplifiers are connected to the global bit lines via transfer gates and a register is connected to one end of the global bit line.

However, in the above conventional system, it is necessary to charge and discharge the global bit line which has a larger capacitance than the bit line arranged in the memory cell array in order to re-write data which is temporarily stored in the register. Therefore, in the conventional DRAM, the power consumption in the data re-writing operation is large.

In the above NAND cell array system, since the cell area is small, the open bit line system may be effectively used. Therefore, in the cell array system, a pseudo-folded bit line system which is a modification of the open bit line system is proposed. This system is a system in which a dummy cell array arranged at the end portion of the memory block is commonly used by memory cell arrays in the memory block.

However, in this system, it is necessary to construct the dummy cell array by memory cell units each formed of a plurality of series-connected dummy cells in the same manner as in the memory cell array and therefore the area of the dummy cell array becomes large.

In the conventional ordinary DRAM in which each memory cell is connected to a corresponding one of bit line contacts, the operation of writing data into a memory cell from the exterior of the chip is effected at the same time of effecting the active restoring operation in which data is read out from a memory cell to a bit line pair, a potential difference is amplified to Vcc and Vss by a sense amplifier, data is transferred to a DQ line, and then data is re-written into the memory cell.

In the above system, the readout mode and write-in mode of the DRAM are not separated from each other and it is not necessary to provide a circuit for setting the mode. However, in this method, when data is read out from the memory cell to the bit line pair and data set in an inverted relation with respect to data obtained by amplifying a potential difference between Vcc and Vss by use of the sense amplifier is written from the exterior, the operation is active, and since the potentials Vcc and Vss on the two nodes of the sense amplifier for amplifying data from the memory cell to the potential difference between Vcc and Vss must be inverted to Vss and Vcc, respectively, the power consumption becomes large.

In addition, in the DRAM in which a memory cell unit formed of series-connected memory cells is connected to a bit line, the memory cells are serially connected so that data of the memory cells cannot be read out at random and at a high speed.

As described above, in the conventional DRAM in which a NAND memory cell unit is constructed by serially connecting a plurality of memory cells, it is necessary to charge and discharge the global bit line in order to re-write data and the power consumption becomes large. In the case of using the pseudo-folded bit line system, the cell area of the conventional DRAM is increased by an amount corresponding to the dummy cell array. Further, the memory cells are serially connected in the conventional DRAM, data of the memory cells cannot be read out at random and at a high speed.

In an ordinary DRAM in which each memory cell is connected to a corresponding one of bit line contacts, when data is written into the memory cells and data set in an inverted relation with respect to data obtained by amplifying a potential difference to Vcc and Vss by use of the sense amplifier is written from the exterior, the operation is active, and since the potentials Vcc and Vss on the two nodes of the sense amplifier for amplifying data from the memory cell to the potential difference between Vcc and Vss must be inverted to Vss and Vcc, respectively, the power consumption becomes large.

In a dynamic semiconductor memory device, a sense amplifier is connected to a pair of bit lines from which data is read out in response to the selection of one word line. In recent years, however, memory cells have to be installed in a narrow area, and sense amplifiers for the respective pairs of bit lines cannot be easily arranged.

As described above, for example, in the open bit line system, it is difficult to lay out the sense amplifiers.

SUMMARY OF THE INVENTION

An object of this invention is to provide a DRAM which has memory cell units each constructed by serially connecting a plurality of memory cells and in which the power consumption is lowered and an erroneous readout operation can be prevented.

Another object of this invention is to provide a DRAM utilizing a sense amplifier system in which no dummy cell is required so as to reduce the cell area.

Still another object of this invention is to provide a DRAM in which the power consumption at the time of writing data can be suppressed by controlling the operation of a first sense amplifier when data is written from the exterior and then writing the data into a memory cell.

Another object of this invention is to provide a DRAM in which the operation speed at the time of reading data to the exterior or writing data from the exterior can be enhanced.

A DRAM according to a first aspect of this invention is characterized by comprising a first bit line; a plurality of memory cell arrays each constructed by a plurality of memory cell units which are connected to said first bit line and which are each formed of a plurality of series-connected dynamic memory cells; a first transfer gate connected to said first bit line; at least one sense amplifier arranged between the adjacent memory cell arrays and having a first data node selectively connected to said first bit line via said first transfer gate and a second data node; at least one register arranged between said sense amplifier and said memory cell arrays and connected to at least one of said first data node and said second data node directly or via the second transfer gate, for temporarily storing memory cell data read out from the memory cell unit; and gate control means for controlling said first transfer gate to selectively and electrically separate the first data node of said sense amplifier from said first bit line in a case where data read out to said first bit line is stored into said register from said sense amplifier.

According to the first aspect of this invention, when data to be re-written is stored into the register for temporarily storing memory cell data, the sense amplifier can be operated with the first bit line electrically separated therefrom by controlling the transfer gate provided between the register and the first bit line by means of the gate control means. That is, the operation of storing data into the register can be effected without charging or discharging the first bit line so that the power consumption of a NAND type DRAM can be reduced, occurrence of noise which may be caused on the first bit line in the cell array when the sense amplifying operation is effected can be prevented and the readout operation can be stably effected.

A DRAM according to a second aspect of this invention is characterized by comprising a first bit line; a plurality of memory cell arrays each constructed by a plurality of memory cell units which are connected to said first bit line and which are each formed of a plurality of series-connected dynamic memory cells; a first sense amplifier arranged between the adjacent memory cell arrays and having a first data node selectively connected to said first bit line and a second data node; a second bit line arranged to extend across said plurality of memory cell arrays and selectively connected to the second data node of said first sense amplifier; a switch connected to said second bit line, for controlling the operation of data transfer with respect to the exterior; a first register connected between said first sense amplifier and said memory cell arrays, for temporarily storing memory cell data read out from the memory cell of said memory cell unit; a buffer for writing exterior data to said second bit line; a second sense amplifier for amplifying data read out from said memory cell; and control means for controlling said first sense amplifier, said switch and one of said buffer and second sense amplifier to write data from said second bit line to said first bit line by use of said buffer and switch before said first sense amplifier is operated when exterior data is written via said second bit line.

According to the second aspect of this invention, data from the exterior of the chip is amplified by the buffer of the second sense amplifier and transferred to the first bit line via the second bit line before the first sense amplifier is operated in a case where the data from the exterior is written into the memory cell via the second bit line. Therefore, the power consumption caused in a case where the potentials of the input/output nodes of the first sense amplifier which are set to Vcc and Vss must be inverted in the prior art technique can be reduced.

A DRAM according to a third aspect of this invention is characterized by comprising a first bit line; a plurality of memory cell arrays each constructed by a plurality of memory cell units which are connected to said first bit line and which are each formed of a plurality of series-connected dynamic memory cells; at least one first sense amplifier arranged between the adjacent memory cell arrays and having a data node selectively connected to said first bit line; a first register arranged between said first sense amplifier and said memory array, for temporarily storing the data of said memory cell read out from memory cell unit; and at least one unit of register shared a plurality of said first amplifier for inputting and outputting data with the number of data items which are read out from said sense amplifier by one access used as one unit.

According to the third aspect of this invention, since one or more input/output registers which correspond in number to the data items read out from one sense amplifier in one access are provided, data can be input or output at random and at a high speed after data is transferred to the input/output register.

A DRAM according to a fourth aspect of this invention is characterized by comprising a bit line; a memory cell array constructed by a plurality of dynamic memory cells which are connected to said bit line; a differential sense amplifier having first and second input nodes; first and second transfer gates for selectively connecting the first and second input nodes of said sense amplifier to said bit line; a third transfer gate for selectively short-circuiting a path between the first and second input nodes of said sense amplifier; precharge means connected to said bit line; and control means for controlling said first to third transfer gates to apply the precharge potential of said bit line to the first and second input nodes of said sense amplifier as a reference potential, then set said first and second input nodes to the electrically floating state and transfer memory cell data read out to said bit line to one of said first and second input nodes.

According to the fourth aspect of this invention, a differential sense amplifier is used, a bit line precharge potential set immediately before readout is applied to one of the input nodes of the sense amplifier as a reference potential for data readout and the readout data is supplied to the other input node. Therefore, the sense amplifier can be constructed by a single-ended amplifier so that a dummy cell array is not necessary and the cell area can be reduced.

A DRAM according to a fifth aspect of this invention is characterized by comprising:

a plurality of bit lines;

a plurality of memory cell arrays each constructed by a plurality of memory cells which are selectively connected to the bit lines; and at least one amplifier located between adjacent ones of the memory cell arrays, the at least one amplifier having a first data node and a second data node, the first data node being connected selectively to the bit lines via first transfer gates of the bit lines.

In a preferred embodiment of the DRAM of the fifth aspect:

(a) The number of bit lines connected to the sense amplifier is expressed by $2^n$, preferably the number n is 4;

(b) Each of the memory cell arrays is constructed by a plurality of memory cell units, each of which is made by a plurality of memory cells connected in series. The DRAM may further comprise register means for temporarily storing data read out from a memory cell. The register means is connected to at least one of the first and second data nodes either directly or via a second transfer gate;

(c) It is desirable that each of the memory cell units be made by four memory cells connected in series;

(d) The register means includes a plurality of temporary storage means, and the number of temporary storage means is equal to the number of pieces of data which are read out from the sense amplifier by one access; and (e) One half of the temporarily storing means are connected to the first data node, and the other half thereof are connected to the second data node. The temporary storage means have a folded type cell structure.

According to the fifth aspect of this invention, the sense amplifiers can be easily arranged or laid out. In addition, since the sense amplifiers can be minimum in size, the area which the sense amplifiers occupies on a chip is as narrow as possible, and the manufacturing cost of the DRAM can be reduced, accordingly.

As described above, according to this invention, the temporarily storing registers are arranged adjacent to the sense amplifier disposed between the NAND memory cell arrays, the sense amplifier is operated with the bit line and global bit line electrically separated therefrom by controlling the transfer gate when memory cell data is stored into the register so that data can be stored into the register without charging and discharging the bit line, thereby making it possible to reduce the power consumption of the DRAM and suppress noise occurring at the readout time.

Further, the power consumption can be reduced by transferring data from the global bit line pair to the bit line pair without operating the first sense amplifier by use of the second sense amplifier or write-in buffer when data is written into the memory cell from the I/O register cell.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIGS. 3A and 3B are diagrams respectively showing the constructions of a NAND memory cell unit and a register in the first embodiment;

FIGS. 4 and 5 are timing diagrams for illustrating the data readout operation of the first embodiment;

FIGS. 8 to 12 are diagrams showing the concrete constructions of portions of the data transfer system control circuit shown in FIG. 6;

FIGS. 13A and 13B are diagrams respectively showing the concrete constructions of clocked inverters $N_{11}$ and $N_{12}$;

FIG. 14 is a diagram showing the operation waveforms obtained at respective nodes when data is stored on the bit line pair from the I/O register;

FIG. 16 is a diagram showing another example of the construction of the I/O register cell of FIG. 7;

FIG. 20 is a diagram showing a first modification of FIG. 1;

FIGS. 22 and 23 are diagrams showing the construction of a second embodiment of a DRAM according to this invention, that is, the construction of a DRAM of an embodiment in which registers are provided on both sides of a sense amplifier;

FIGS. 24 and 25 are timing diagrams for illustrating the data readout operation of the second embodiment;

FIGS. 26 and 27 are diagrams showing the construction of a DRAM of a first modification of the second embodiment in which the registers are provided on both sides of the sense amplifier;

FIGS. 28 and 29 are timing diagrams for illustrating the data readout operation of the first modification of the second embodiment;

FIGS. 30A and 30B are diagrams respectively showing examples of the construction of the memory cell of the register in the first modification of the second embodiment;

FIGS. 31 and 32 are diagrams showing the construction of a DRAM of a second modification of the second embodiment in which the registers are provided on both sides of the sense amplifier;

FIGS. 33 and 34 are timing diagrams for illustrating the data readout operation of the second modification of the second embodiment;

FIGS. 39 and 40 are diagrams showing the construction of a DRAM of a fourth modification of the second embodiment in which the registers are provided on both sides of the sense amplifier;

FIGS. 41 and 42 are diagrams showing the construction of a DRAM of a fifth modification of the second embodiment in which the registers are provided on both sides of the sense amplifier;

FIG. 43 is a diagram showing an example of the construction of an I/O register for outputting data at a high speed in the construction of FIGS. 41 and 42;

FIG. 44 is a circuit diagram of the I/O register;

FIGS. 45 and 46 are circuit diagrams of a circuit for generating a basic signal used for controlling signals in FIGS. 41 and 42;

FIG. 47 is a timing diagram for illustrating the readout operation in the circuit of FIGS. 45 and 46;

FIG. 49 is a diagram for illustrating the process of determining the readout order of signals in FIGS. 41 and 42;

FIG. 50 is a diagram for illustrating the process of determining the write-in order of signals in FIGS. 41 and 42;

FIGS. 51 and 52 are diagrams showing the construction of a third embodiment of a DRAM according to this invention, that is, the construction of a DRAM of an embodiment in which a differential sense amplifier is used;

FIGS. 53 and 54 are timing diagrams for illustrating the data readout operation of the third embodiment;

FIGS. 56 and 57 are diagrams showing the construction of a DRAM of a first modification of the third embodiment using the differential sense amplifier;

FIG. 60 is a timing diagram for illustrating the data write-in operation in the DRAM of the first modification of the third embodiment;

FIG. 61 is a diagram showing the construction of a DRAM of a second modification of the third embodiment using the differential sense amplifier;

FIG. 63 is a diagram showing the construction of a fourth embodiment of a DRAM according to this invention, that is, the construction of a DRAM of an embodiment in which a memory block is divided into sub-blocks to reduce the power consumption;

FIG. 64 is a diagram showing the construction of a DRAM of a first modification of the fourth embodiment in which the memory block is divided into the sub-blocks to reduce the power consumption;

FIGS. 65 and 66 are diagrams showing the construction of a DRAM of a second modification of the fourth embodiment in which the memory block is divided into the sub-blocks to reduce the power consumption;

FIGS. 69A to 69C are circuit diagrams respectively showing the case where two bit lines share one sense amplifier, the case where four bit lines share one sense amplifier, and the case where eight bit lines share one sense amplifier;

FIGS. 70A and 70B show the relationships between the area (width) required for the layout of sense amplifiers and the number of bit lines sharing one sense amplifier;

FIGS. 72A to 72C are circuit diagrams respectively showing the case where two bit lines share one sense amplifier, the case where four bit lines share one sense amplifier, and the case where eight bit lines share one sense amplifier; and FIGS. 73A and 73B show how the areas for the sense amplifiers can be narrowed in each of the cases shown in FIGS. 72A to 72C;

DETAILED DESCRIPTION OF THE PREFERRED EMBODIMENTS

There will now be described an embodiment of this invention with reference to the accompanying drawings.

Figure 1:
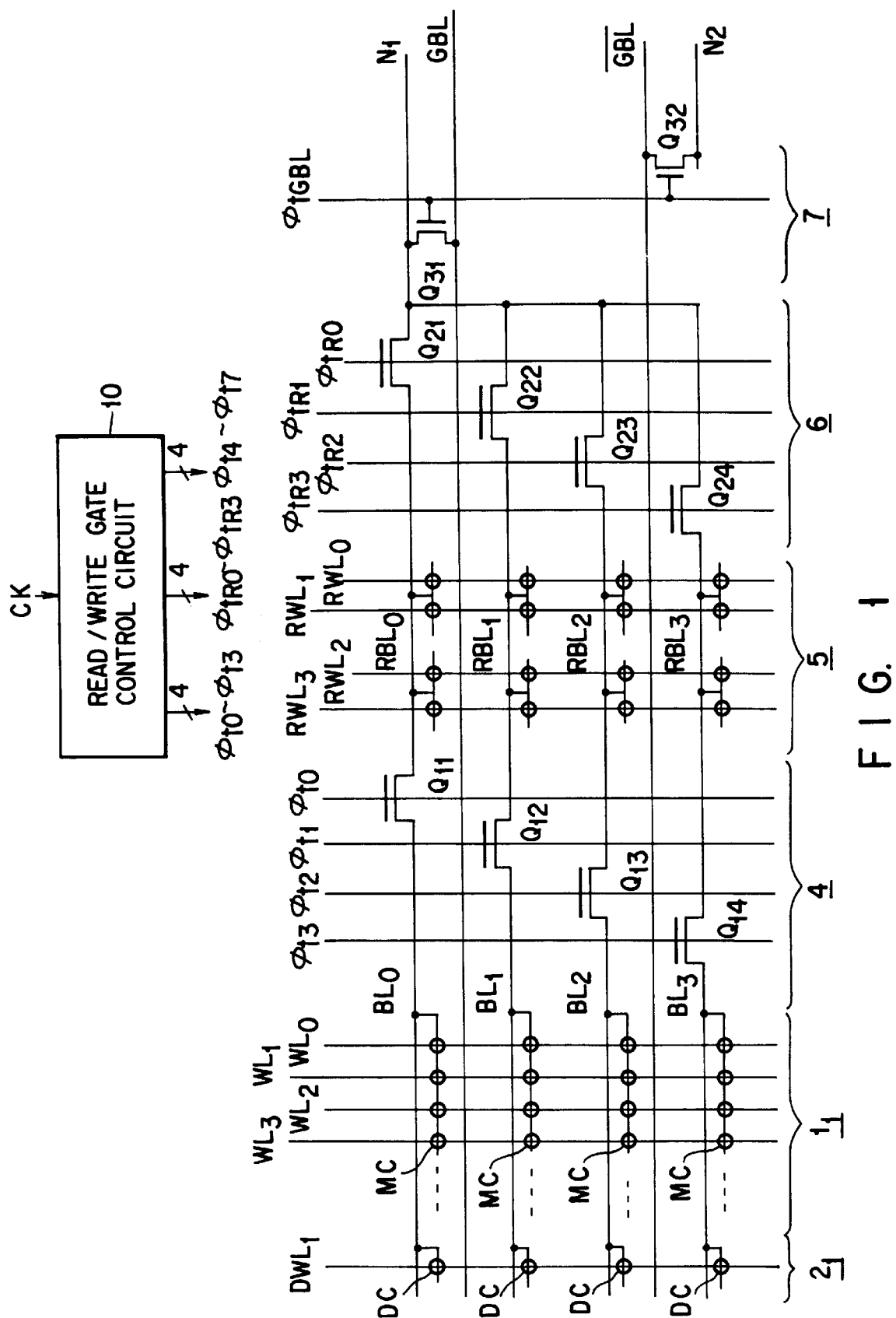
FIGS. 1 and 2 are diagrams showing the construction of a first embodiment of a DRAM according to this invention, that is, the construction of a DRAM of an embodiment in which a register is provided on one side of a sense amplifier.
Figure 2:
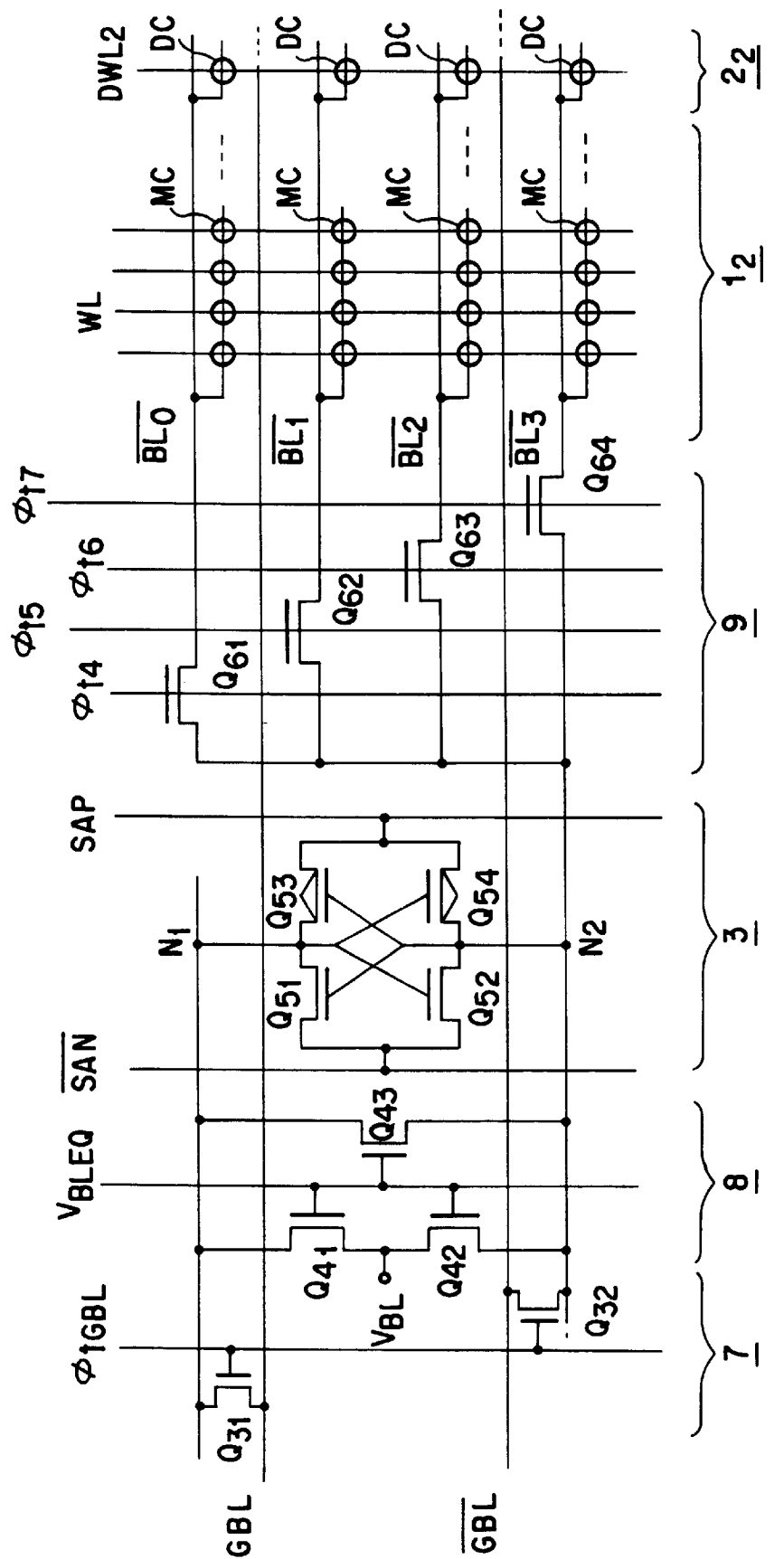

FIGS. 1 and 2 are diagrams showing the construction of a first embodiment of a DRAM according to this invention, that is, the construction of a DRAM of an embodiment in which a register is provided on one side of a sense amplifier. This embodiment shows an example in which one memory cell unit is constructed by serially connecting four memory cells MC. The concrete construction of the memory cell is shown in FIG. 3A. As shown in FIGS. 1 and 2, memory cell arrays $1_1$ and $1_2$ each having a plurality of memory cell units are arranged on both sides of a sense amplifier 3. Dummy cell arrays $2_1$ and $2_2$ are respectively connected to one-side end portions of the memory cell arrays $1_1$ and $1_2$. The dummy cell array may be the same construction as the memory cell unit which is constructed by serially connecting four memory cells. The memory cell MC and dummy cell DC are each formed with the one-transistor/one-capacitor structure which is used in an ordinary DRAM.

The sense amplifier 3 includes a CMOS flip-flop which is constructed by nMOS transistors $Q_{51}$ and $Q_{52}$ and PMOS transistors $Q_{53}$ and $Q_{53}$. An equalizer circuit 8 is provided adjacent to the sense amplifier 3. The equalizer circuit 8 includes precharge nMOS transistors $Q_{41}$ and $Q_{42}$ and an equalizing pMOS transistor $Q_{43}$.

A re-writing register 5 is arranged between the memory cell array $1_1$ which is one of the two memory cell arrays and the sense amplifier 3 and equalizer circuit 8. In this embodiment, as shown in FIG. 3B, the register 3 is formed with the same construction as that of the memory cell MC used in the memory cell array. Further, in the register 5, four memory cells which are selected by register word lines $RWL_0$ to $RWL_3$ for respective data nodes $RBL_0$ to $RBL_3$ are arranged in positions corresponding to four memory cells MC selected by word lines $WL_0$ to $WL_3$.

Four bit lines $BL_0$ to $BL_3$ of the memory cell array $1_1$ which is one of the two memory cell arrays are respectively connected to the data nodes $RBL_0$ to $RBL_3$ of the register 5 via four nMOS transistors $Q_{11}$ to $Q_{14}$ of a transfer gate 4. The data nodes $RBL_0$ to $RBL_3$ of the register 5 are connected to a common connection node via respective nMOS transistors $Q_{21}$ to $Q_{24}$ of a transfer gate 6 and the common connection node is connected to a data node N1 which is one of the two data nodes of the sense amplifier 3. Four bit lines $\overline{BL_0}$ to $\overline{BL_3}$ of the other memory cell array $1_2$ are connected to a common connection node via respective nMOS transistors $Q_{61}$ to $Q_{64}$ of a transfer gate 9 and the common connection node is connected to the other data node $N_2$ of the sense amplifier 3.

The data nodes $N_1$ and $N_2$ of the sense amplifier 3 are respectively connected to global bit lines GBL and $\overline{GBL}$ via nMOS transistors $Q_{31}$ and $Q_{32}$ of a transfer gate 7. The global bit lines GBL and $\overline{GBL}$ are arranged to extend across the memory cell arrays $1_1$ and $1_2$ and are connected to data input/output lines (not shown). The transfer gate 7 for the global bit lines is shown in FIGS. 1 and 2 for an easy understanding of the connection relation between circuit portions respectively shown in FIGS. 1 and 2 which are connected to each other in practice.

A read/write gate control circuit 10 serves to control the transfer gates 4, 6, 7 and 9 in response to a clock. The gate control circuit 10 basically controls the transfer gates 4 and 6 so that only data of a selected bit line among data items read out from the memory cells to bit lines can be transferred to the data nodes of the sense amplifier 3 and re-written into a corresponding data node of the register 5 with the bit lines electrically separated therefrom.

FIGS. 4 and 5 show concrete waveforms for illustrating the data re-write operation for re-writing data read out by the readout operation of the first embodiment into the re-writing register 5. In this example, the explanation is made with much attention paid to the first bit of the memory cell unit to be selected by the word line $WL_0$.

Before data readout, transfer gate control signal lines $\phi_{t0}$ to $\phi_{t3}$ and $\phi_{tR0}$ to $\phi_{tR3}$ are all set to the "H" level and an equalization control signal line $V_{BLEQ}$ is set to the "H" level, and as a result, the bit lines, the node of the register 5 and the nodes of the sense amplifier 3 are precharged to (½)Vcc, for example, by means of the equalizing circuit 8. After this, the control signal lines $\phi_{tR1}$, $\phi_{tR2}$, $\phi_{tR3}$, $\phi_{tR5}$, $\phi_{tR6}$ and $\phi_{tR7}$ are set to the "L" level, and only the bit lines $BL_0$ and $\overline{BL_0}$ are respectively connected to the nodes $N_1$ and $N_2$ of the sense amplifier 3.

In this condition, the word line is selectively driven. In this case, the potential of the word line $WL_0$ on the side of the memory cell array $1_1$ rises and data items of memory cells arranged along the word line $WL_0$ are read out to the bit lines $BL_0$ to $BL_3$. At this time, the potential of the dummy word line $DWL_1$ of the dummy cell array $2_1$ falls. This is because coupling noises caused on the bit lines by the fall of the potential of the word line $WL_0$ are canceled. Since the dummy cell line $DWL_2$ of the dummy cell array $2_2$ on the side of the other memory cell array $1_2$ is kept at the "H" level, data of the dummy cell array $2_2$ is read out to the bit lines $\overline{BL_0}$ to $\overline{BL_3}$.

Only the data items of the bit lines $BL_0$ and $\overline{BL_0}$ among the data items of the bit lines $BL_0$ to $BL_3$ and $\overline{BL_0}$ to $\overline{BL_3}$ are transferred to the nodes $N_1$ and $N_2$ of the sense amplifier 3. After this, the control signal lines $\phi_{tR0}$, $\phi_{t4}$ and $\phi_{t0}$ are sequentially set to the "L" level to electrically separate the bit lines which have been connected to the sense amplifier 3 and electrically separate the register 5 from the bit lines and sense amplifier 3. In this condition, the amplifying operation of the sense amplifier 3 is effected.

After this, the control signal line $\phi_{tR0}$ is set to the "H" level again to connect the node $N_1$ of the sense amplifier 3 to the node $RBL_0$ of the register 5 so as to permit data read out from the bit line $BL_0$ to be written into a selected memory cell of the register 5. At this time, the control signal line $RWL_0$ among the control signal lines $RWL_0$ to $RWL_3$ is set at the "H" level and data is re-written into the memory cell selected by the control signal line.

The same operation is repeatedly effected to permit data items selected by the word line $WL_0$ and read out to the bit lines $BL_0$, $BL_1$, $BL_2$ and $BL_3$ to be sequentially transferred to the sense amplifier 3 and re-written into the four memory cells of the register 4 which are controlled by the control signal line $RWL_0$.

Re-writing into the memory cell from the re-writing register 5 performs that the data are written into memory cell block 1 by opening the transfer gate 4, after the sense amplifier 3 is operated by opening transfer gate 6 arranged on the bit line and connected to the memory cell to be re-written to amplify the data of the register cell 5. The transfer gate connected to the memory cell to be re-written can be opened after operating the sense amplifier 3.

Although not indicated by the above operation waveforms, if the word line $WL_1$ is selected, data items of the memory cells arranged along the word line $WL_0$ are first read out and re-written into the memory cells of the register arranged along the control signal line $RWL_0$, and then data items of the memory cells arranged along the word line $WL_1$ are re-written into the memory cells of the register arranged along the control signal line $RWL_1$.

During the operation of reading out the data items from the memory cell array to the re-writing register, the global bit lines GBL and $\overline{GBL}$ are electrically separated from the data nodes $N_1$ and $N_2$ of the sense amplifier 3, and while the sense amplifier 3 is operated to write data into the register 5 as described above, the bit lines BL and $\overline{BL}$ are electrically separated from the data nodes $N_1$ and $N_2$ of the sense amplifier 3. Therefore, according to this embodiment, it is not necessary to charge and discharge the bit lines and global bit lines during the operation of writing data into the register and the power consumption can be reduced.

Figure 6:
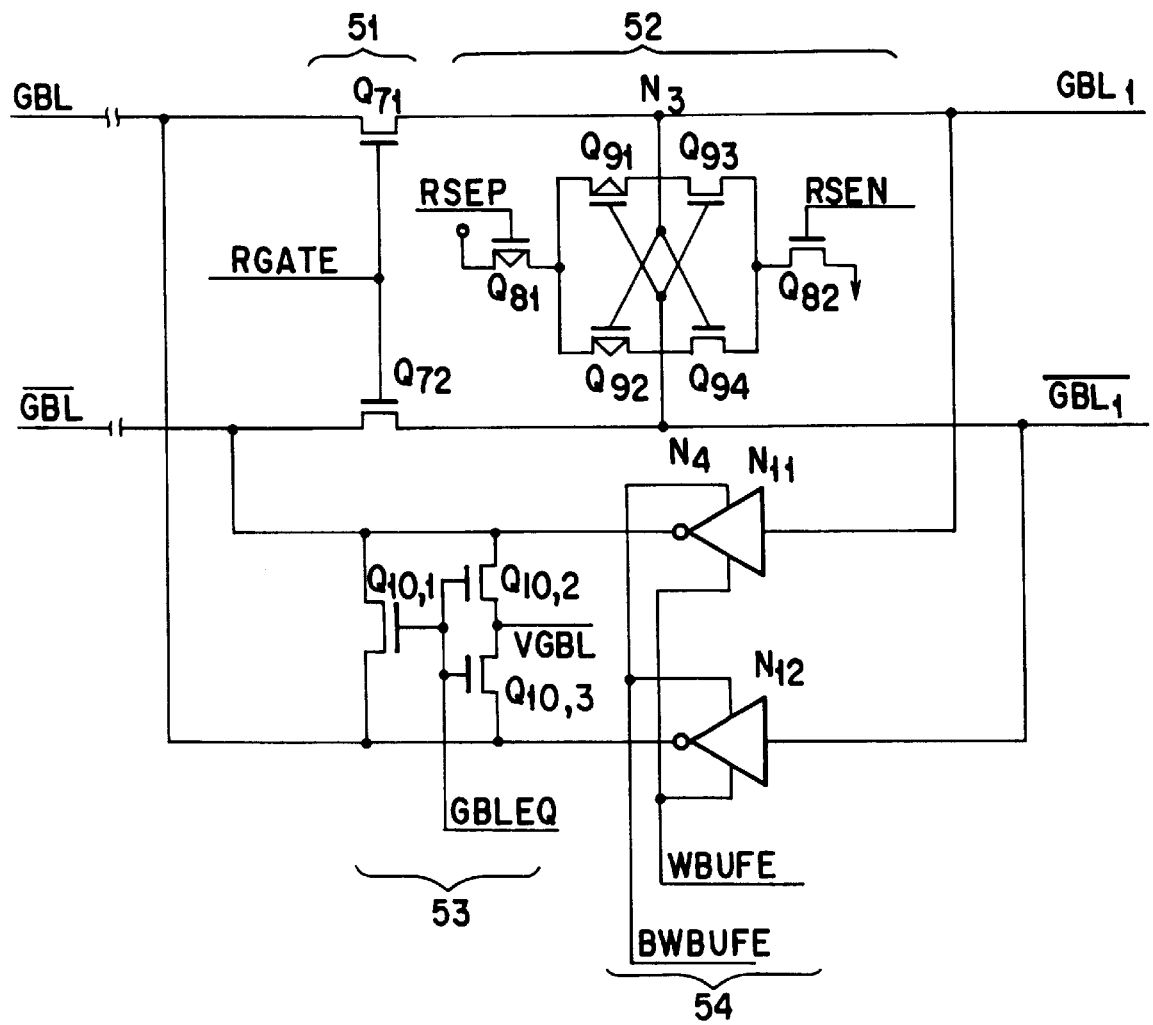
FIG. 6 is a diagram showing the construction of a data transfer system control circuit in the first embodiment.
Figure 7:
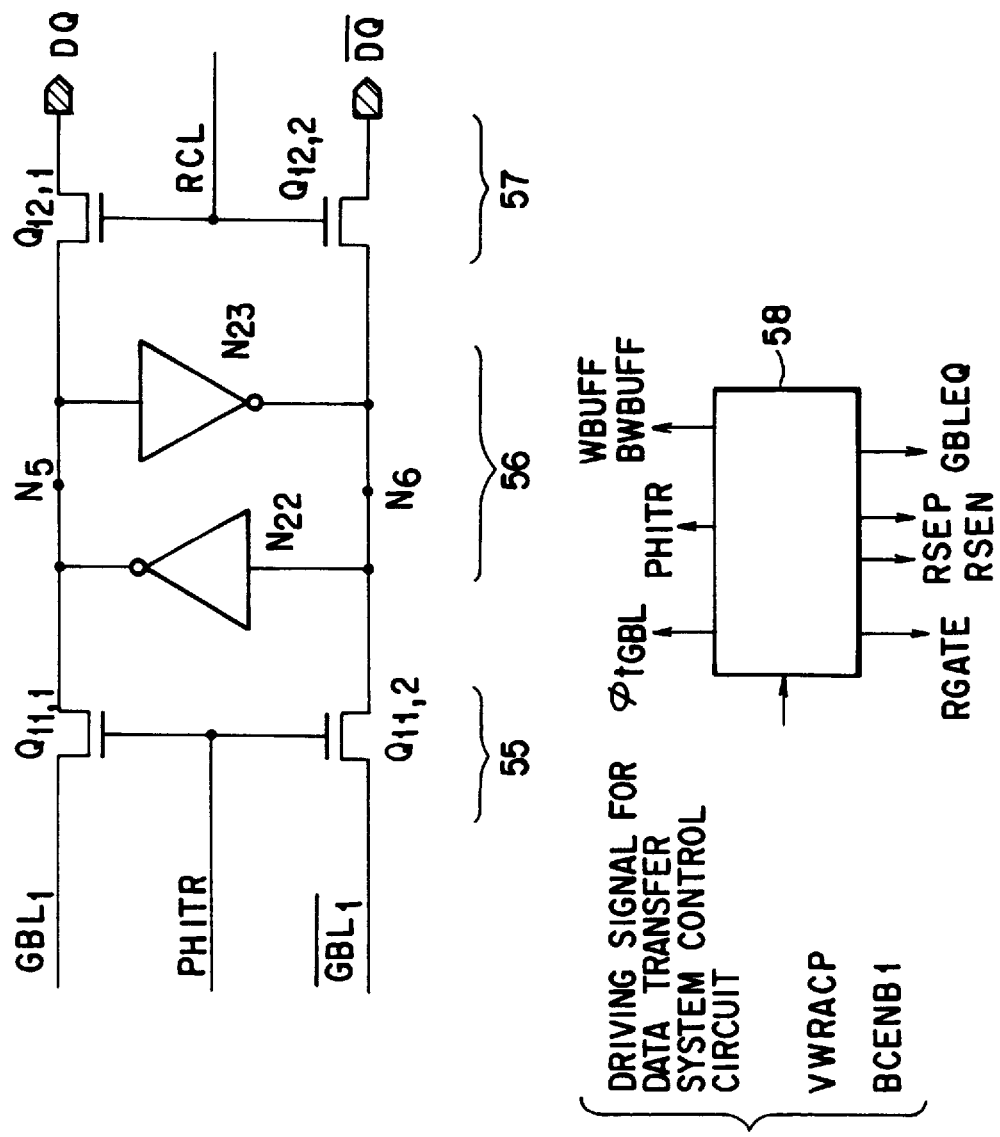
FIG. 7 is a diagram showing the construction of an I/O register cell in the first embodiment.

FIG. 6 is a diagram showing the construction of the data transfer system circuit of the first embodiment, and the data transfer system circuit for latching data read out from the bit line into the I/O register and writing data from the I/O register to a bit line pair. FIG. 7 is a diagram showing the construction of the I/O register cell of the first embodiment and a diagram showing data transfer control circuit 58. Each of the data transfer system circuit and an I/O register cell is provided one for each global bit line pair and a preset number of sense amplifiers 3.

The data transfer system includes a read gate 51 constructed by nMOS transistors $Q_{71}$ and $Q_{72}$, a register sense amplifier 52 constructed by pMOS transistors $Q_{81}$, $Q_{91}$ and $Q_{92}$ and nMOS transistors $Q_{93}$, $Q_{94}$ and $Q_{82}$, a global bit line equalizing circuit 53 constructed by nMOS transistors $Q_{10,1}$, $Q_{10,2}$, and $Q_{10,3}$, a write-in buffer 54 constructed by clocked inverters $N_{11}$ and $N_{12}$, and an I/O data register $\phi_t$ gate circuit 55 constructed by nMOS transistors $Q_{11,1}$ and $Q_{11,2}$.

An I/O register cell includes a latch circuit 56 constructed by inverters $N_{22}$ and $N_{23}$. A transfer gate constructed by nMOS transistors $Q_{12,1}$ and $Q_{12,2}$ controls data to transfer to an I/O via a DQ line pair of the I/O register cell 56.

A control circuit 58 serves to control the transfer gates 51 to 55 according to data transfer control circuit driving signals BCEND and VWRACP, and the concrete construction thereof is shown in FIGS. 8 to 12. The data transfer system control circuit 58 generally serves to control the gate GNLEQ of the global bit line pair equalizing circuit 53 so as to release the paired global bit lines from the equalized state at the readout time, and when data of the memory cell is read out to the global bit line pair, it controls the read gate RGATE of the read gate control circuit 51 to turn off the transistors $Q_{71}$ and $Q_{72}$, controls RSEP and RSEN of the register sense amplifier 52 to amplify the potential difference between the paired global bit lines, and controls PHITR of the I/O register $\phi_t$ gate circuit 55 to turn on the transistors $Q_{11,1}$ and $Q_{11,2}$ so as to cause data to be written into the I/O register cell 56. At this time, the operation of the write-in buffer 54 is kept interrupted by controlling WBUFE and BWBUFE.

On the other hand, when data is written from the I/O register into the memory cell, data of the I/O register cell 56 is read out to GBL$_1$ and $\overline{GBL_1}$ by controlling PHITR of the I/O register φ$_t$ gate circuit 55, and then the readout data is transferred to the succeeding stage by controlling WBUFE and BWBUFE of the write-in buffer 54 and written into the bit line pair via the global bit line pair (GBL and $\overline{GBL}$). At this time, the read gate circuit 51, register sense amplifier circuit 52 and global bit line equalizing circuit 53 are kept deactivated by controlling the respective gates.

A difference between the above embodiment and the conventional DRAM in the operation of writing data from the I/O register cell 56 into the memory cell is that the sense amplifier 3 of FIG. 2 is not operated and the power consumption is reduced when inverted potentials of the potentials of the nodes N$_1$ and N$_2$ are written unlike the case wherein the sense amplifier 3 is operated.

FIGS. 13A and 13B show the clocked inverters of N$_{11}$ and N$_{12}$ used as the buffer circuit 54. FIGS. 13A and 13B respectively correspond to the inverters N$_{11}$ and N$_{12}$.

FIG. 14 shows the operation waveforms obtained at respective nodes when data is stored on the bit line pair from the I/O register. More specifically, FIG. 14 shows the operation waveforms obtained when potentials Vcc and Vss are respectively held on nodes N$_5$ and N$_6$ of the I/O register cell 56 and the potentials are stored on the nodes N$_1$ and N$_2$ of the sense amplifier 3.

First, WBUFE and BWBUFE are respectively set to the "H" and "L" potential levels so as to write data from the I/O register onto the global bit line pair. That is, the write mode is set.

Secondly, it is assumed that the write-in operation effected at this time utilizes the active restore effected at the time of the readout operation. That is, N$_1$ and N$_2$ are equalized and set to (½)Vcc, and the potential of the register word line RWLn (n=0, 1, 2, 3) rises to permit data of the register cell to be read out onto the bit line. If the active restore is the operation effected at the readout time, data on the bit line pair is amplified since the sense amplifier is operated, but since the operation of the sense amplifier 3 is interrupted in this case, the data is not amplified.

Thirdly, the potential of the I/O register is transmitted to the global bit line pair by applying the potential "H" to PHITR. Further, data is transmitted to the bit line pair from the global bit line pair by setting φ$_{tGBL}$ to the "H" level and is written into the nodes N$_1$ and N$_2$.

Fourthly, when φ$_{tn}$ (n=0, 1, 2, 3) of the transfer gate 4 is set to "H", data of N$_1$ and N$_2$ is written into the memory cell 1$_1$. At this time, potentials vcc and Vss are not applied from the exterior to the nodes SAP and $\overline{SAN}$ of the sense amplifier 3 and the sense amplifier 3 is not operated. Therefore, unlike the conventional DRAM, since the sense amplifier 3 is not operated and the potentials Vcc and Vss of the nodes are not changed to Vss and Vcc when data is written into the odes N$_1$ and N$_2$, the power consumption can be reduced.

Figure 15:
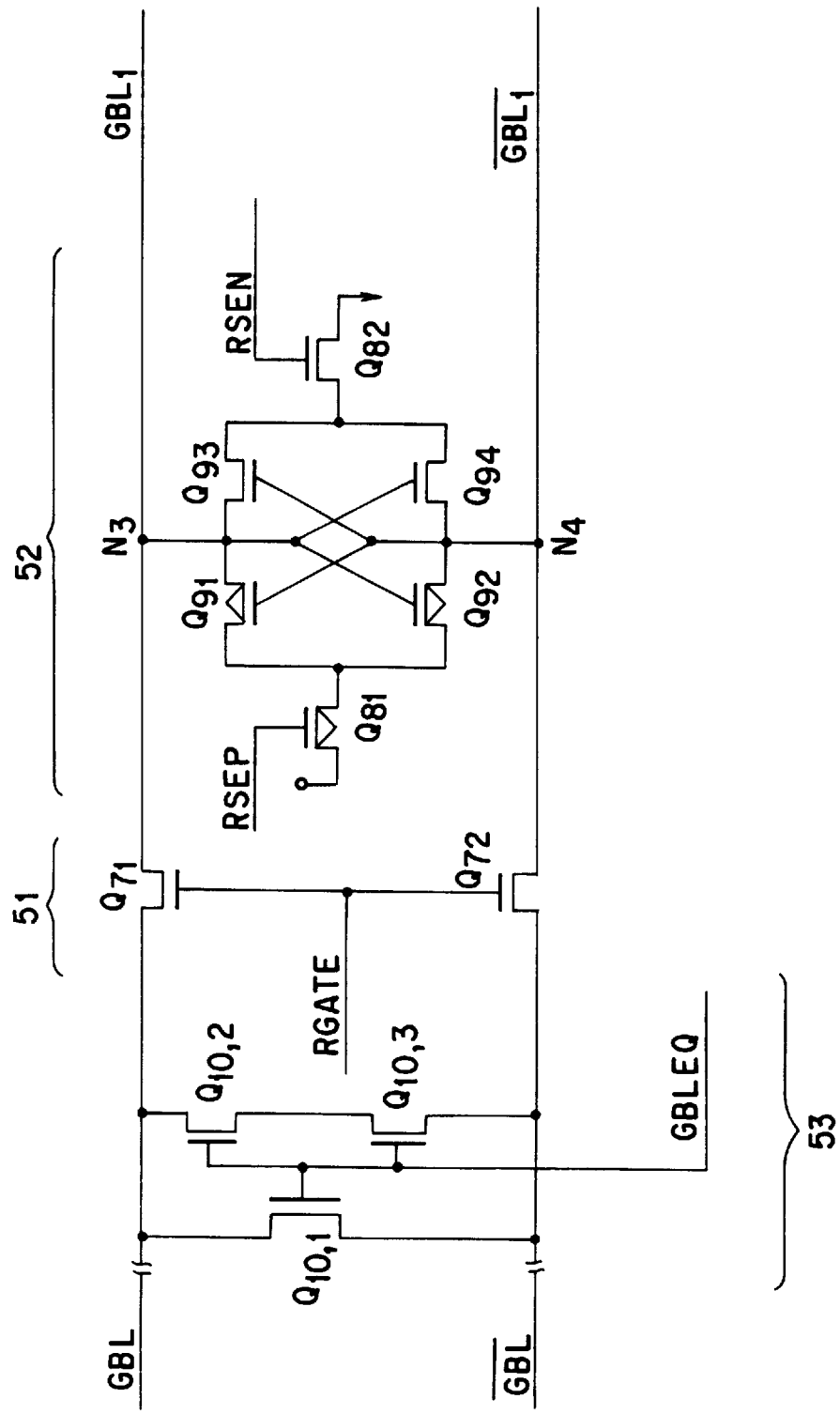
FIG. 15 is a diagram showing another example of the construction of the data transfer system control circuit of FIG. 6.

Another example of the data transfer system and I/O register is explained. The basic construction of the DRAM is the same as that of the former embodiment, but this embodiment is different from the former embodiment in the following respects. In the former embodiment, the write-in buffer 54 is used when data is written from the I/O register into the memory cell, but in this embodiment, the register sense amplifier 52 is used to effect the write-in operation. For this purpose, the data transfer system and I/O register cell are constructed as shown in FIGS. 15 and 16. In FIGS. 15 and 16, this embodiment is different from the former embodiment in that the buffer 14 is omitted. Further, the data transfer system control circuit 58' controls the gates PHITR, RGATE, RSEN, RSEP and GBLEQ in addition to the control process described above.

Figure 8:
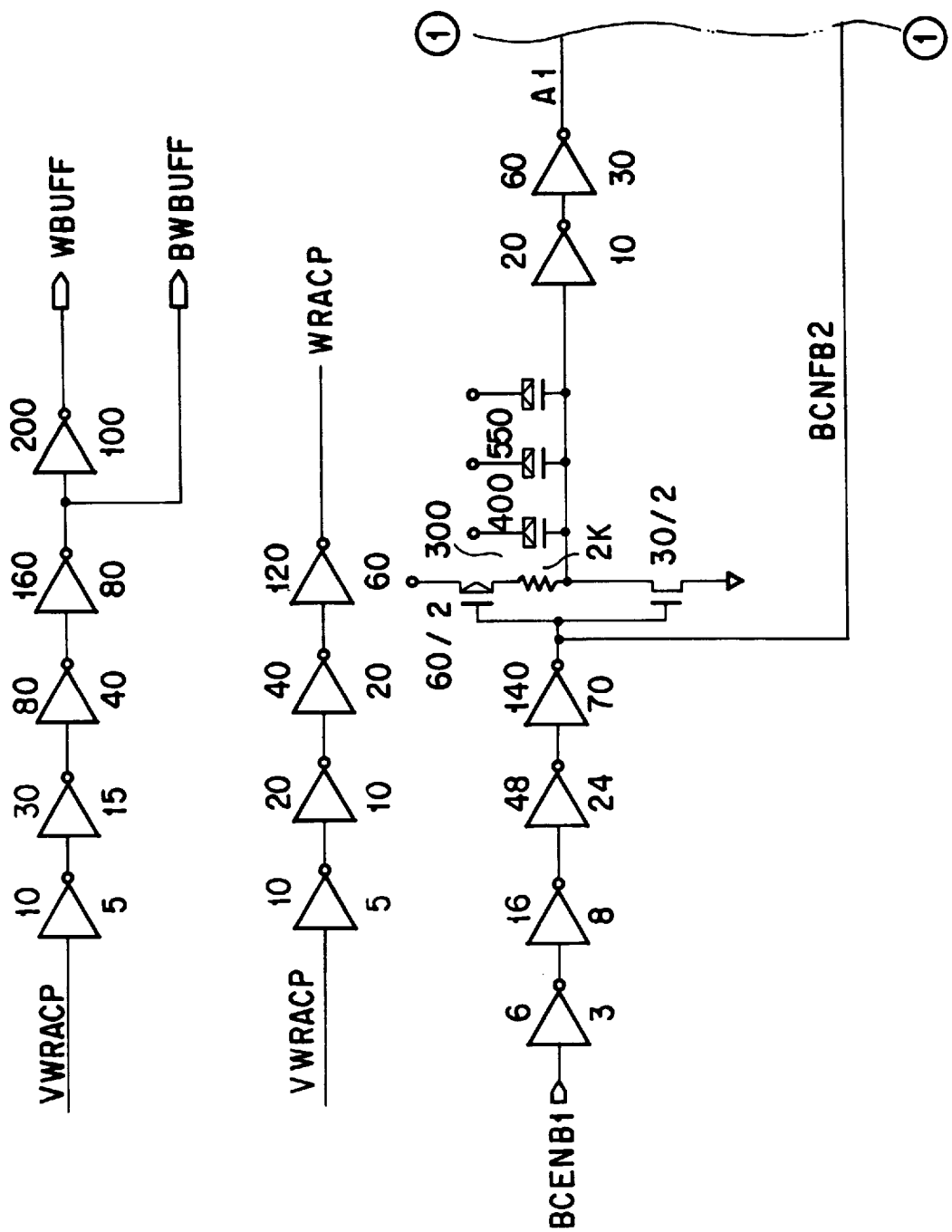
Figure 9:
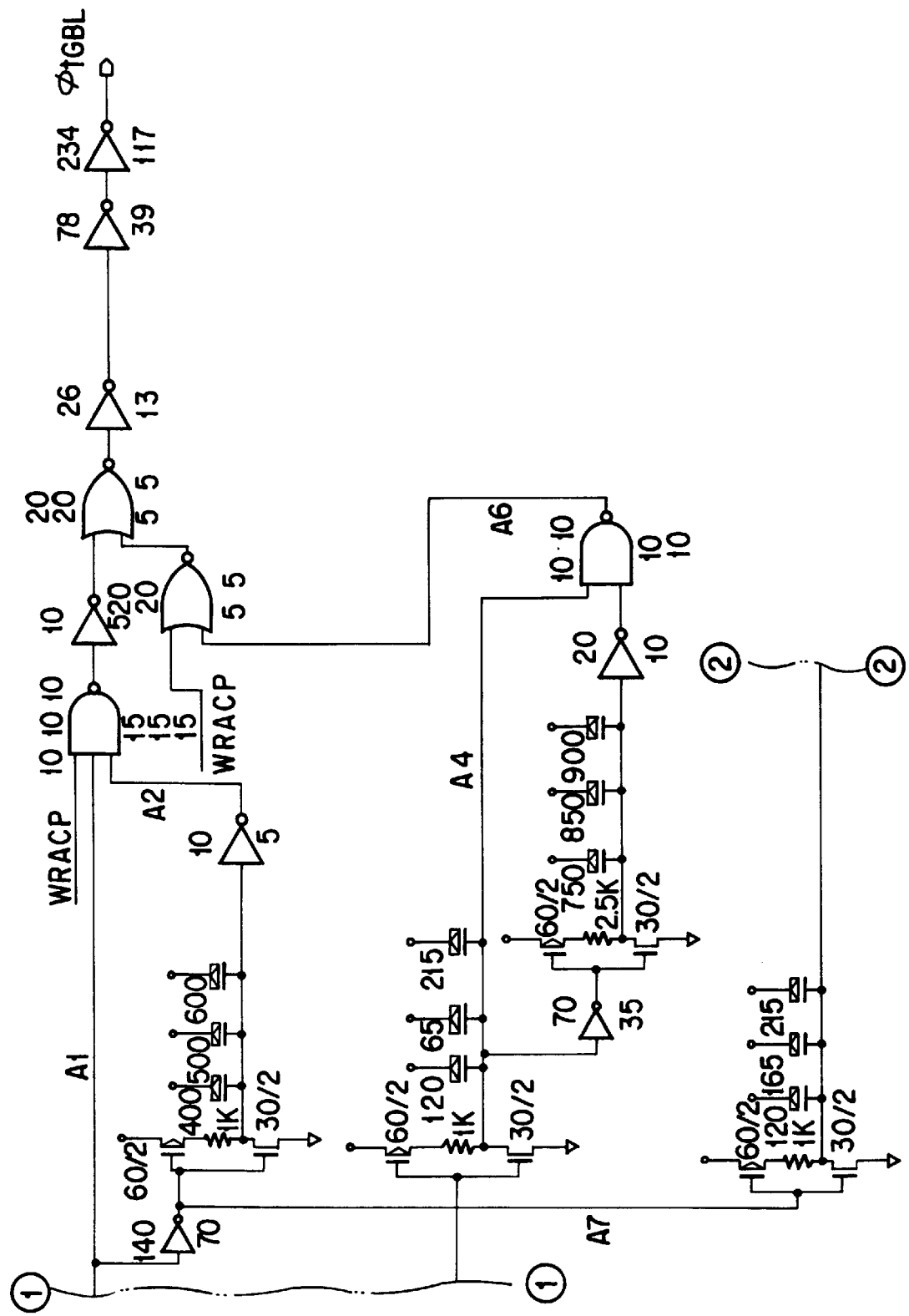
Figure 10:
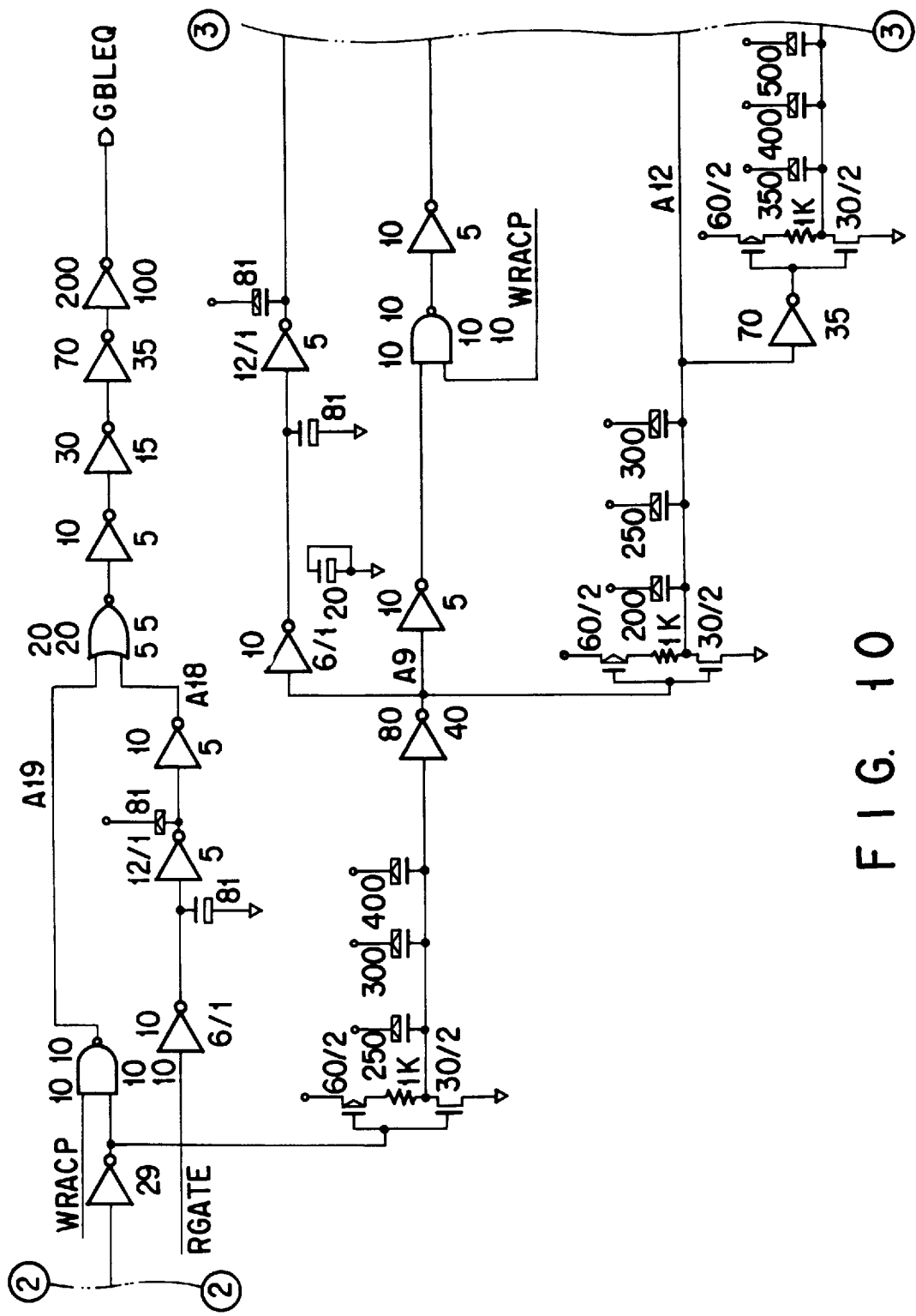
Figure 12:
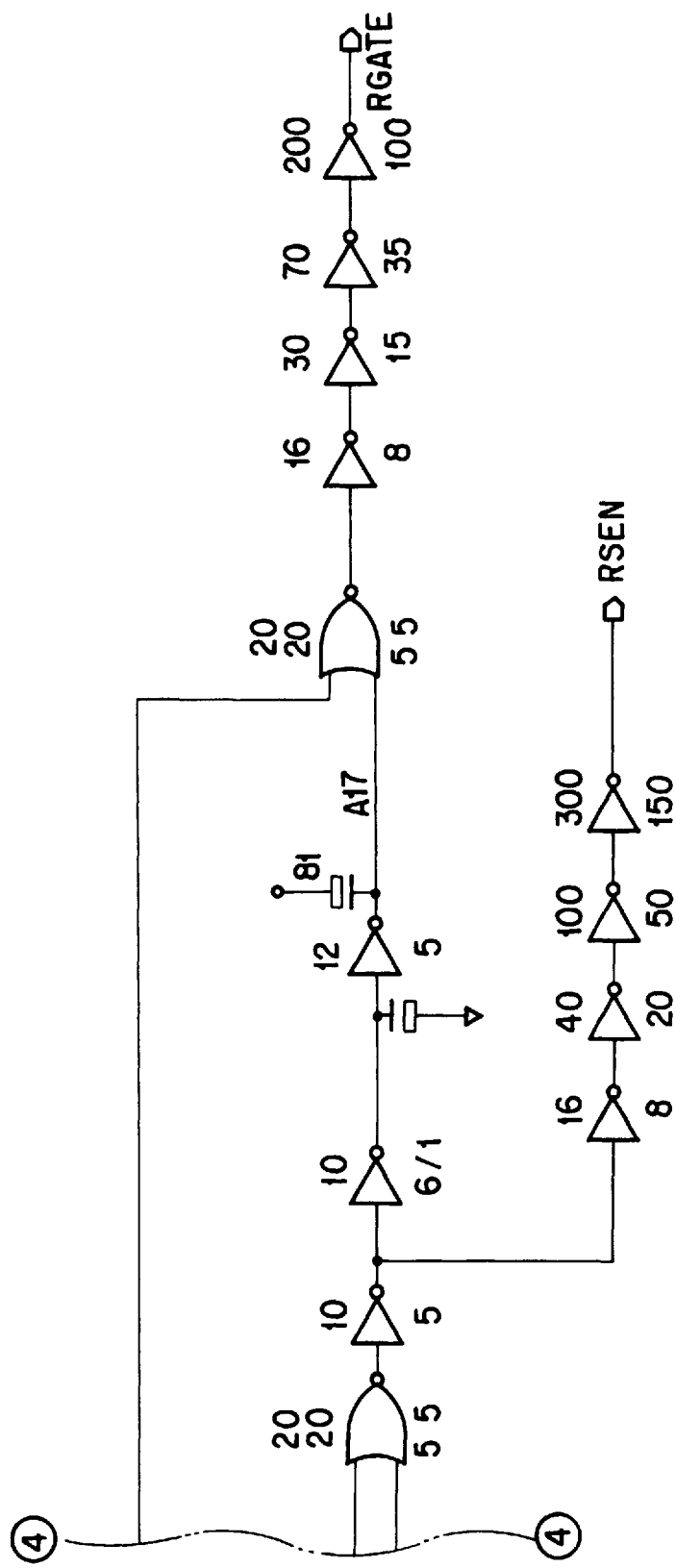
Figure 17:
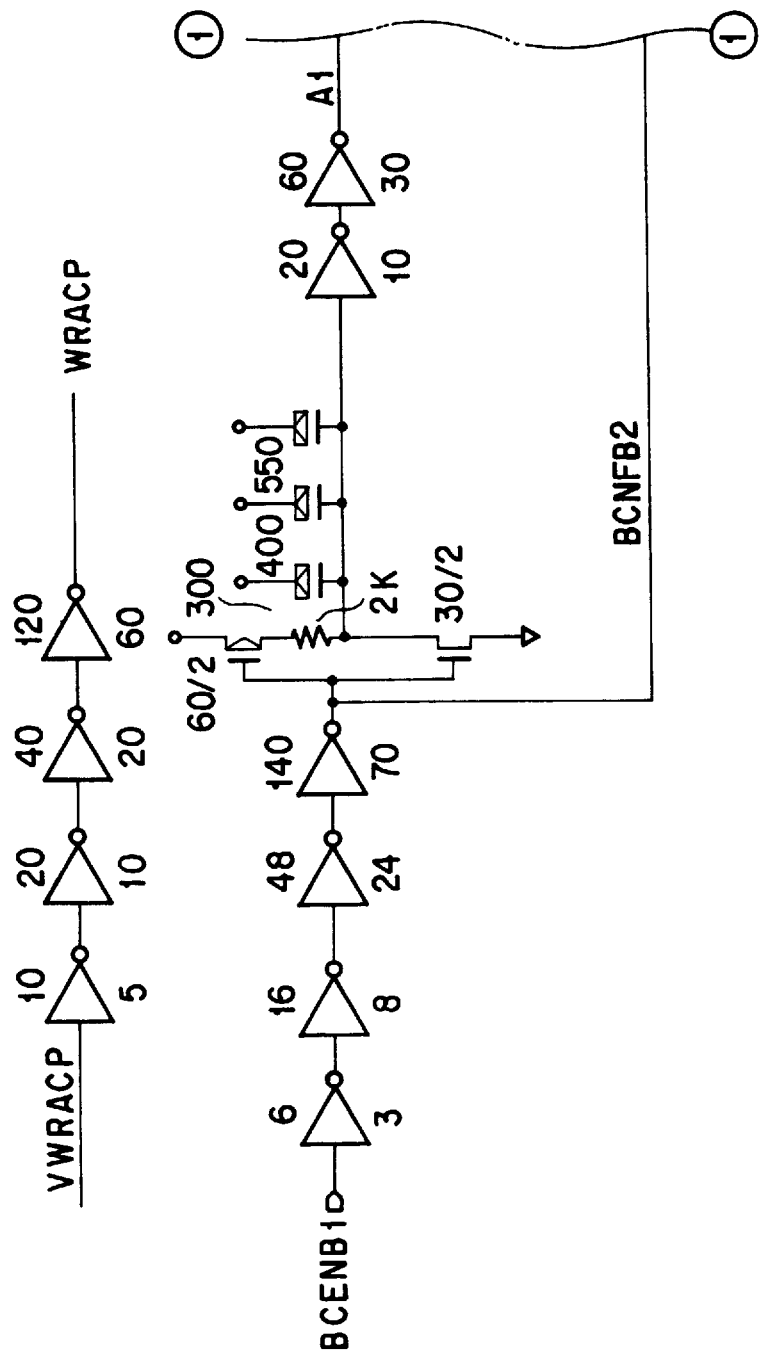
FIG. 17 is a diagram showing another example of the construction of FIG. 8.
Figure 18:
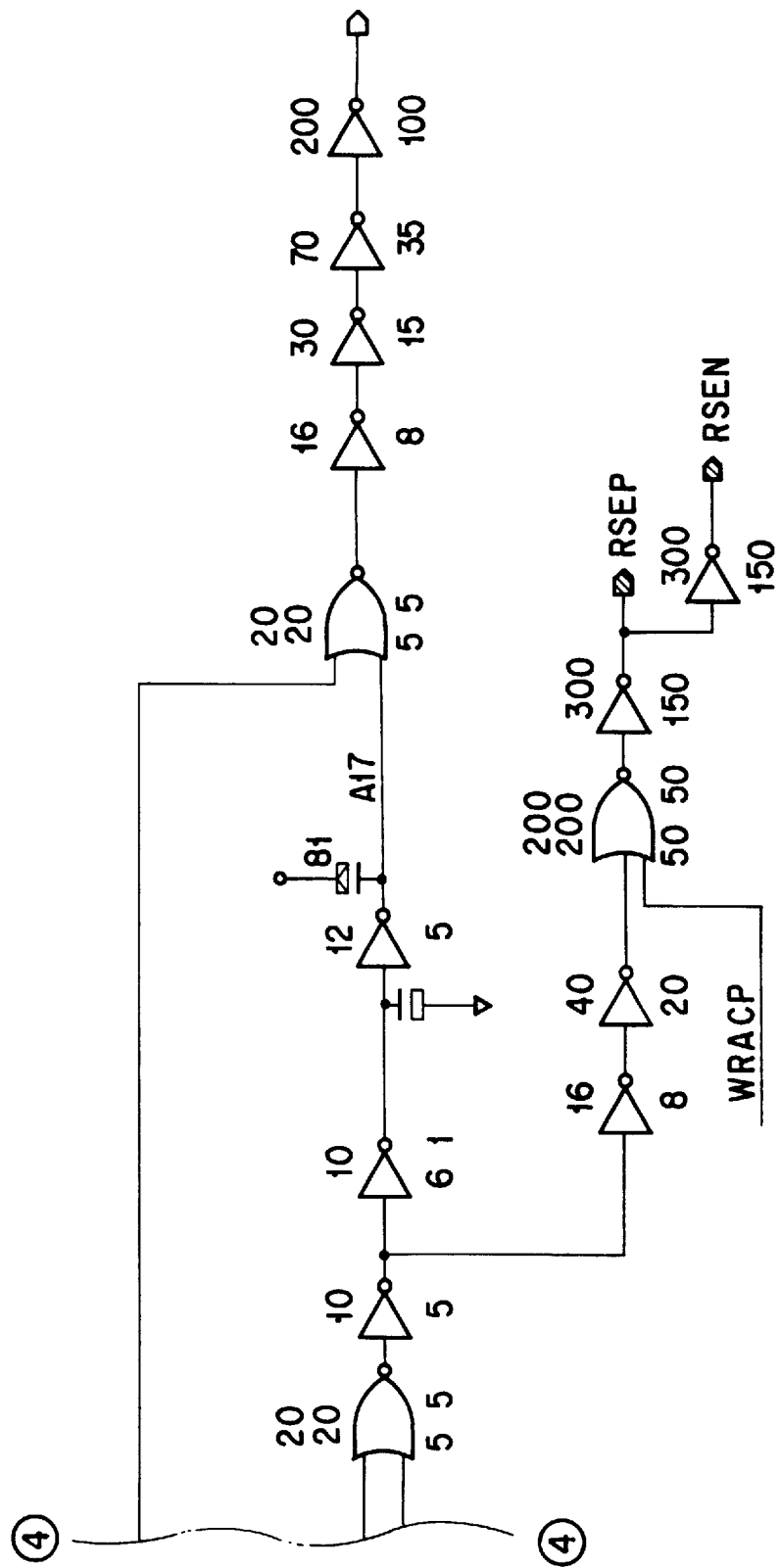
FIG. 18 is a diagram showing another example of the construction of FIG. 12.

The construction of the data transfer system control circuit 58' is basically the same as that shown in FIGS. 8 to 12, but a circuit for creating WBUFE and BWBUFE in the portion of FIG. 8 is omitted as shown in FIG. 17 and the portion of FIG. 12 is modified as shown in FIG. 18.

In this embodiment, the operation of reading out data from the memory cell into the I/O register is effected in exactly the same manner as in the former embodiment. When data is written into the memory cell from the I/O register, PHITR is first set to the "H" potential so as to permit the potentials of the I/O register to be transmitted to GBL and $\overline{GBL}$.

Secondly, RSEP and RSEN are respectively set to the "L" and "H" potentials so as to permit the potential difference between GBL and GBL to be amplified. Thirdly, φ$_{tGBL}$ is set to the "H" potential to permit data to be transmitted from the global bit line pair to the bit line pair and written into the nodes N$_1$ and N$_2$. At this time, like the former embodiment, the sense amplifier 3 is not operated in this embodiment and the power consumption can be reduced in comparison with the conventional DRAM.

Figure 19:
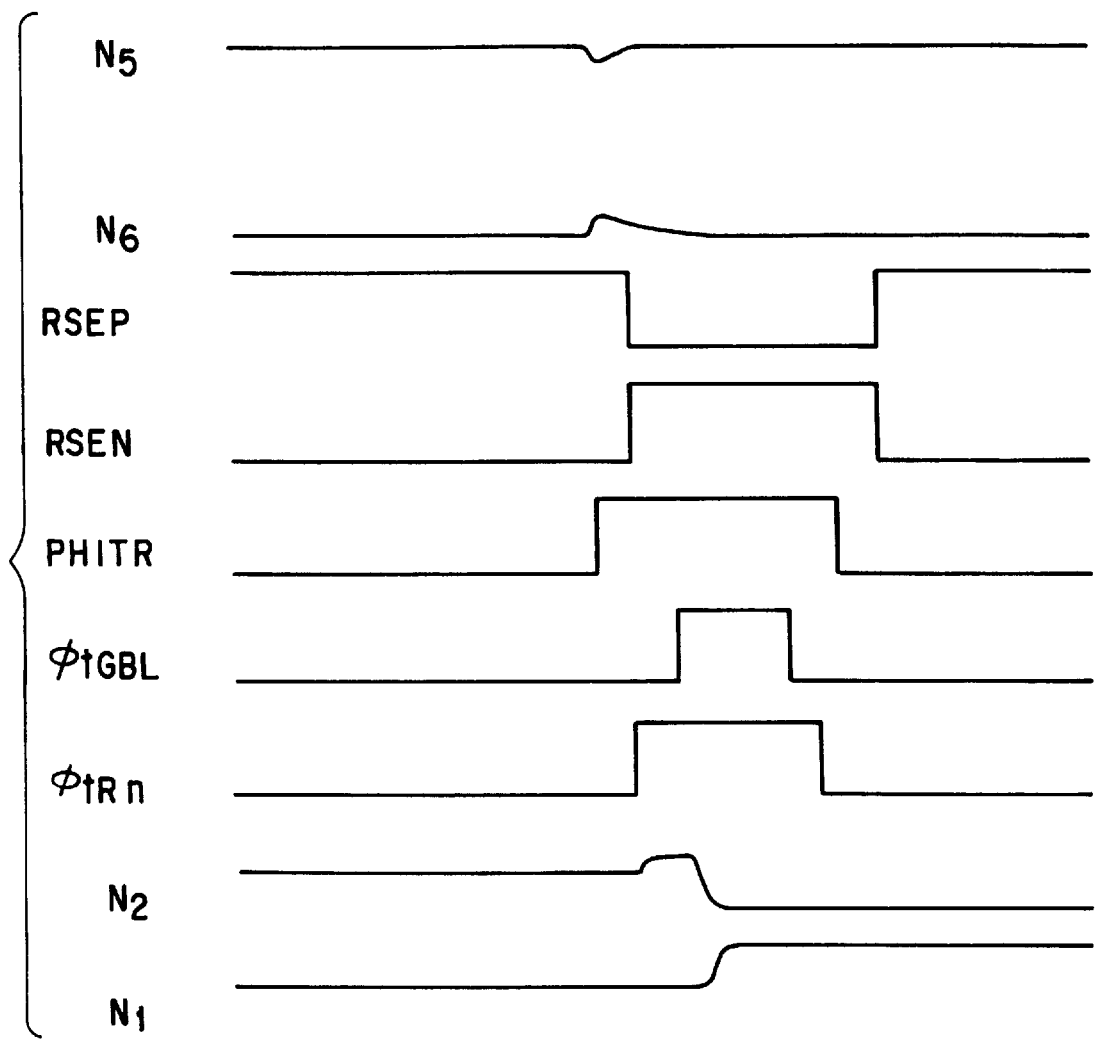
FIG. 19 is a diagram showing the operation waveforms obtained at respective nodes in the construction of FIGS. 15 and 16.

FIG. 19 shows the operation waveforms obtained at respective nodes in the construction of FIGS. 15 and 16. Unlike the construction of FIGS. 6 and 7, in this embodiment, RSEP and RSEN are respectively set to the "L" and "H" potentials so as to permit data from the I/O register to be amplified by a register sense amplifier -52. The other portion is the same as the corresponding portion of the construction of FIGS. 6 and 7. In this case, RGATE is applied with the "H" potential.

Figure 21:
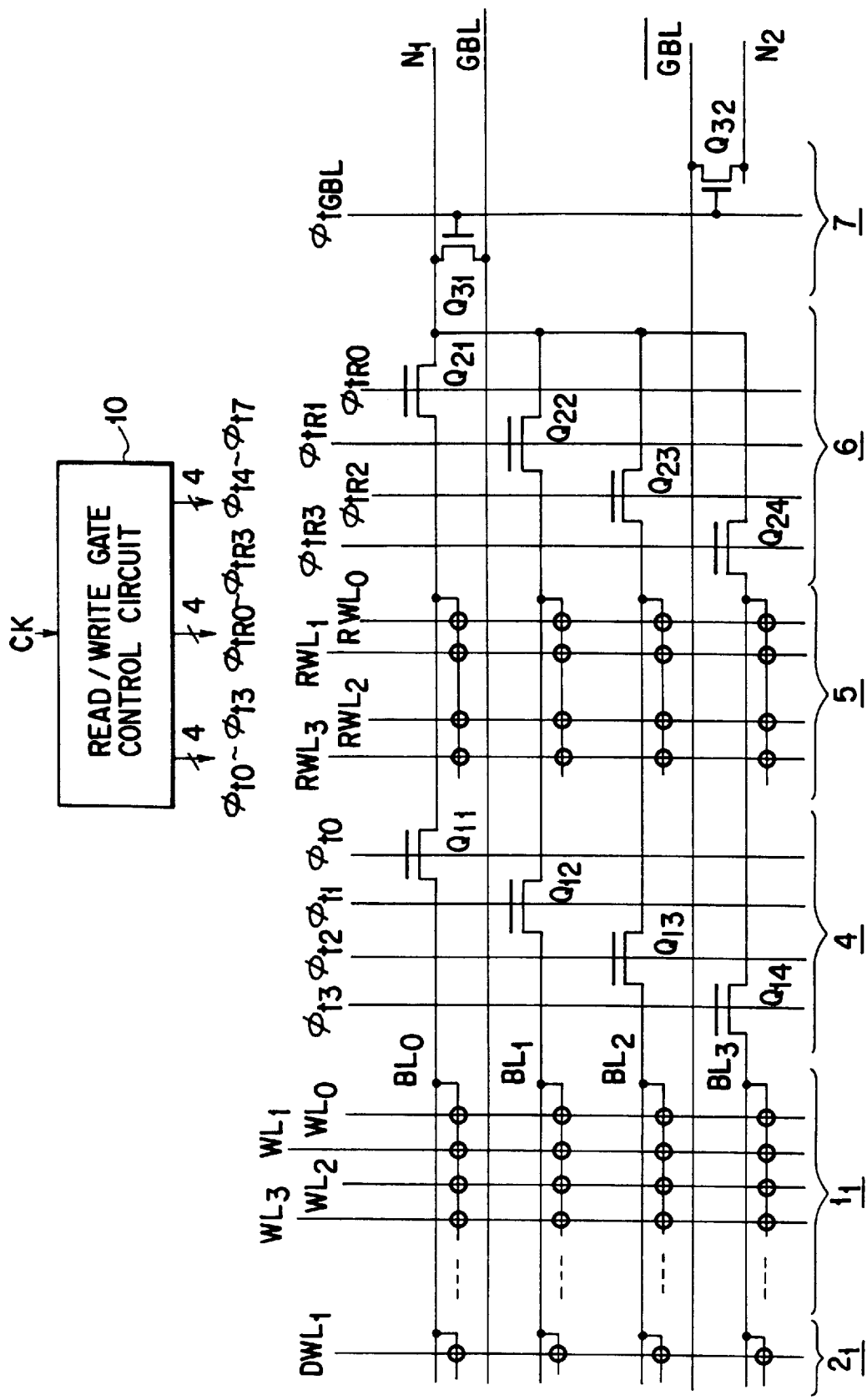
FIG. 21 is a diagram showing a second modification of FIG. 1.

FIG. 20 shows a first modification in which the construction of the register 5 in the embodiment of FIG. 1 is made by two series-connected memory cells instead of two parallel-connected memory cells. FIG. 21 shows a second modification in which the register 5 is constructed by four series-connected memory cells like the memory cell array.

In the above embodiment, the re-writing register is provided only on one side of the sense amplifier, that is, on the side of the bit line BL, but it is possible to symmetrically arrange re-writing registers on the sides of both of the bit lines BL and $\overline{BL}$. With this arrangement, data having an inverted relation with respect to data written into the register on the bit line BL side is written into the register on the bit line $\overline{BL}$ side. In this case, the potential of (½)Vcc can be created by equalizing the re-writing registers on the bit line BL side and on the bit line $\overline{BL}$ side in the precharge/equalize operation of the re-writing registers.

Figure 23:
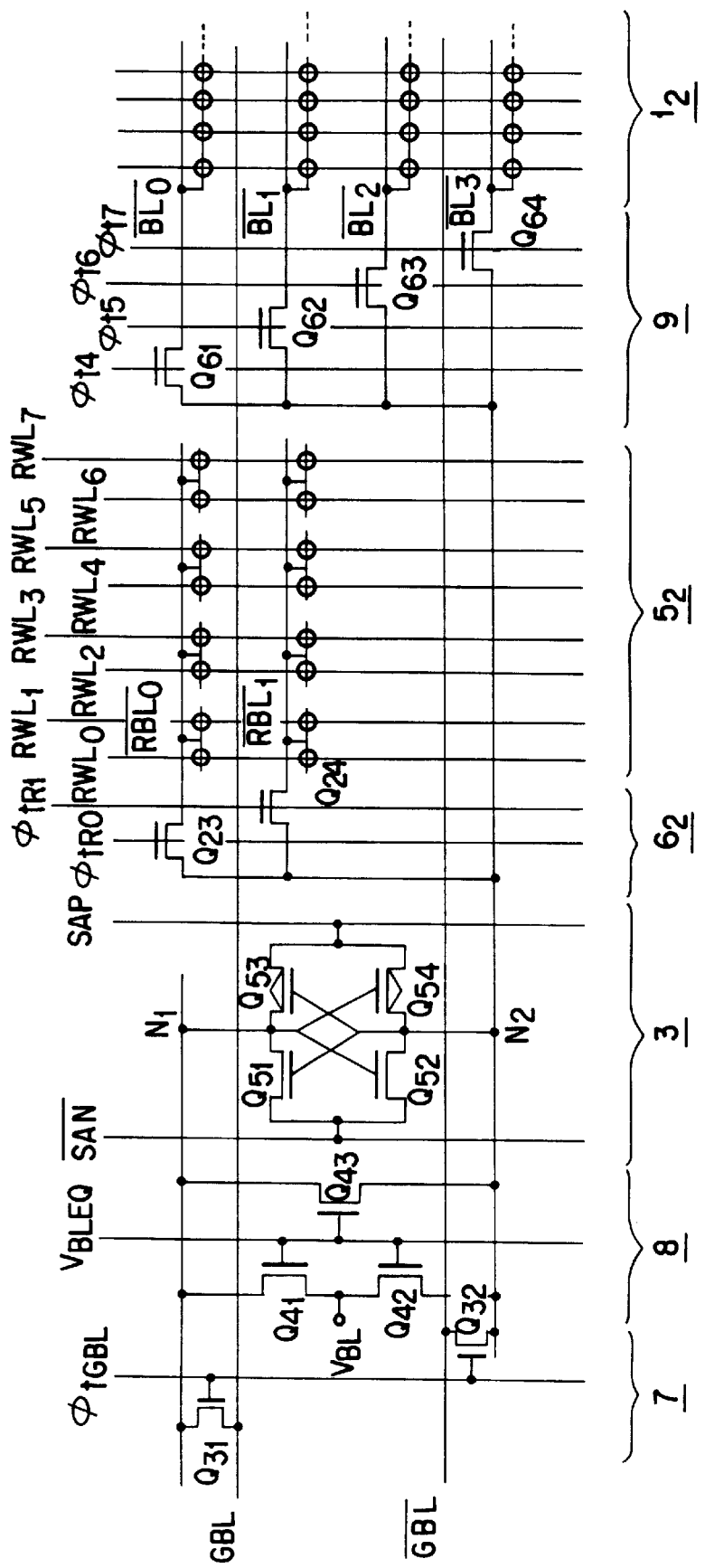

FIGS. 22 and 23 are diagrams showing the construction of a second embodiment of a DRAM according to this invention, that is, the construction of a DRAM of an embodiment in which registers are provided on both sides of the sense amplifier. Portions corresponding to those of the first embodiment in FIGS. 1 and 2 are denoted by the same reference numerals used in FIGS. 1 and 2. In this embodiment, the number of bit lines of a re-writing register section is 2 and re-writing registers 5$_1$ and 5$_2$ are symmetrically arranged on both sides of the sense amplifier 3. In FIG. 23, a dummy cell array on the side of the memory cell array 1$_2$ is omitted.

In the first embodiment, the register 5 is arranged only on one side of the sense amplifier 3 and data of each of the memory cell arrays 1$_1$ and 1$_2$ is written into the register 5. However, in this embodiment, data of the memory cell array 1$_1$ may be written into the register 5$_1$ and data of the memory cell array 12 be written into the register $5_2$. That is, data read out onto the bit lines $BL_0$ to $BL_3$ via the word line $WL_0$ of the memory cell array $1_1$ is written into four memory cells arranged along the register word lines $RWL_0$ and $RWL_1$ of the register $5_1$. Data read out onto the bit lines $BL_0$ to $BL_3$ via the word line $WL_1$ is written into four memory cells arranged along the register word lines $RWL_2$ and $RWL_3$ of the register $5_1$. Likewise, the register word lines $RWL_4$ and $RWL_5$ and the register word lines $RWL_6$ and $RWL_7$ are selected according to the word lines $WL_2$ and $WL_3$ used for data readout. The relation between the memory cell array $1_2$ and the register $5_2$ is the same as that between the memory cell array $1_1$ and the register $5_1$.

As an another method, a cell data may be stored to both side of the registers with a manner of complementary signals. That is, a datum is stored by using each one bit of both sides of the registers. In this arrangement, since capacities of signal nodes $N_1$ and $N_2$ of a sense amplifier and the register word lines $RBL_1$ and $\overline{RBL_1}$, stable operation can be attained.

In the case of this embodiment, the transfer gate control operation by the gate control circuit 10 is basically the same as in the former embodiment. That is, the control operation of setting the control signal lines $\phi_{t0}$ to $\phi_{t7}$, $\phi_{tR0}$ and $\phi_{tR1}$ to the low potential level when memory cell data is read out to the bit line, raising the potentials of the transfer gate control signal lines (one of $\phi_{t0}$ to $\phi_{t3}$ and one of $\phi_{t4}$ to $\phi_{t7}$) of the bit line pair for readout and lowering the potentials of the transfer gate control signal lines of: the bit line pair for readout before the sense amplifier 3 is operated and the control operation of raising the potential of the control signal line (one of $\phi_{tR0}$ and $\phi_{tR1}$) of the register for write-in after the sense amplifier 3 is operated and a potential difference between the paired bit lines BL and /BL becomes sufficiently large and lowering the same after data is written into the memory cell of the register are effected.

Figure 24:
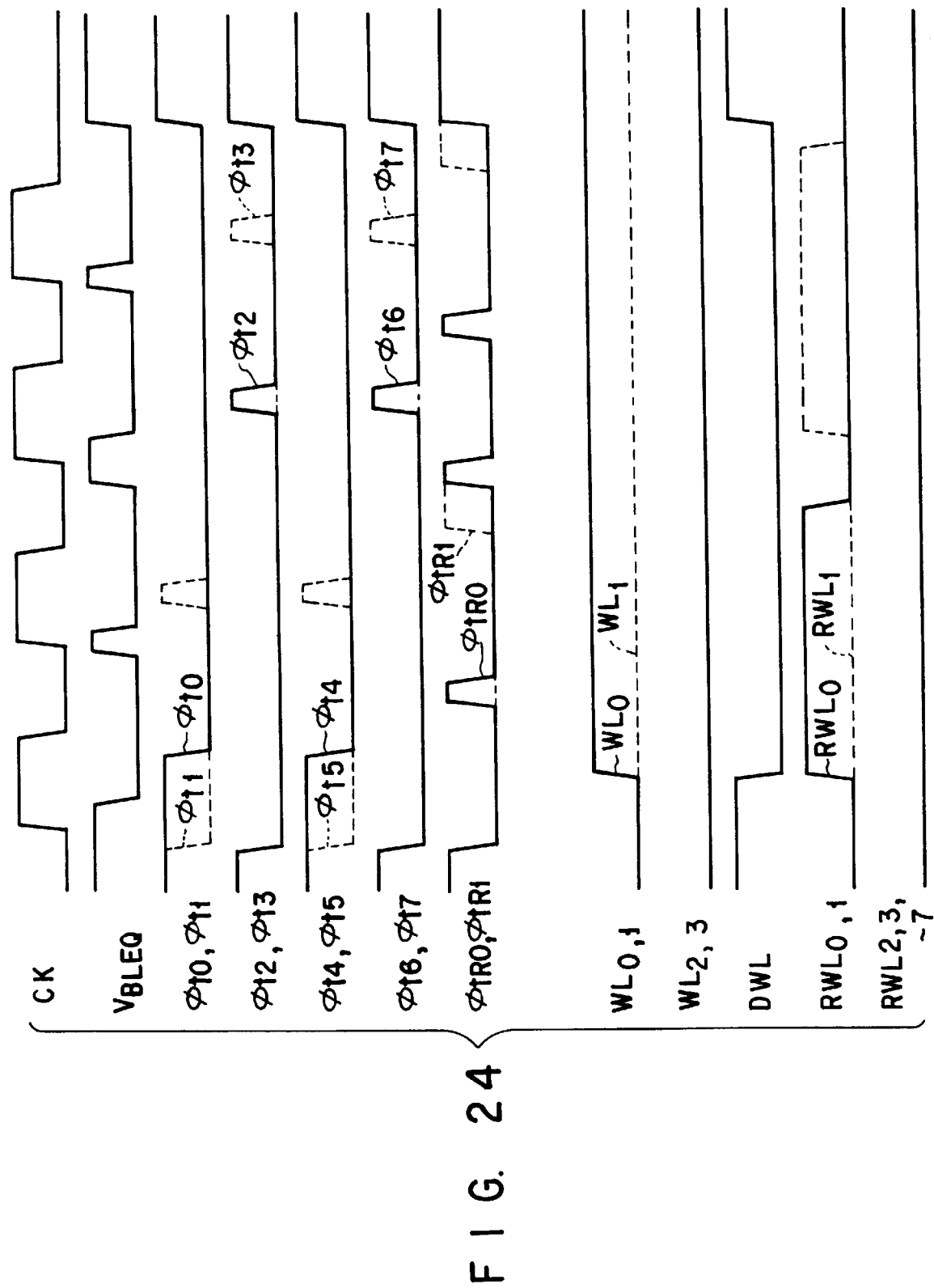

FIGS. 24 and 25 show an example of operation waveforms of the second embodiment. Also, in this embodiment, an example in which the first one-bit data of four memory cells series-connected in the same manner as in the first embodiment is read out is explained, but the other bit can be read out by changing the address.

Figure 26:
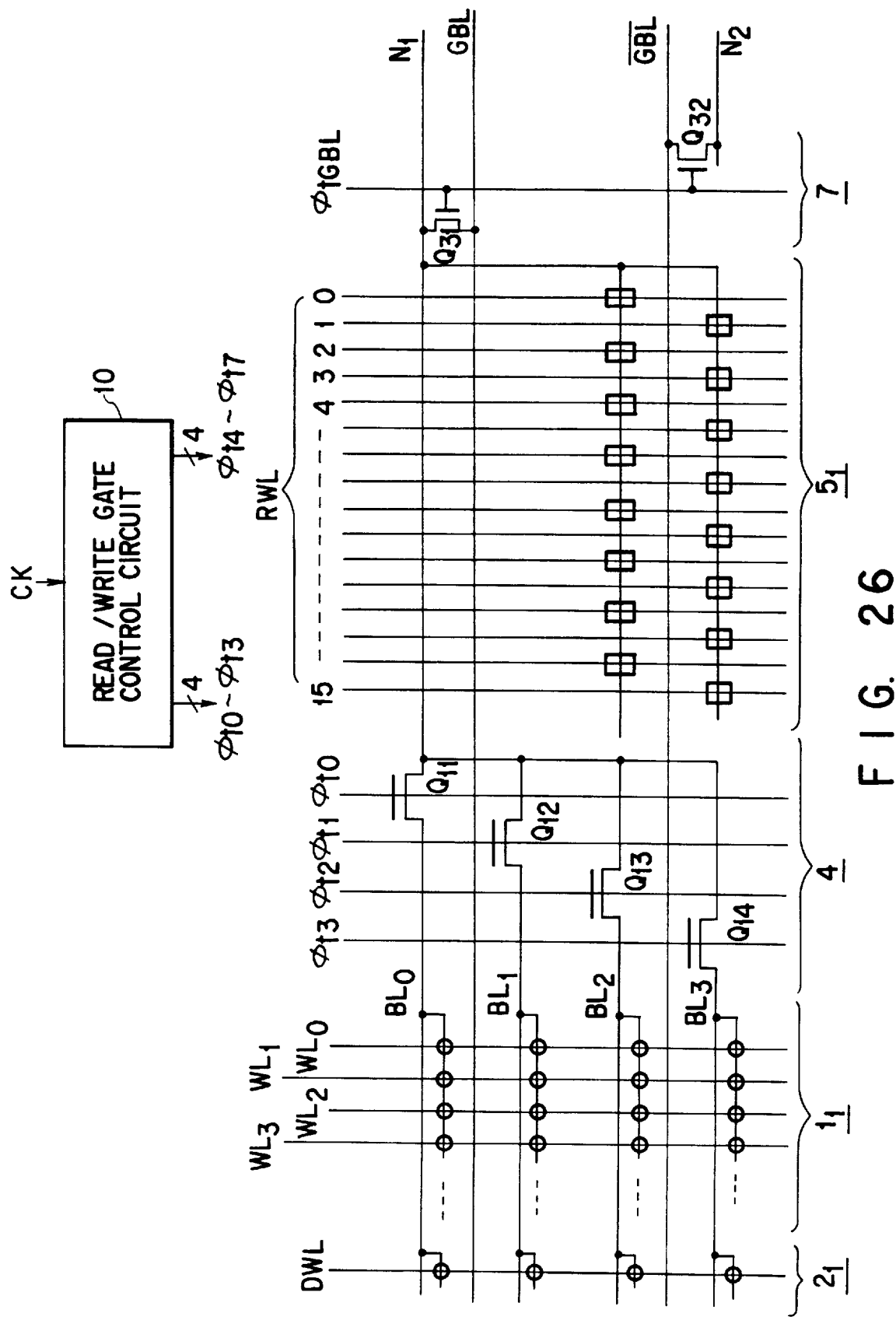

FIGS. 26 and 27 are diagrams showing the construction of a DRAM of a first modification of the second embodiment in which the registers are provided on both sides of the sense amplifier. In this modification, the transfer gates arranged between the register 51 and 52 on one hand and the nodes $N_1$ and $N_2$ of the sense amplifier 3 on the other in FIGS. 22 and 23 are removed.

Figure 29:
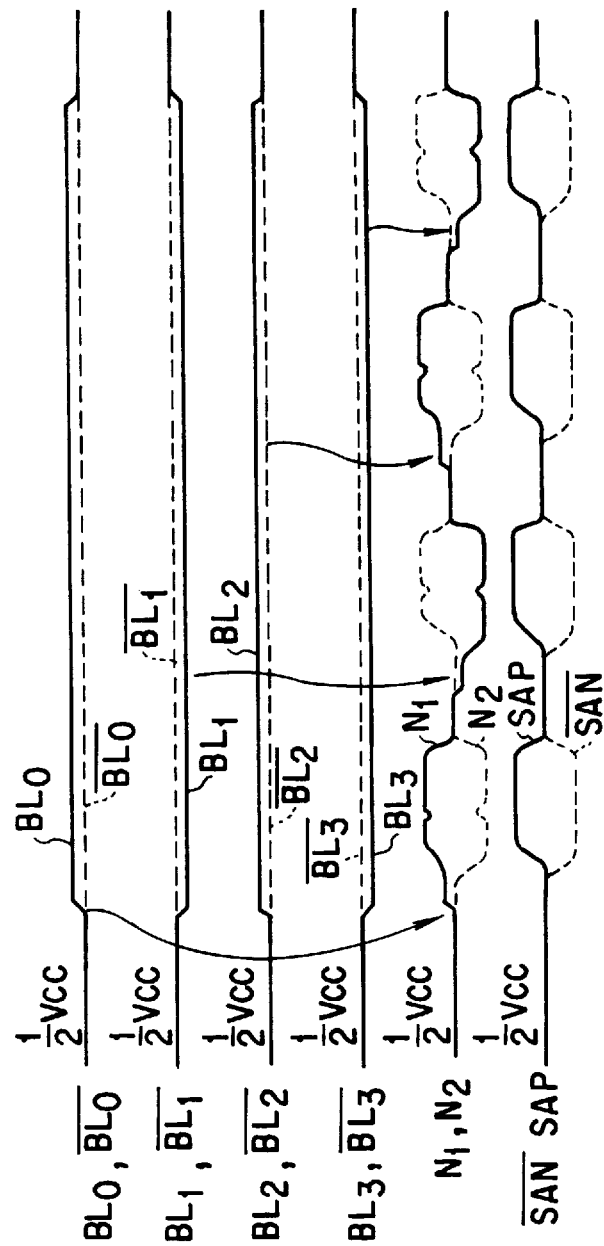

Memory cell data items selected by the word line $WL_0$ and read out to the bit lines $BL_0$ to $BL_3$ are sequentially re-written into memory cells in the register 51 by use of the register word lines $RWL_{15}$, $RWL_{14}$, $RWL_{13}$ and $RWL_{12}$. The operation waveforms of this modification are shown in FIGS. 28 and 29. The transfer gate control operation by the gate control circuit 10 is effected in basically the same manner as in the second embodiment, and when data is written into the register, the bit lines and global bit lines are electrically separated from the data nodes of the sense amplifier.

FIGS. 30A and 30B show examples of the construction of the memory cell of the register used in the first modification of the first embodiment. The memory cell of the register may be a charge storage type memory cell having the same construction as the memory cell in the memory cell array as shown in FIG. 30A or as a memory cell constructed by three transistors as shown in FIG. 30B. Further, an SRAM cell can be used as the memory cell of the register. When the SRAM cell is used as the memory cell of the register, a stable write-in operation can be attained if the write-in circuit is constructed to write data items which are set in the inverted relation from both of the bit lines BL and $\overline{BL}$ into the nodes D and $\overline{D}$ of the DRAM cell.

Figure 33:
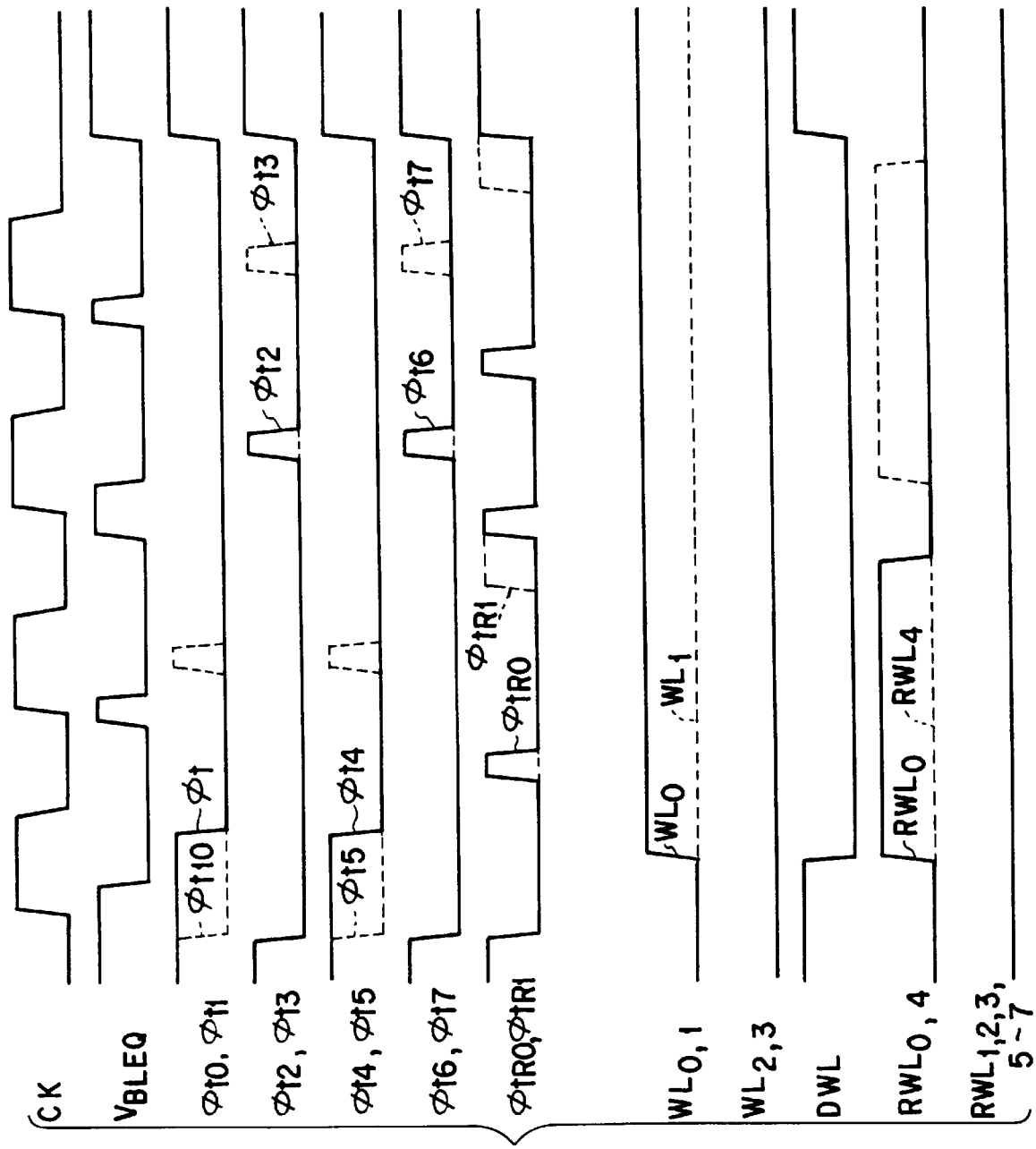

FIGS. 31 and 32 are diagrams showing the construction of a DRAM of a second modification of the second embodiment in which the registers are provided on both sides of the sense amplifier. In this modification, the capacity of the registers $5_1$ and $5_2$ is set to half of the capacity in the embodiment of FIGS. 22 and 23. In the case of this modification, data items of the bit lines $BL_0$ and $BL_1$ among the data items read out to the bit lines $BL_0$ to $BL_3$ by means of the word line $WL_0$ are written into memory cells arranged along the register word line $RWL_0$ of the register $5_1$ arranged on the same side and data items of the bit lines $BL_3$ and $BL_4$ are written into memory cells arranged along the register word line $RWL_4$ of the register $5_2$ arranged on the opposite side. The waveforms obtained in this case are shown in FIGS. 33 and 34. Also, in this modification, the basic transfer gate control operation effected by the gate control circuit 10 is the same as in the case shown in FIGS. 22 and 23, and when data is written into the register 5, the bit lines and global bit lines are electrically separated from the sense amplifier nodes.

With the construction in which the bit lines BL and $\overline{BL}$ are connected to bit lines in the re-writing register having the same capacity as in this modification, the (½)Vcc precharge operation after data is written into the re-writing register can be easily attained by directly connecting the bit lines $RBL_0$ and $RBL_1$ in the register to the respective bit lines $\overline{RBL_0}$ and $\overline{RBL_1}$.

Figure 35:
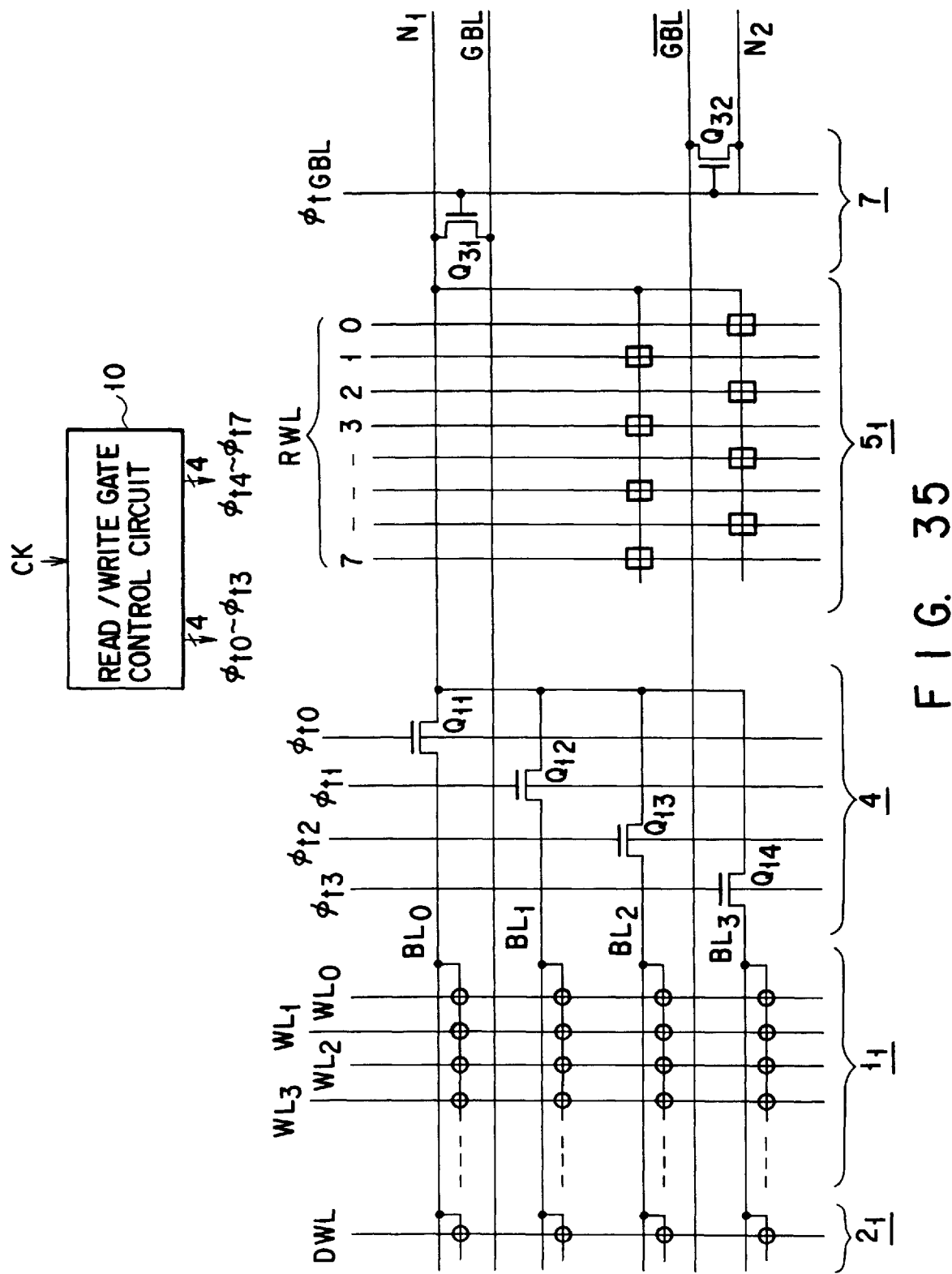
FIGS. 35 and 36 are diagrams showing the construction of a DRAM of a third modification of the second embodiment in which the registers are provided on both sides of the sense amplifier.
Figure 36:
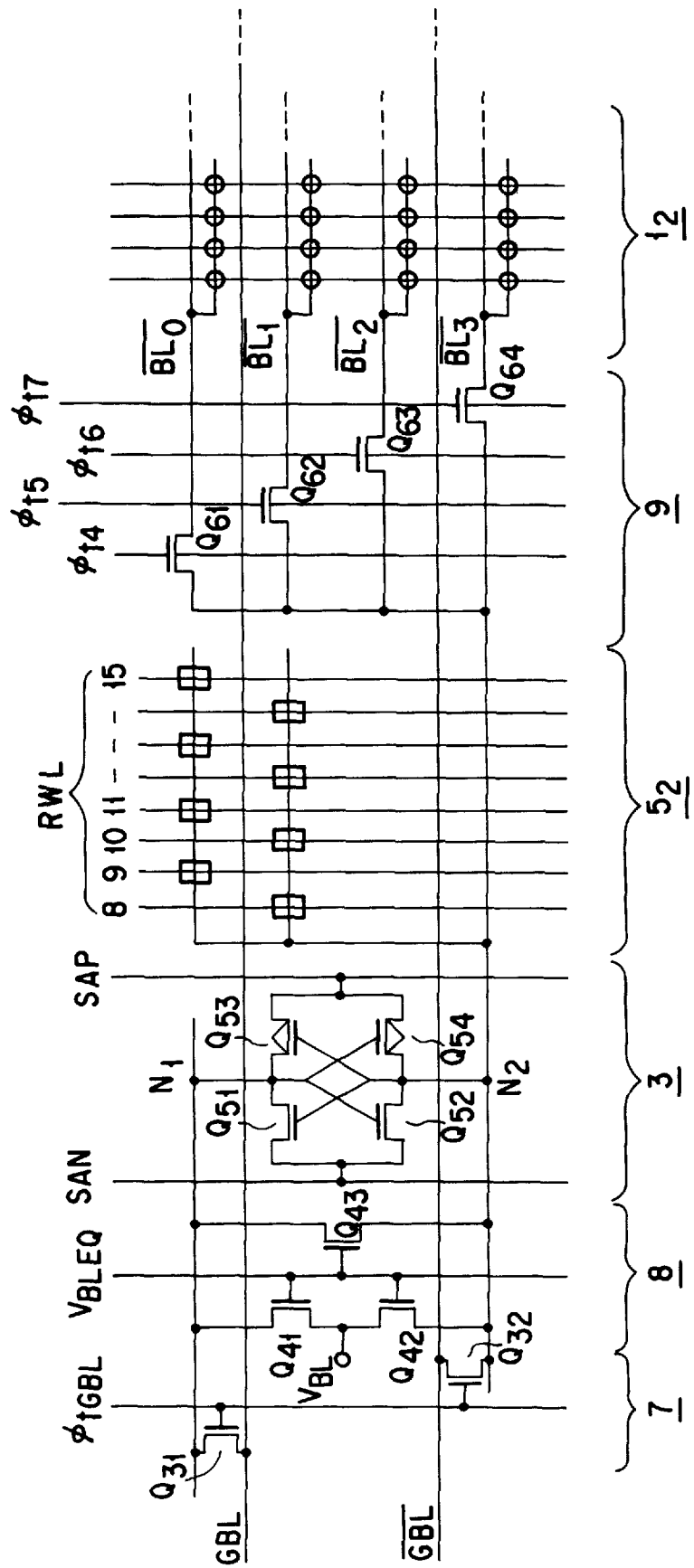
Figure 37:
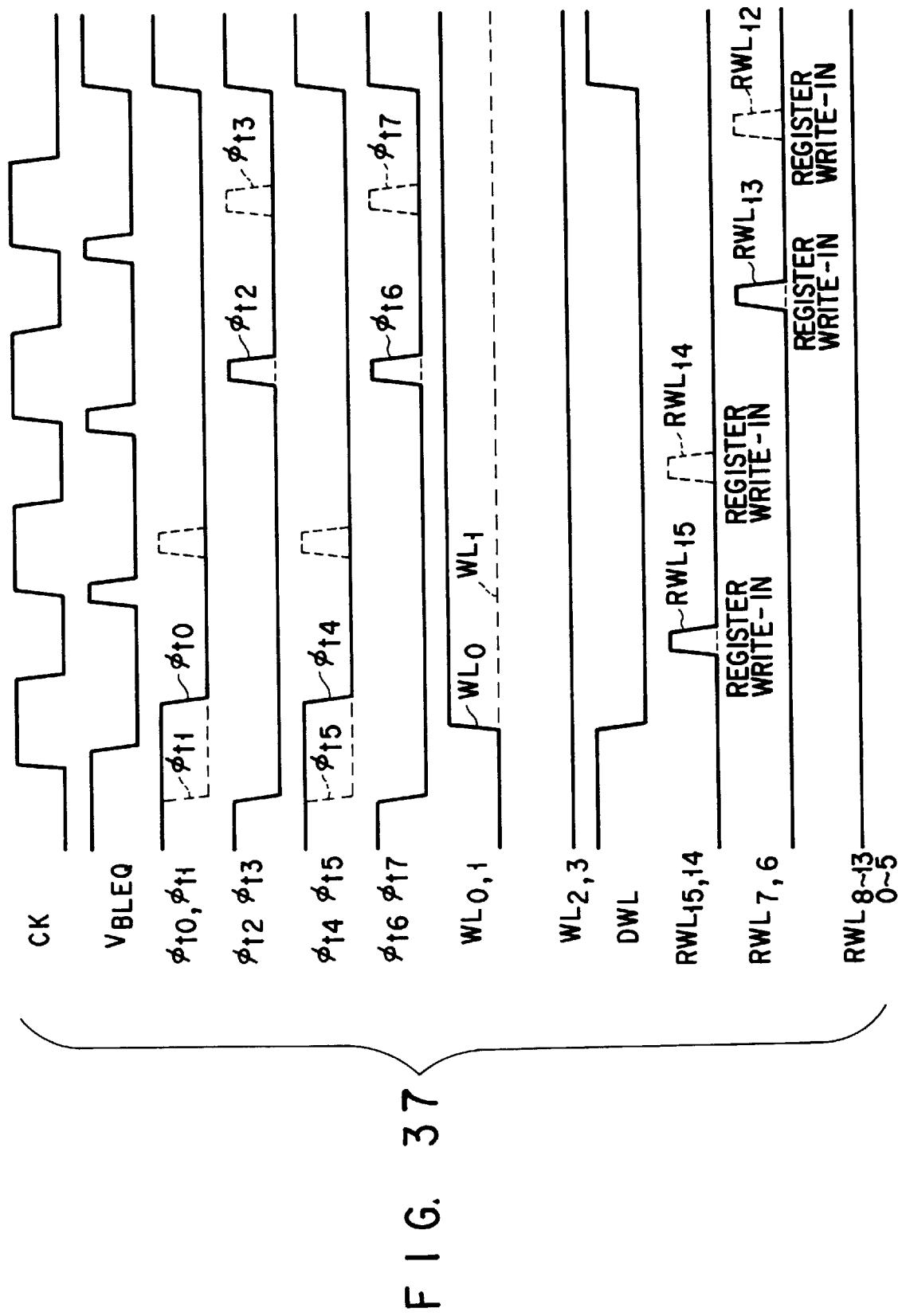
FIGS. 37 and 38 are timing diagrams for illustrating the data readout operation of the third modification of the second embodiment.
Figure 38:
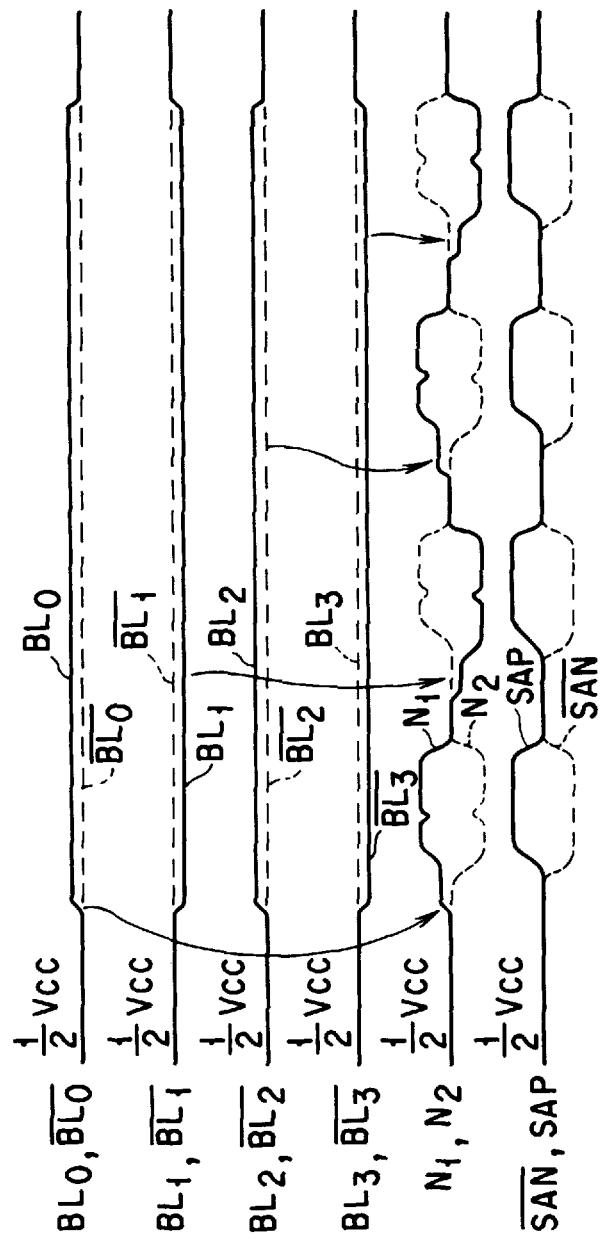

FIGS. 35 and 36 are diagrams showing the construction of a DRAM of a third modification of the second embodiment in which the registers are provided on both sides of the sense amplifier and shows an embodiment in which the capacity of the registers $5_1$ and $5_2$ is set to half of the original capacity. In the case of this modification, data items of the bit lines $BL_0$ and $BL_1$ among the data items read out to the bit lines $BL_0$ to $BL_3$ by means of the word line $WL_0$ are written into memory cells arranged along the register word lines $RWL_{15}$ and $RWL_{14}$ of the register $5_2$ arranged on the opposite side and data items of the bit lines $BL_3$ and $BL_4$ are written into memory cells arranged along the register word lines $RWL_7$ and $RWL_8$ of the register $5_1$ arranged on the same side. The operation waveforms obtained at this time are shown in FIGS. 37 and 38. Also, in this modification, the transfer gate control operation by the gate control circuit 10 is effected in the same manner as in the case shown in FIGS. 22 and 23, and the bit lines and the global bit lines are electrically separated from the sense amplifier nodes at the time of writing data into the register 5.

Figure 39:
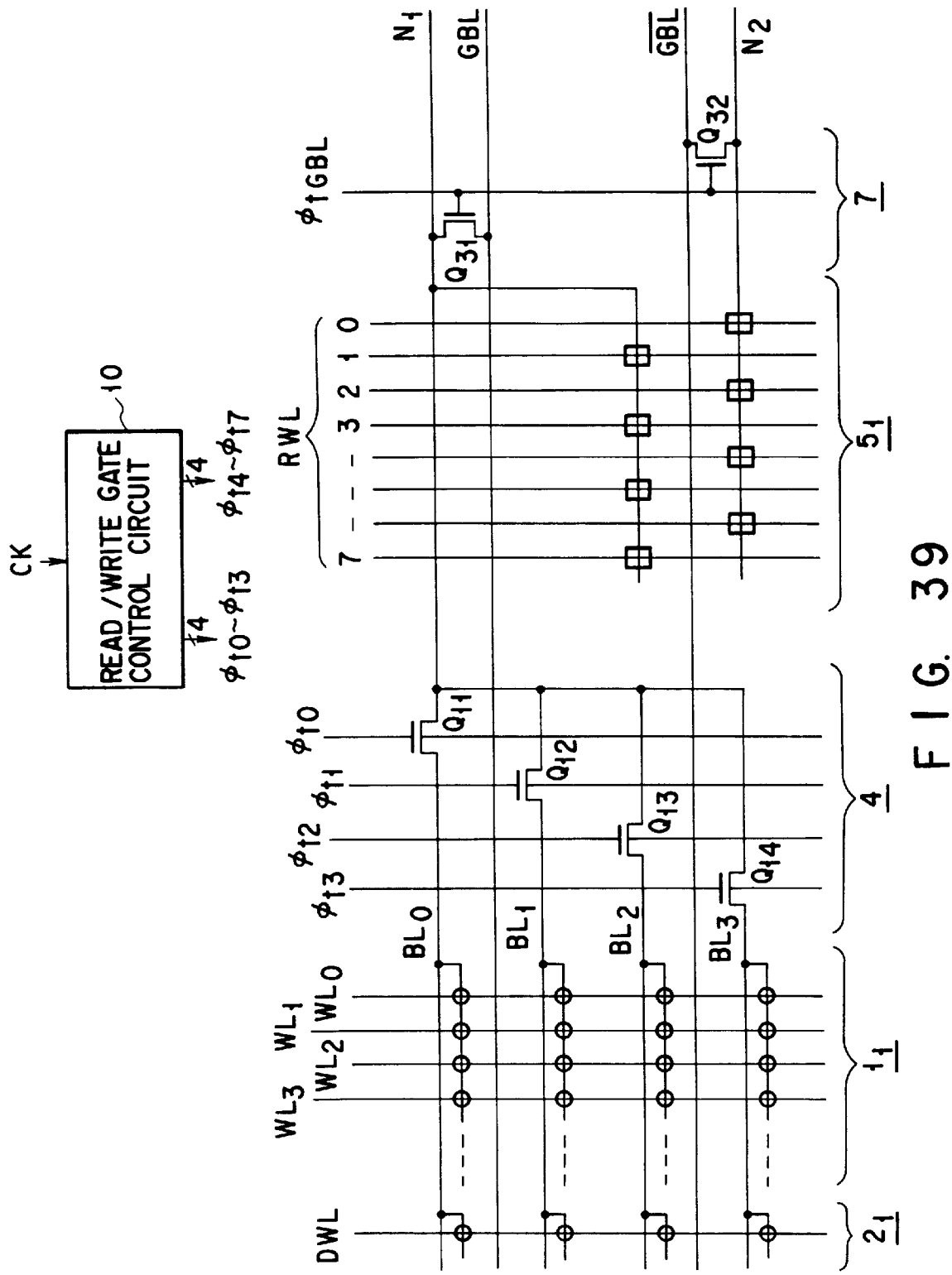

FIGS. 39 and 40 are diagrams showing the construction of a DRAM of a fourth modification of the second embodiment in which the registers are provided on both sides of the sense amplifier. In the third modification shown in FIGS. 35 and 36, the data nodes of the registers $5_1$ and $5_2$ are commonly connected to the respective nodes $N_1$ and $N_2$ of the sense amplifier 3, but in this modification, two data nodes of the register $5_1$ are respectively connected to the two nodes $N_1$ and $N_2$ of the sense amplifier 3 and two data nodes of the register $5_2$ are respectively connected to the two nodes $N_1$ and $N_2$ of the sense amplifier 3.

Also, in this modification, the control operation of separately writing data items read out to the bit lines $BL_0$ to $BL_3$ by means of the word line $WL_0$, for example, into the register 51 arranged on the same side and into the register $5_2$ arranged on the opposite side. In this case, noises induced on the nodes $N_1$ and $N_2$ via the nodes of the register can be canceled.

Figure 42:
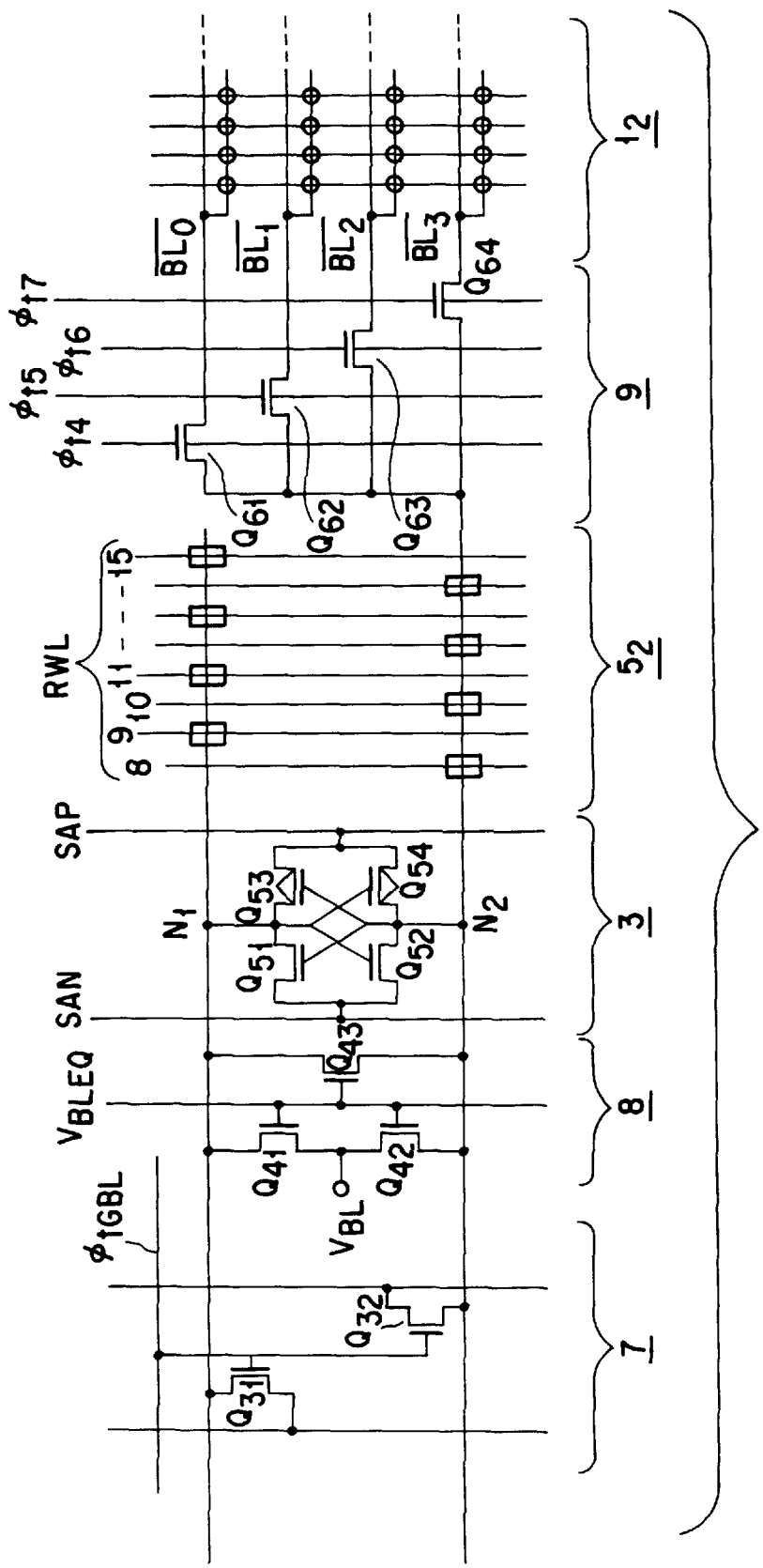

FIGS. 41 and 42 are diagrams showing the construction of a DRAM of a fifth modification of the second embodiment in which the registers are provided on both sides of the sense amplifier. FIG. 43 is a diagram showing an example of the construction of an I/O register for outputting data at a high speed in the construction of FIGS. 41 and 42. As the cell array, sense amplifier and re-writing register, the circuits shown in FIGS. 1, 2, 20, 21, 22, 23, 26, 27, 31, 32, 35, 36, 39 and 40 may be used, or the circuit of FIG. 41 may be used.

As shown in FIG. 43, I/O registers 60 are each provided to process data items serially read out by one address from one sense amplifier (in this embodiment, 4 WL×4 BL=16 bits) as one unit.

Since the I/O register 60 in this embodiment is not used as a re-writing register, it is possible to provide the I/O register 60 commonly for a plurality of sense amplifiers 3 as shown in FIG. 44 and selectively output only data items of the sense amplifiers which are part of data items read out to the plurality of sense amplifiers 3. In this case, an increase in the area of the I/O register can be suppressed. Thus, in a case where the I/O register 60 is provided with data items serially read out from one sense amplifier 3 set as one unit, 16-bit data can be read out at random and at a high speed after the 16-bit data is set into the I/O register 60. Further, a large amount of data can be output at a high speed by outputting data items of a plurality of 16-bit I/O registers 60 while interleaving the data items for each bit.

The embodiment of FIG. 43 shows a case wherein the plurality of 16-bit I/O registers 60 are divided into two DQ line groups and separately connected to I/O buffers and data items are output while interleaving the data items between the DQ lines.

FIG. 44 shows an example of construction of an I/O register.

Figure 46:
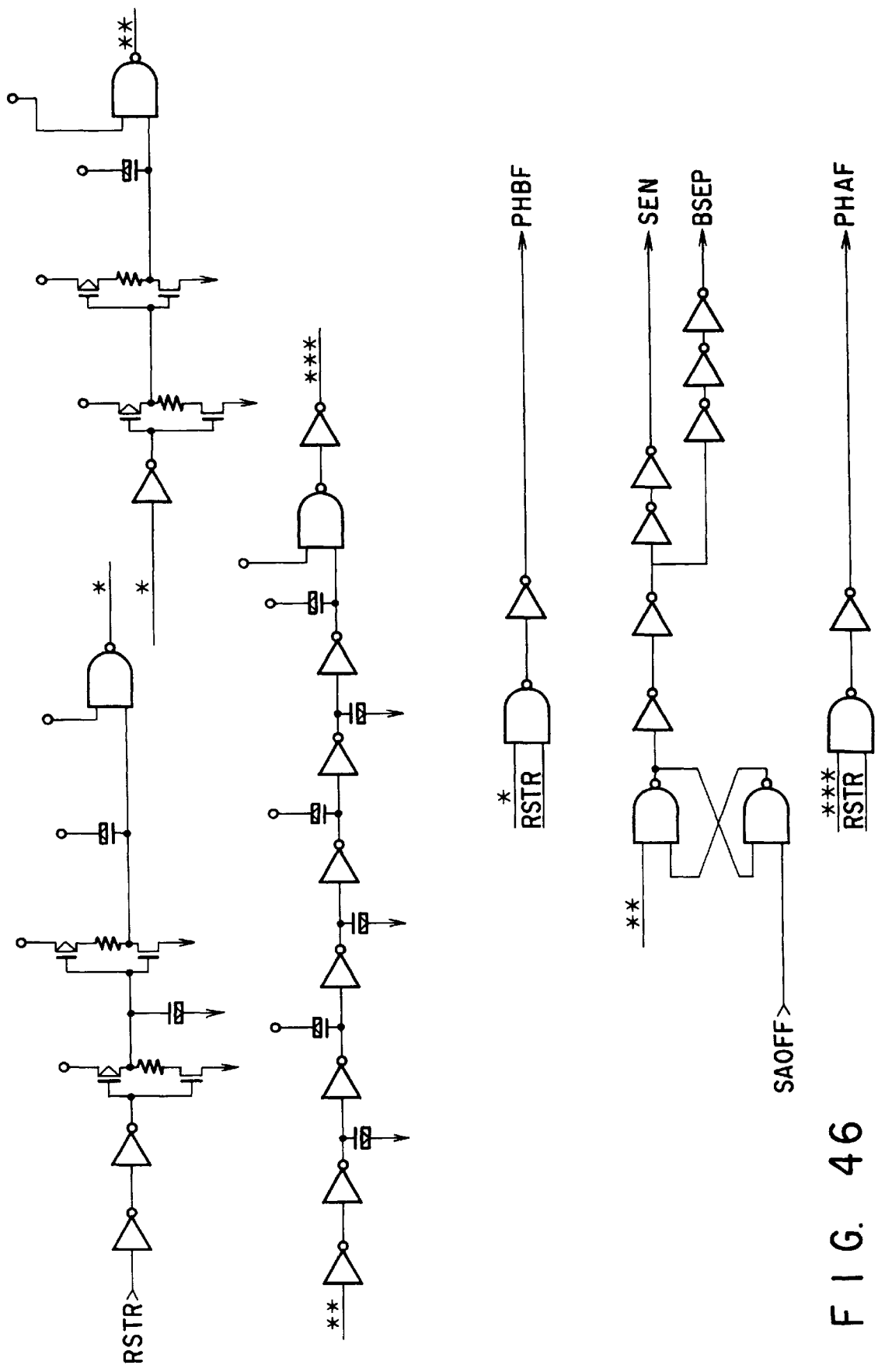
Figure 48:
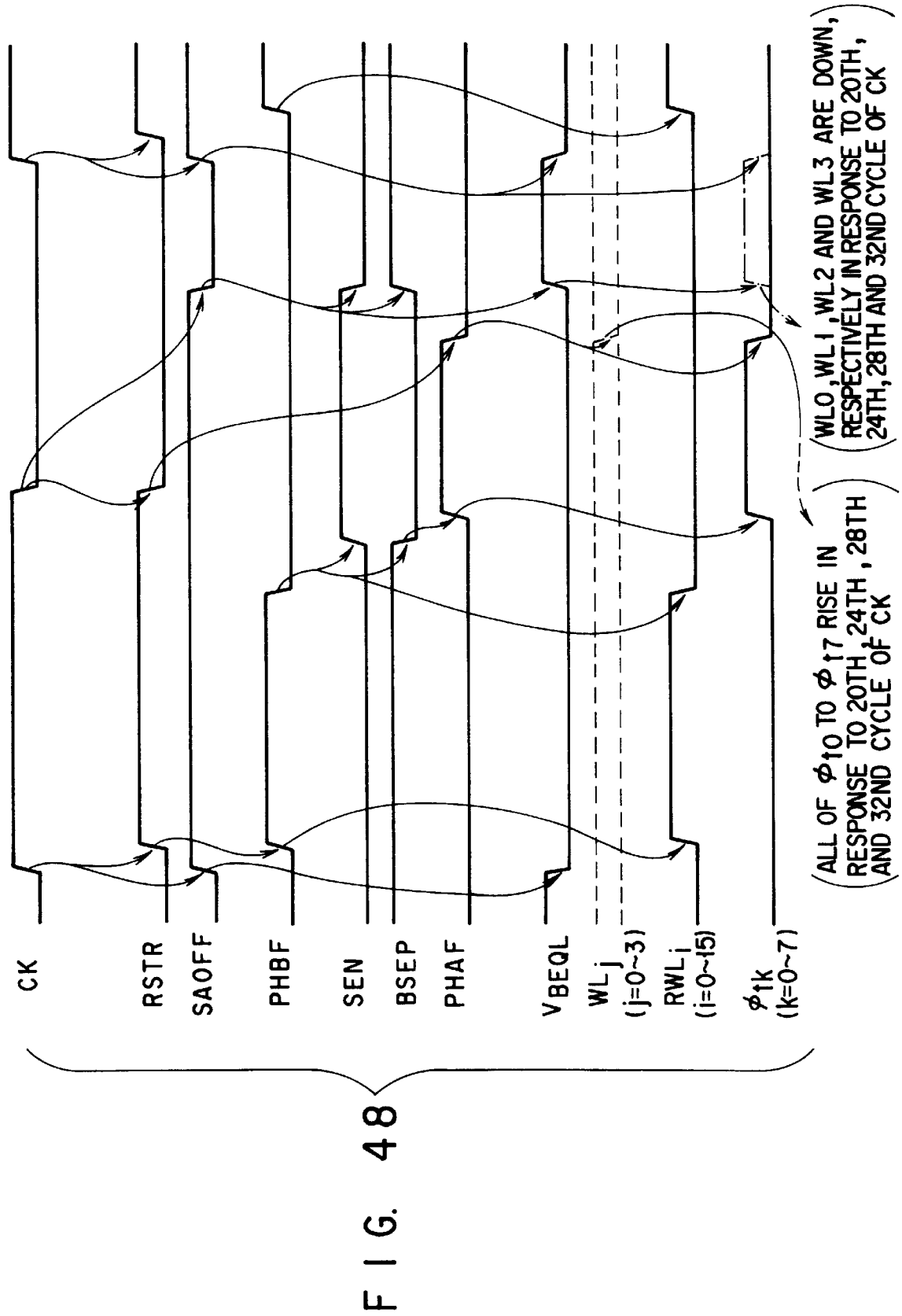
FIG. 48 is a timing diagram for illustrating the re-writing operation in the circuit of FIGS. 45 and 46.

FIGS. 45 and 46 are circuit diagrams of the read/write gate control circuit shown in FIG. 41. FIGS. 47 and 48 are timing diagrams showing the readout and re-write timings. FIG. 47 shows basic timings of various signals in the readout operation and FIG. 48 shows basic timings of various signals in the re-writing operation. The timings are determined based on the basic clock CK for reading one bit. Further, the order of reading 16 bits may be determined by counting CK and decoding to-be-selected word lines (WLi), $\phi_{tk}$ and RWLi according to the counting state as shown in FIG. 49. FIG. 50 shows the writing order in the same manner as shown in FIG. 49. 16-bit data can be read out by use of a combination of timing signals of one cycle shown in FIGS. 47 and 48 and the orders shown in FIGS. 49 and 50.

In the read/write gate control circuits 10 shown in FIGS. 1, 20, 21, 22, 26, 31, 35 and 39, the control terminals thereof are slightly different from one another, the operation thereof can be effected according to the procedure shown in FIGS. 47, 48, 49 and 50.

Figure 52:
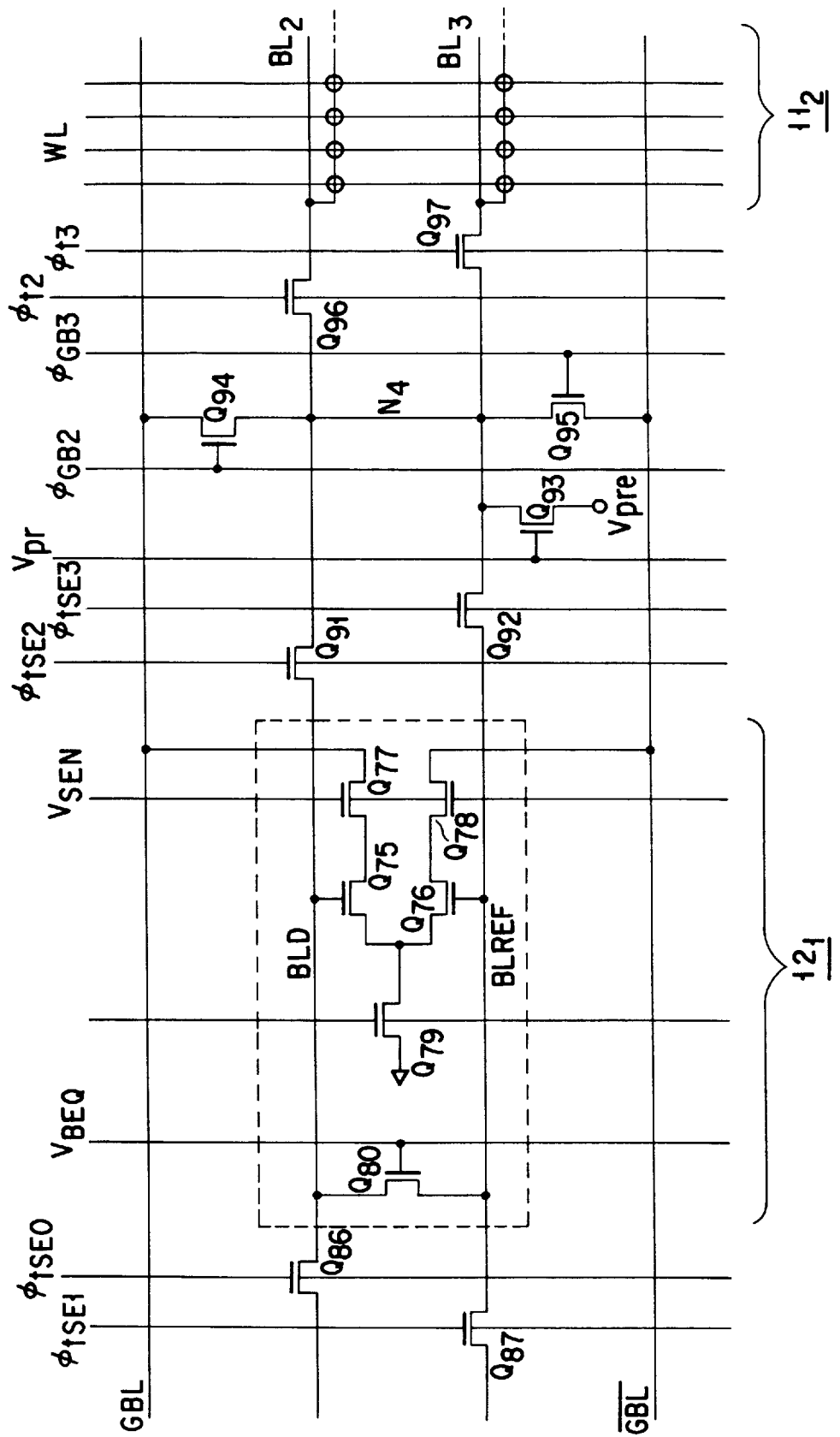

FIGS. 51 and 52 are diagrams showing the construction of a third embodiment of a DRAM according to this invention, that is, the construction of a DRAM of an embodiment in which a differential sense amplifier or a single ended type sense amplifier which requires no dummy cell is used.

Memory cell arrays $11_1$ and $11_2$ are arranged on both sides of a driver section $12_1$ of the sense amplifier. Like the case of the first and second embodiments, each of the memory cell arrays $11_1$ and $11_2$ includes a plurality of memory cell units which are each constructed by four series-connected memory cells. In the memory cell array $11_1$, two bit lines $BL_0$ and $BL_1$ are arranged, and in the memory cell array $11_2$, two bit lines $BL_2$ and $BL_3$ are arranged. One-side ends of the two bit lines $BL_0$ and $BL_1$ of the memory cell array $11_1$ are connected to a common node $N_3$ via transfer gates $Q_{81}$ and $Q_{82}$ which are each formed of an nMOS transistor and the common node $N_3$ is connected to paired global bit lines GBL and $\overline{GBL}$ which are arranged to extend across a plurality of memory cell arrays via transfer gates $Q_{83}$ and $Q_{84}$ which are each formed of an nMOS transistor. Further, a precharge nMOS transistor $Q_{85}$ is connected to the common node $N_3$.

The common node $N_3$ is connected to first and second input nodes BLD and BLREF of the sense amplifier driving section $12_1$ via transfer gates $Q_{86}$ and $Q_{87}$ which are each formed of an nMOS transistor.

Likewise, in the memory cell array $11_2$, one-side ends of the two bit lines $BL_2$ and $BL_3$ are connected to a common node $N_4$ via transfer gates $Q_{96}$ and $Q_{97}$ which are each formed of an nMOS transistor and the common node $N_4$ is connected to the paired global bit lines GBL and $\overline{GBL}$ via transfer gates $Q_{94}$ and $Q_{95}$ which are each formed of an nMOS transistor. Further, a precharge nMOS transistor $Q_{95}$ is connected to the common node $N_4$. The common node $N_4$ is also connected to the first and second input nodes BLD and BLREF of the sense amplifier driving section $12_1$ via transfer gates $Q_{91}$ and $Q_{92}$ which are each formed of an nMOS transistor.

The sense amplifier driving section $12_1$ includes differential type nMOS driver transistors $Q_{75}$ and $Q_{76}$, an nMOS transistor $Q_{79}$ for selectively connecting the common source thereof to the ground terminal, and nMOS transistors $Q_{77}$ and $Q_{78}$ for connecting the output node thereof to the global bit lines GBL and $\overline{GBL}$. Further, the sense amplifier driving section $12_1$ includes an equalizing transfer gate $Q_{80}$ which is formed of an nMOS transistor for selectively connecting two input nodes to each other.

A sense amplifier load section $12_2$ which is arranged on the opposite side of the sense amplifier driving section $12_1$ with respect to the memory cell array $11_1$ is an active load having pMOS transistors $Q_{71}$ and $Q_{72}$ connected to constitute a current mirror circuit. The load section $12_2$ includes nMOS transistors $Q_{73}$ and $Q_{74}$ for connecting the load section $12_2$ to the driving section $12_1$ via the global bit lines GBL and $\overline{GBL}$. An equalizing nMOS transistor $Q_{70}$ is connected between the paired global bit lines GBL and $\overline{GBL}$.

A re-writing register 13 for temporarily storing data read out from the memory cell array $11_1$ or $11_2$ is connected to the ends of the paired global bit lines GBL and $\overline{GBL}$.

Although not shown in the drawing, like the first and second embodiments, a gate control means for activating or de-activating control signal lines connected to the respective transfer gates at preset timings is provided. In the data readout mode, the gate control means effects the control operation of applying a reference potential created immediately before the data readout to the input node BLREF of the differential sense amplifier and applying a data signal to the other input node BLD so that a so-called single-ended sense amplifier system can be attained.

The concrete data readout operation of the DRAM of this embodiment is explained with reference to FIGS. 53 and 54. In this case, the timings of the readout operation for memory cells $M_0$ to $M_7$ in the two memory cell units of the memory cell array $11_1$ which are selected by the word lines $WL_0$ to $WL_3$ are shown. FIG. 53 shows the readout operation for the memory cells $M_0$ to $M_3$ which are the first half of the above memory cells and FIG. 54 shows the readout operation for the memory cells $M_4$ to $M_7$ which are the latter half of the above memory cells.

In the initial state, an equalizing signal line $V_{GBLEQ}$ for the global bit lines is set to the "H" level to turn on the transistor $Q_{70}$ and the global bit lines GBL and $\overline{GBL}$ are equalized. At the same time, the transfer gate control signal lines $\phi_{tse0}$, $\phi_{tse1}$, $\phi_{t0}$, $\phi_{t1}$, bit precharge signal line Vpr and bit equalizing signal line $V_{BLEQ}$ are set to the "H" level to equalize the bit lines BLD and BLREF and the two nodes BLD and BLREF of the sense amplifier. Then, the first data readout state is set.

First, the equalizing signal line $V_{BEQ}$ is set to the "L" level, and after the nMOS transistor $Q_{80}$ of the sense amplifier driving section $12_1$ is turned off, the control signal line $\phi_{tsel}$ is set to the "L" level to turn off the transfer gate $Q_{87}$ and then the control signal line $\phi_{t1}$ is set to the "L" level to turn off the transfer gate $Q_{82}$ so that the bit line BL will be electrically separated from the sense amplifier section. Next, the precharging nMOS transistor $Q_{85}$ is turned off to release the precharging state. As a result, the nodes BLD and BLREF of the sense amplifier are set into the electrically floating state while being kept at the reference potential.

After this, the first word line $WL_0$ is selected and data of the memory cell M1 is read out to the node $N_3$ via the bit line $BL_0$. The data read out to the node $N_3$ is transferred to the node BLD since the nMOS transistor $Q_{86}$ is set in the conductive state.

Next, after the control signal line $\phi_{tse0}$ is set to the "L" level to turn off the transfer gate $Q_{86}$, the equalizing signal line $V_{GBLEQ}$ is set to the "L" level to turn off the nMOS transistor $Q_{70}$ so as to release the equalized state of the global bit lines. Then, the sense amplifier activating signal line $V_{SEN}$ is set to the "H" level to turn on the nMOS transistors $Q_{77}$ and $Q_{78}$ so that the sense amplifier will be operated and readout data can be written into the register 13 via the global bit lines.

Next, the operation of reading out data of the memory cell $M_2$ connected to the second bit line $BL_1$ and selected by the same word line $WL_0$ is effected.

At this time, since the word line $WL_0$ is already selected, it is not necessary to newly effect the word line selecting operation. First, the bit line equalizing signal line $V_{BLEQ}$ and precharge signal line Vpr are set to the "H" level to turn on the nMOS transistors $Q_{80}$ and $Q_{85}$. When the control signal lines $\phi_{tse0}$ and $\phi_{tse1}$ are set to the "H" level to turn on the transfer gates $Q_{86}$ and $Q_{87}$, the nodes BLD and BLREF of the sense amplifier are equalized. After this, the control signal line $V_{BLEQ}$ is set to the "L" level to release the equalized state, the control signal line $\phi_{tse1}$ is set to the "L" level and $\phi_{t0}$ is set to the "L" level so as to sequentially turn off the transfer gates $Q_{87}$ and $Q_{81}$ Next, Vpr is set to the "L" level to turn off the transistor $Q_{85}$. Then, the control signal line $\phi_{t1}$ is set to the "H" level and data read out from the memory cell $M_1$ to the bit line $BL_1$ is transferred to the node BLD of the sense amplifier via the node $N_3$. Like the case of the memory cell $M_0$, data is amplified by the sense amplifier and written into the register 13 via the global bit lines.

After this, data items of the memory cells $M_2$, $M_3$, - - - can be sequentially read out and written into the register 13 by effecting the same readout operation as described above each time the word line $WL_1$, $WL_2$, - - - is selected.

While the data readout operation is effected on the side of the memory cell array $11_1$, the transfer gates $Q_{81}$ and $Q_{82}$ in the other memory cell array 112 are kept in the nonconductive state to electrically separate the bit lines $BL_2$ and $BL_3$ from the sense amplifier.

As described above, according to this embodiment, a single-ended sense amplifier type DRAM can be provided in which a differential sense amplifier is used, the precharge potential set immediately before the data readout operation is applied to one of the input nodes of the sense amplifier and bit line data is transferred to the other input node of the sense amplifier and then read out.

When the data readout operation is effected by selecting the second or one of the succeeding word lines $WL_1$, $WL_2$, - - - , the bit precharging operation effected for all of the bit lines before selecting the first word line $WL_0$ is not always necessary and may be omitted. Further, when the operation of reading out data series is effected by selecting a word line after the operation of reading out data series has been effected by selecting the preceding word line, the order of selecting the bit lines may be reversed with respect to the order in which the bit lines are selected in the case of the preceding word line. In this case, it is possible to omit one process of the bit line selecting operation at the time of selection of the next word line.

In this embodiment, two bit lines are provided for a pair of global bit lines, but three or more bit lines can be provided. In this case, the data readout operation is basically the same as that described in this embodiment.

Figure 55:
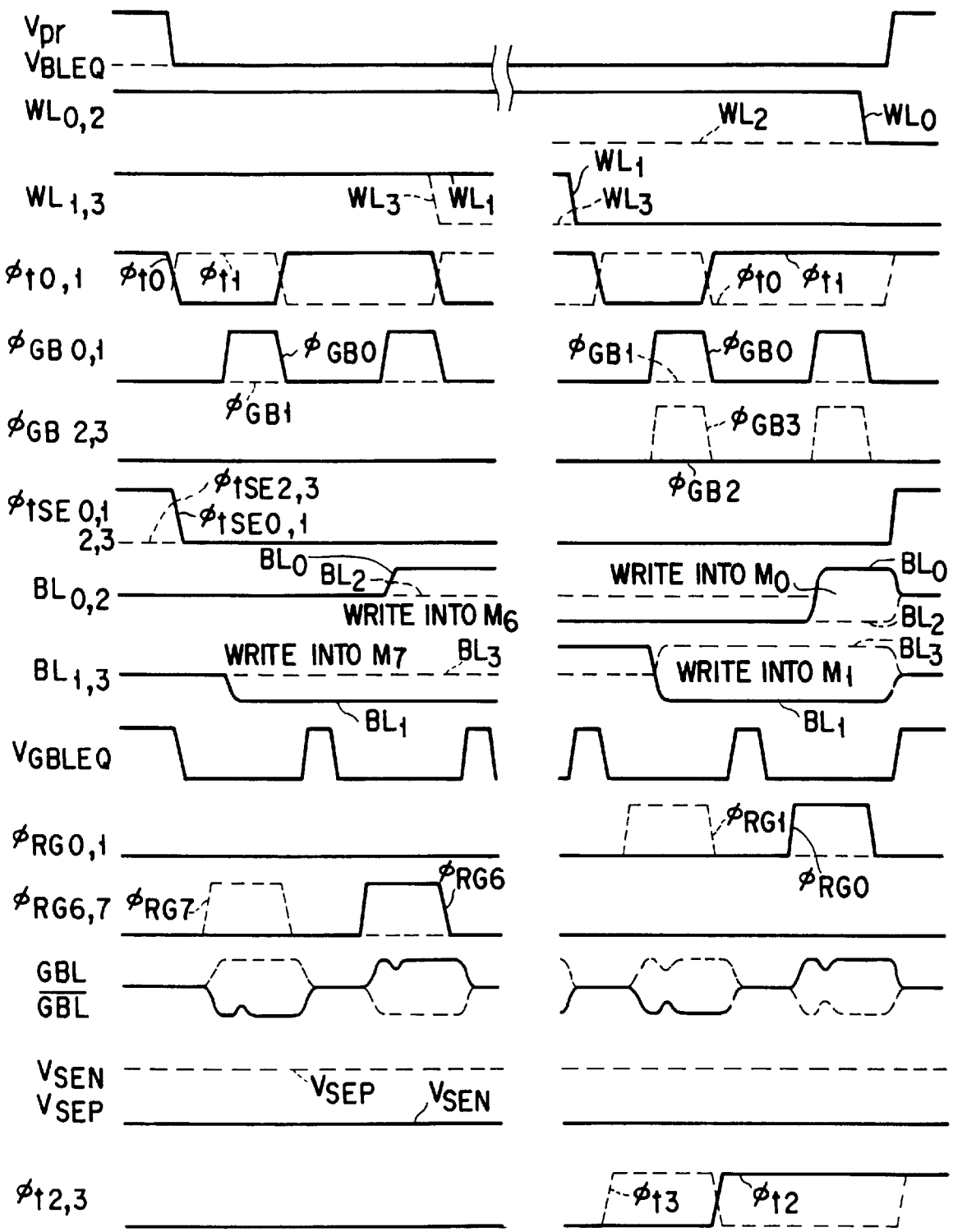
FIG. 55 is a timing diagram for illustrating the data write-in operation of the third embodiment.

The operation of writing data from the register of the DRAM of this embodiment into the memory cell is explained with reference to FIG. 55. The writing operation is effected in the reversed order of the readout operation, that is, in the order of memory cells $M_7$, $M_6$, $M_5$, - - - .

In the initial state, the paired global bit lines GBL and $\overline{GBL}$ are equalized. The potentials of the control signal lines $\phi_{tse0}$, $\phi_{tse1}$, $\phi_{t0}$ and $\phi_{t1}$, Vpr and $V_{BLEQ}$ are raised to turn on the transfer gates $Q_{86}$, $Q_{87}$, $Q_{81}$ and $Q_{82}$, precharge nMOS transistor $Q_{83}$ and equalizing nMOS transistor 80. A word line connected to a to-be-written memory cell is selected and the sense amplifier nodes BLD and BLREF, bit lines $BL_0$ and $BL_1$, and memory cell are equalized. The sense amplifier activating signals $V_{SEN}$ and $V_{SEP}$ are respectively set to the "L" and "H" levels to keep the sense amplifier in the de-activated state.

Next, data of the register 13 is read out to the global bit lines GBL and $\overline{GBL}$. In FIG. 55, the input/output control signal line $\phi_{RG7}$ is set at the "H" level. Next, the potential of the control signal line $\phi_{GB0}$ is raised to turn on the nMOS transistor $Q_{83}$ and data on the global bit lines is transferred to the bit line $BL_1$ via the node $N_3$ and written into the memory cell $M_7$ which is selected by the word line $WL_3$. At this time, the transfer gates $Q_{81}$ and $Q_{82}$ are respectively turned off and on.

After this, next data of the register 13 is read out, transferred to the bit line $BL_0$ and written into the memory cell $M_6$ arranged along the same word line $WL_3$. In this way, the operations of writing data into the memory cells are effected in the order of word lines $WL_2$, $WL_1$, - - - .

When data is written into the memory cell on the final word line $WL_0$, inverted data is written into the non-selected bit line of the memory cell array $11_2$, and when the operation of writing data into all of the memory cells is completed, the bit lines of the memory cell arrays $11_1$ and $11_2$ are equalized.

That is, when data is written into the memory cell on the word line $WL_0$, for example, when data is written into the bit line $BL_1$, the transfer gates $Q_{83}$, $Q_{95}$, $Q_{82}$ and $Q_{97}$ are turned on and inverted data of the data on the bit line $BL_1$ is written onto the bit line $BL_3$. When data is written into the bit line $BL_0$, the transfer gates $Q_{83}$, $Q_{81}$, $Q_{95}$ and $Q_{96}$ are turned on and inverted data of the data on the bit line $BL_0$ is written onto the bit line $BL_2$. After this, the transfer gates $Q_{81}$, $Q_{82}$, $Q_{87}$, $Q_{91}$, $Q_{92}$, $Q_{96}$ and $Q_{97}$ and equalizing transistor $Q_{80}$ are turned on and the bit lines $BL_0$ and $BL_1$ are directly connected to the respective bit lines $BL_2$ and $BL_3$ to equalize them.

By the above equalization between the bit lines, the precharge/equalizing operation for the next readout can be easily effected in a short time with low power consumption.

FIGS. 56 and 57 are diagrams showing the construction of a DRAM of a first modification of the third embodiment using the differential sense amplifier, that is, a DRAM of an embodiment in which a pair of bit lines $BL_0$ and $BL_1$ are arranged for one sense amplifier in an open bit line configuration.

Figure 58:
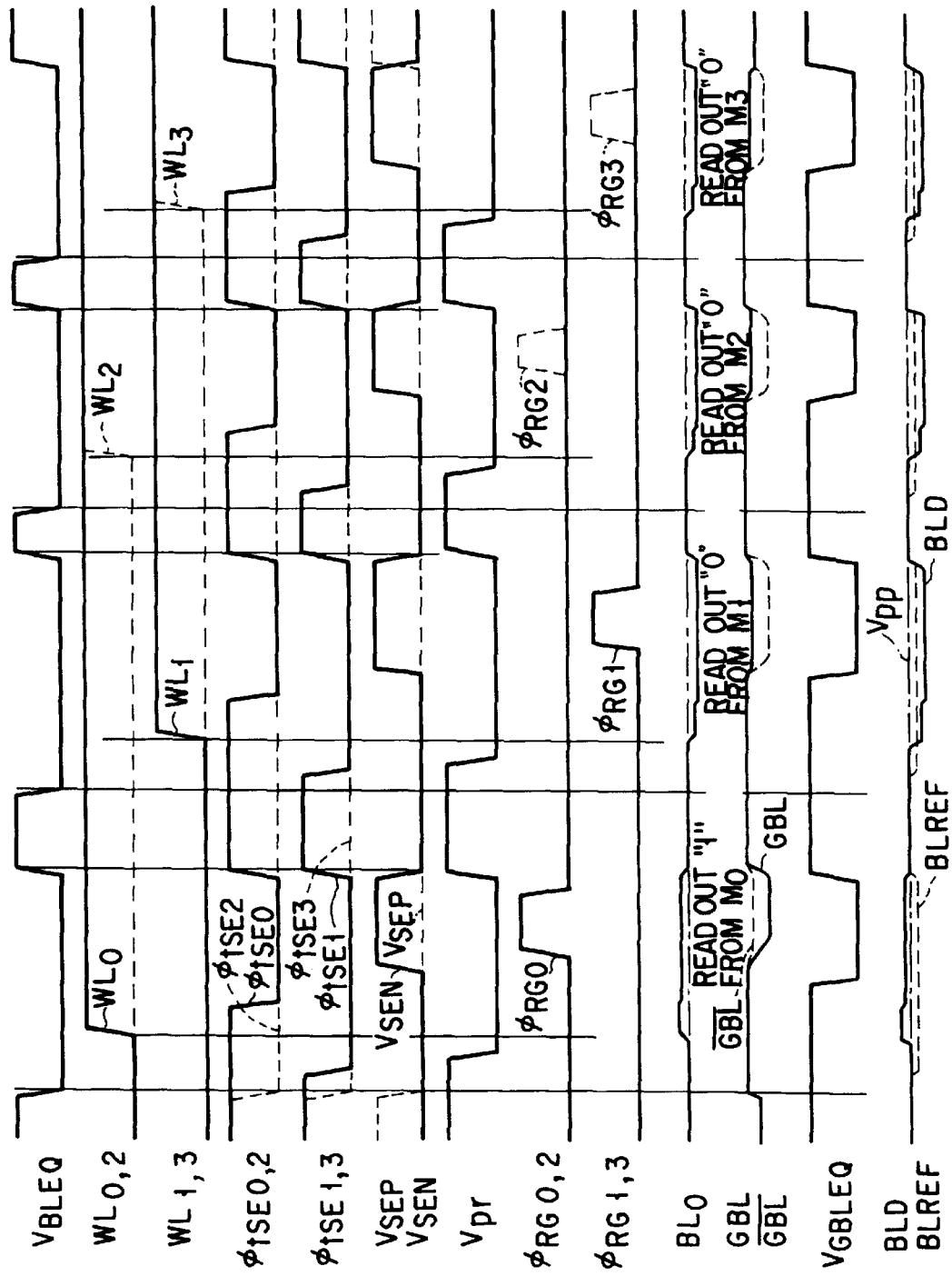
FIGS. 58 and 59 are timing diagrams for illustrating the data readout operation of the DRAM of the first modification of the third embodiment.
Figure 59:
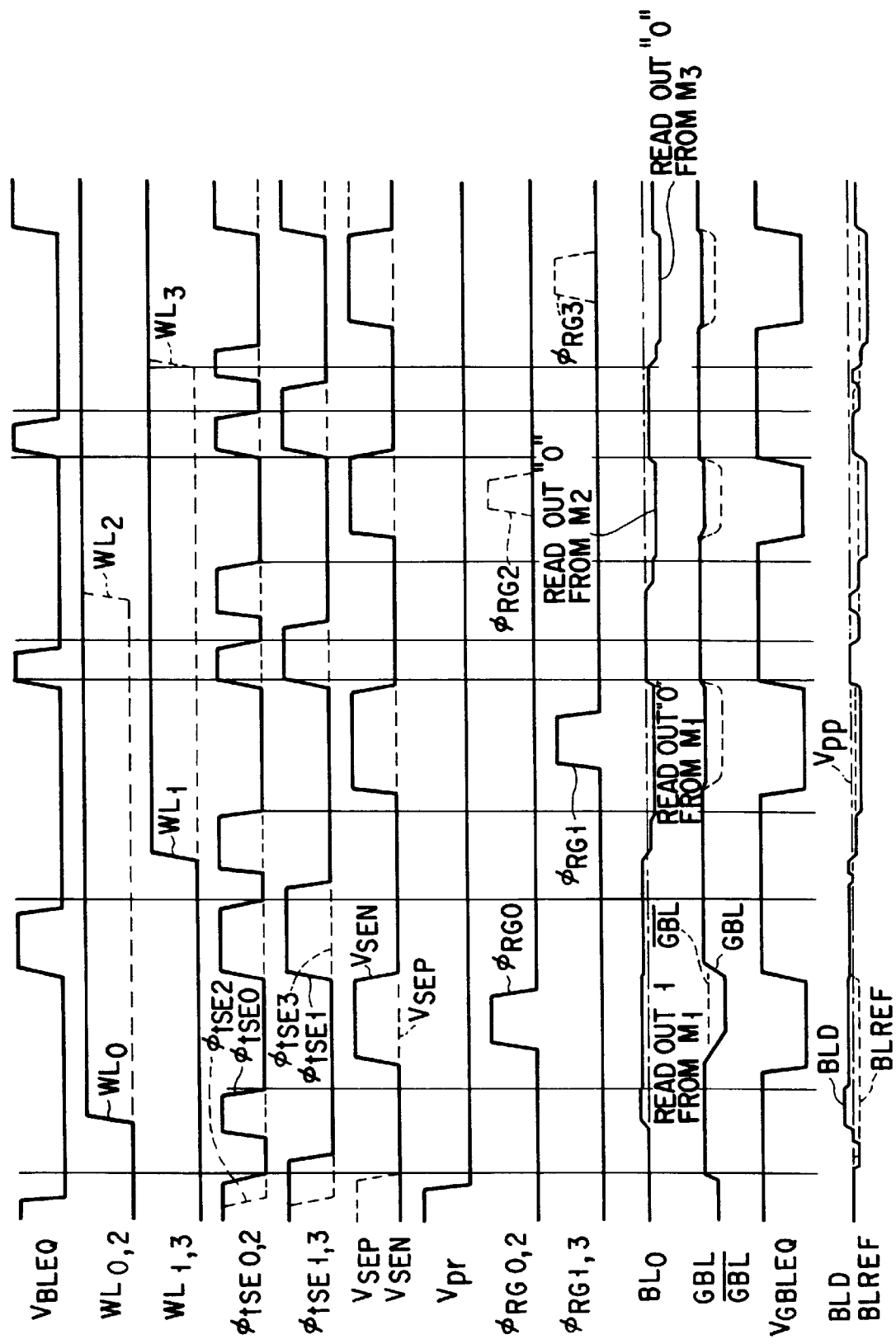

FIGS. 58 and 59 show waveforms for illustrating the data readout operation in this embodiment. FIG. 58 shows a case wherein the precharge/equalization operation for the sense amplifier nodes BLD, BLREF and selected bit line $BL_0$ is effected after the same data readout operation as in the former embodiment is effected. FIG. 59 shows a case wherein the equalization operation for the sense amplifier nodes BLD, BLREF and selected bit line $BL_0$ is effected and the precharge operation is not effected after the data readout operation is effected. In this embodiment, since a single bit line is provided for one sense amplifier, a potential set by reading out the previous data and effecting the equalizing operation can be used as a reference potential even if the precharge operation is not effected. In this case, the precharging time can be reduced.

FIG. 60 shows waveforms for illustrating the data write-in operation in this embodiment. Like the former embodiment, equalization between the bit lines can be realized by writing inverted data into the bit line of the memory cell array on the opposite side of the sense amplifier when data is written onto the final word line.

FIG. 61 is a diagram showing the construction of a DRAM of a second modification of the third embodiment using the differential sense amplifier.

In the device of this embodiment, one sense amplifier load section $12_2$ is commonly used for a plurality of sense amplifier driving sections $12_{11}$, $12_{12}$, - - - in a case where a plurality of memory cell arrays $11_1$, $11_2$, - - - and a plurality of sense amplifier arrays are connected between paired global bit lines GBL and $\overline{GBL}$. With this construction, the chip area can be effectively used.

Figure 62:
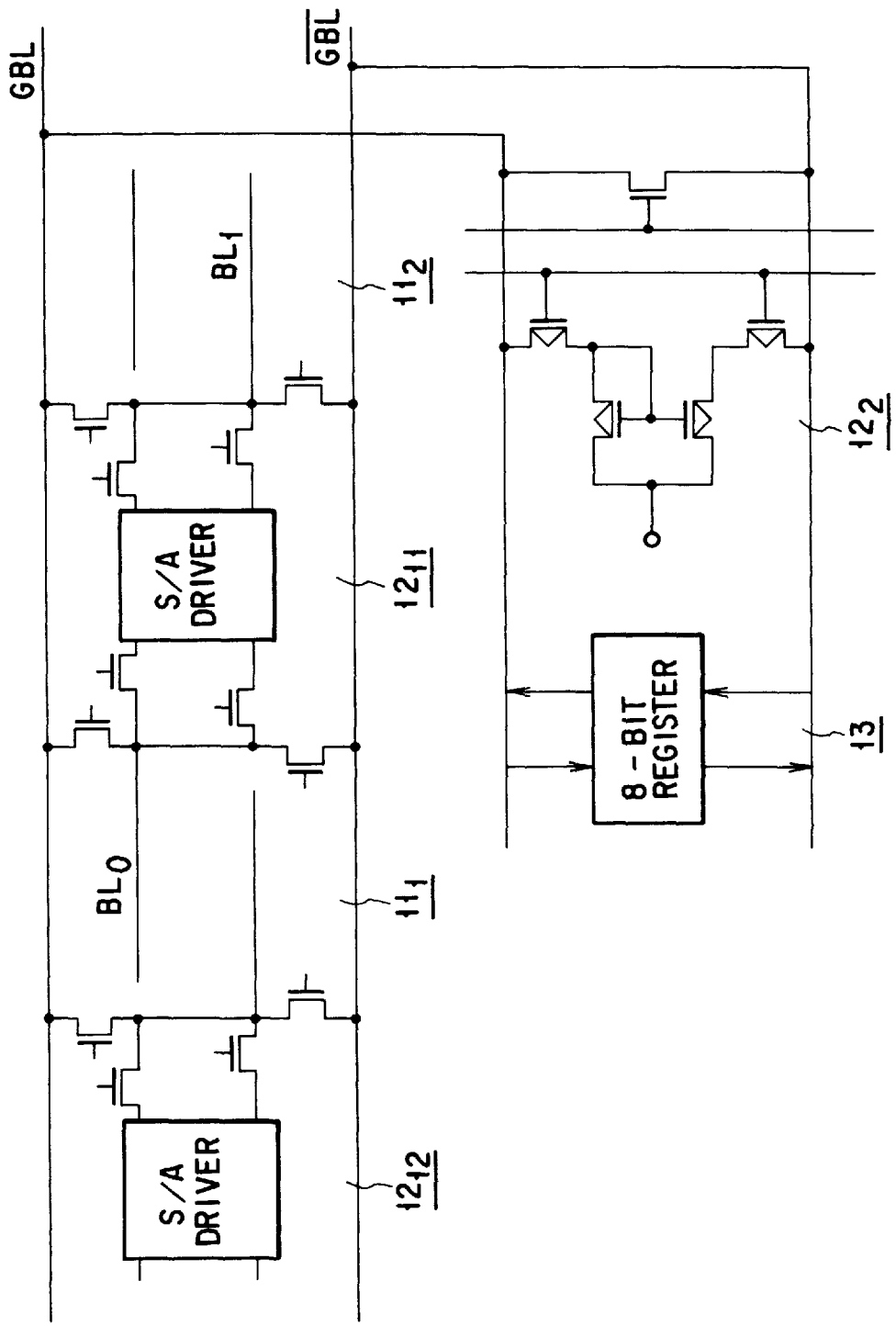
FIG. 62 is a diagram showing the construction of a DRAM of a third modification of the third embodiment using the differential sense amplifier.

FIG. 62 is a diagram showing the construction of a DRAM of a third modification of the third embodiment using the differential sense amplifier. The device of this embodiment is constructed with the pseudo-folded bit line structure in which one sense amplifier load section $12_2$ is commonly used for a plurality of sense amplifier driving sections $12_{11}$, $12_{12}$, - - - in a case where a plurality of memory cell arrays $11_1$, $11_2$, - - - and a plurality of sense amplifier arrays are arranged in the same manner as in the second modification.

Like the first and second embodiments, in the third embodiment, the NAND type memory cell unit is constructed by a plurality of series-connected memory cells, but the differential sense amplifier in these embodiments can also be used in a cell array in which memory cells are independently disposed at respective intersections between the word lines and the bit lines.

Next, an embodiment of this invention in which the global bit line is divided in a lengthwise direction to reduce the capacitance of the global bit line is explained.

FIG. 63 is a diagram showing the construction of a fourth embodiment of a DRAM according to this invention, that is, the construction of a DRAM of an embodiment in which a memory block is divided into sub-blocks to reduce the power consumption.

As the construction of the memory cell array and sense amplifier, those constructions used in the first, second or third embodiment can be used. In this embodiment, memory blocks which commonly use one input/output register 22 and are arranged on both sides of the register 22 are respectively divided into two sub-blocks $21_1$ and $21_2$ and sub-blocks $21_3$ and $21_4$. Global bit lines GBL and $\overline{GBL}$ which are generally continuously arranged in one memory block are respectively divided between the two sub-blocks $21_1$ and $21_2$ and between the two sub-blocks $21_3$ and $21_4$, and transfer gates $23_1$ and $23_2$ which are each formed of an nMOS transistor for selectively connecting the divided global bit lines to each other are respectively disposed between the sub-blocks $21_1$ and $21_2$ and between the sub-blocks $21_3$ and $21_4$.

In the construction in which the sub-block division is effected, an identification circuit 20 for receiving part of a row address and identifying the sub-block is provided. The sub-block identifying circuit 20 identifies a selected sub-block based on the received row address and outputs a transfer gate control signal $\phi_B$. When the sub-block $21_1$ or $21_3$ is selected, the control signal $\phi_B$ is set to the "L" level, and when the sub-block $21_2$ or $21_4$ is selected, the control signal $\phi_B$ is set to the "H" level.

For example, when the sub-block $21_1$ is selected in the memory block on the right side, the transfer gates $23_1$ are turned on to electrically connect the global bit lines in the sub-block $21_1$ to the respective global bit lines in the sub-block $21_2$. As a result, data transfer between the selected memory cell in the sub-block $21_2$ and the input/output register 22 can be effected via the global bit lines GBL and $\overline{GBL}$. When the sub-block 211 is selected, the transfer gates $23_1$ are turned off to electrically separate the global bit lines GBL and $\overline{GBL}$ in the sub-block $21_2$ which lies at a far distance from the input/output register 22 from the global bit lines GBL and $\overline{GBL}$ in the sub-block $21_1$. The same operation as described above is effected for the memory block on the left side.

Thus, the global bit line capacitance set when the sub-block $21_1$ is selected can be reduced to half the value obtained in the ordinary case by effecting the sub-block identification and the operation of connecting or disconnecting the global bit lines. Therefore, the power consumption for charging and discharging the global bit lines can be reduced.

FIG. 64 is a diagram showing the construction of a DRAM of a first modification of the fourth embodiment in which the memory block is divided into the sub-blocks to reduce the power consumption. In this modification, input/output registers $22_1$ and $22_2$ are independently provided for two memory blocks. The sub-block division is the same as in the embodiment of FIG. 63. In this embodiment, since the input/output register is provided for each memory block, cells of the right and left memory blocks can be simultaneously selected by use of one row address. For example, the row addresses for cells in the sub-block $21_1$ may be set to be the same as the respective row addresses for corresponding cells in the sub-block $21_4$, and the row addresses for cells in the sub-block $21_2$ may be set to be the same as the respective row addresses for corresponding cells in the sub-block $21_3$.

The output control signal $\phi_B$ of the sub-block identifying circuit 20 is set to the "L" level when the sub-block $21_1$ is selected and is set to the "H" level when the sub-block $21_2$ is selected. The control signal $\phi_B$ is supplied to the transfer gate $21_3$ between the sub-blocks $21_1$ and $21_2$ and a signal obtained by inverting the control signal $\phi_B$ by means of an inverter 24 is supplied to the transfer gates $23_2$ in the left memory block.

Therefore, in the case of this embodiment, the transfer gates $23_1$ are turned on when the cells in the sub-block $21_2$ are selected, and at the same time, the cells in the sub-block $21_3$ are selected and the transfer gates $23_2$ on the left side are turned off. That is, the global bit lines in the sub-block $21_4$ are electrically separated. When the cells in the sub-block $21_1$ are selected, the cells in the sub-block $21_4$ are selected, and at this time, the transfer gates $23_1$ are turned off and the transfer gates $23_2$ are turned on. That is, the global bit lines in the sub-block $21_2$ are electrically separated.

According to this embodiment, when any row address is input, the global bit line capacitance can be reduced by an amount corresponding to one sub-block, and therefore, the current consumption by the charge and discharge of the global bit lines can be reduced to ¾ of the value obtained in the ordinary case.

Figure 65:
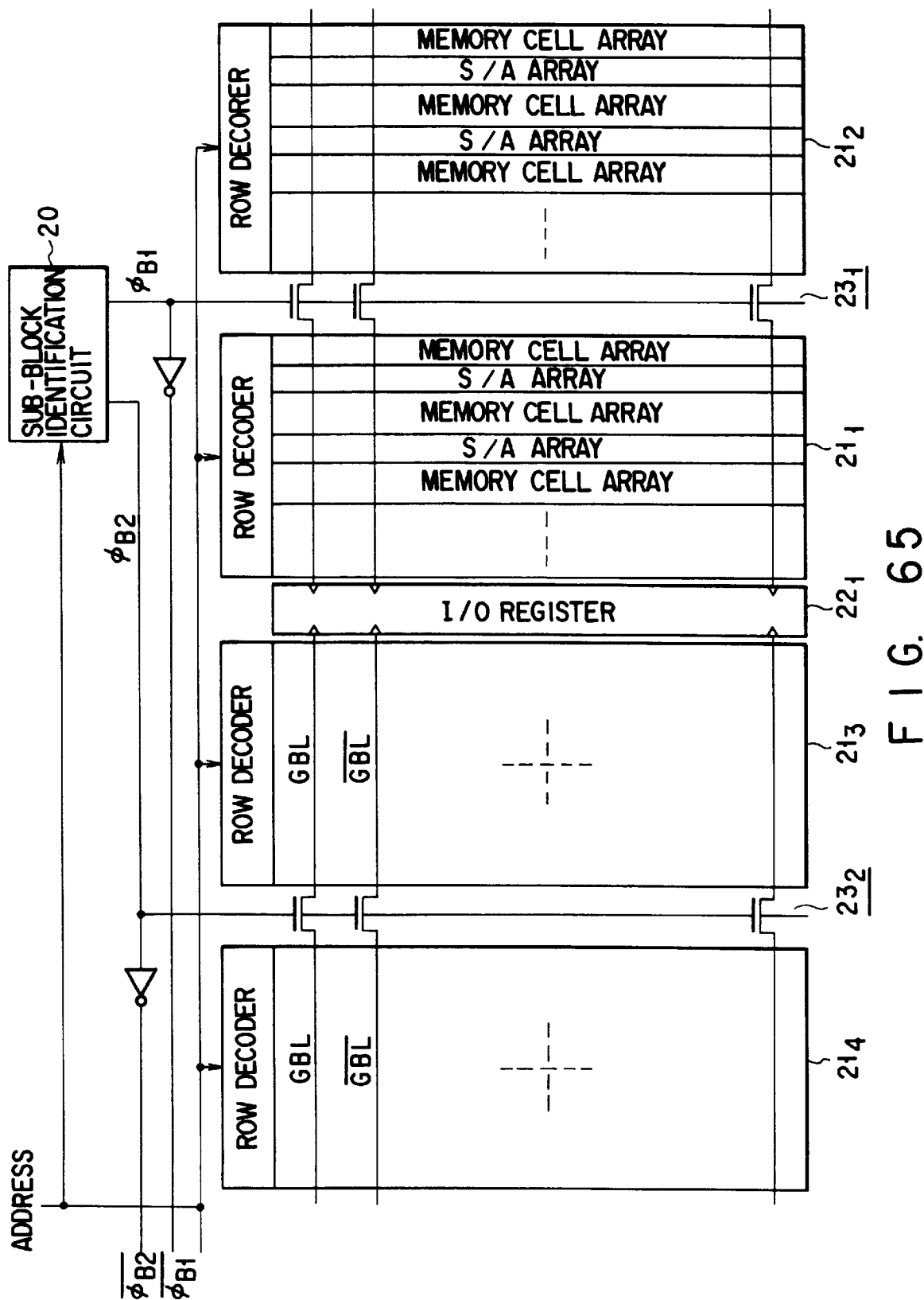

FIGS. 65 and 66 are diagrams showing the construction of a DRAM of a second modification of the fourth embodiment in which the memory block is divided into the sub-blocks to reduce the power consumption.

In this embodiment, one of the two memory blocks is divided into four sub-blocks $21_1$ to $21_4$ (FIG. 65) and the other memory block is divided into four sub-blocks $21_5$ to $21_8$ (FIG. 66). Input/output registers $22_1$ and $22_2$ are arranged in the central areas of the respective memory blocks. Transfer gates $23_1$ to $23_4$ for selectively connecting the global bit lines in the corresponding sub-blocks to each other are respectively arranged between the sub-blocks $21_1$ and $21_2$, the sub-blocks $21_3$ and $21_4$, the sub-blocks $21_5$ and $21_6$, and the sub-blocks $21_7$ and $21_8$. The same row addresses are respectively assigned to the sub-blocks $21_1$ and $21_6$, the sub-blocks $21_2$ and $21_5$, the sub-blocks $21_3$ and $21_8$, and the sub-blocks $21_4$ and $21_7$. A sub-block identifying circuit 20 receives part of the row address and generates a control signal $\phi_{B1}$ which is set to the "H" level when the sub-block $21_2$ (or the sub-block $21_5$) is selected and a control signal $\phi_{B2}$ which is set to the "H" level when the sub-block $21_4$ (or the sub-block $21_7$) is selected. The control signal $\phi_{B1}$ is applied to the transfer gates $23_1$ and the control signal $\phi_{B2}$ is applied to the transfer gates $23_2$, and signals obtained by inverting the control signals $\phi_{B1}$ and $\phi_{B2}$ by use of inverters 25 and 26 are respectively applied to the transfer gates $23_3$ and $23_4$.

When the memory cells in the sub-block $21_1$ are selected, the control signal $\phi_{B1}$ is set to the "L" level to turn off the transfer gates $23_1$ so that the memory cells in the sub-block $21_1$ may be connected to the input/output register $22_1$ with the global bit lines on the sub-block $21_2$ electrically separated therefrom. At this time, the memory cells in the sub-block $21_6$ are also selected. In this case, since the control signal $\overline{\phi_{B1}}$ is set at the "H" level, the transfer gate $23_3$ is set in the ON state so that the memory cells in the sub-block $21_6$ may be connected to the input/output register $22_2$ via the global bit lines on the sub-block $21_5$.

Next, when the memory cells in the sub-block $21_2$ are selected, the control signal $\phi_{B1}$ is set at the "H" level to turn on the transfer gate $23_1$ so that the memory cells in the sub-block $21_2$ may be connected to the input/output register $22_1$ via the global bit lines on the sub-block $21_1$. At this time, the memory cells in the sub-block $21_5$ are also selected. In this case, since the control signal $\overline{\phi_{B1}}$ is set at the "L" level, the transfer gate $23_3$ is set in the OFF state so that the memory cells in the sub-block $21_5$ may be connected to the input/output register $22_2$ with the global bit lines on the sub-block $21_5$ electrically separated therefrom.

Likewise, when the memory cells in the other sub-block are selected, data transfer is effected with the global bit lines which are useless for the data transfer electrically separated therefrom. In this embodiment, since the length of the global bit lines on the sub-block is approximately half that of the embodiment shown in FIG. 64, the current consumption by the charge and discharge of the global bit lines can be further reduced to ½ of that of the case of the former embodiment.

The I/O register of the third embodiment shown in FIGS. 43 and 44 can be applied to the I/O register of the fourth embodiment shown in FIGS. 63 to 66.

Figure 67:
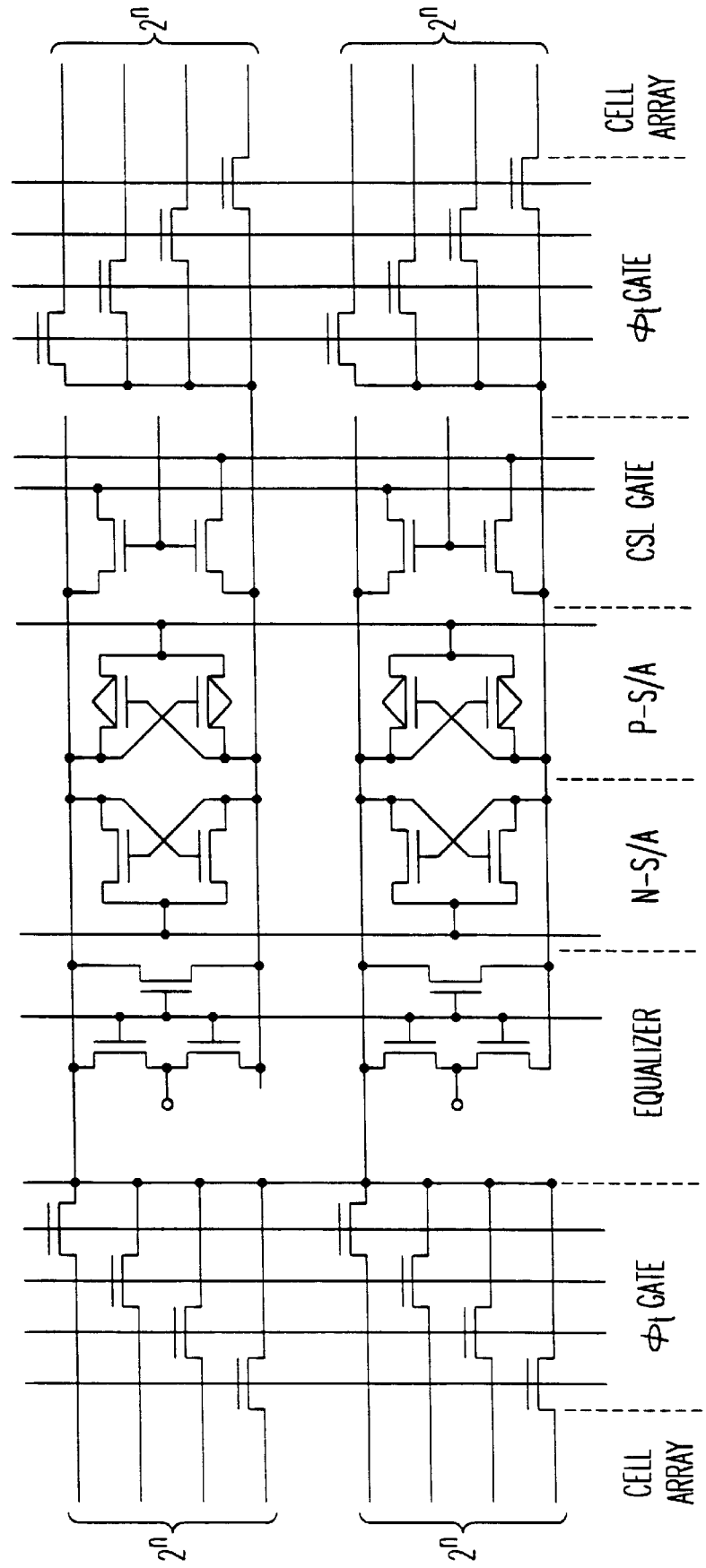
FIG. 67 is a diagram showing the construction of a fifth embodiment of a DRAM according to this invention.

FIG. 67 shows the construction of a fifth embodiment of a DRAM according to this invention.

In the construction shown in FIG. 67, each of the memory cells may have its own bit line contact; alternatively, a number of memory cells may be connected in series.

In the fifth embodiment, one sense amplifier is used for $2^n$ bit lines. Since a logical operation is normally performed based on binary data, the number of bit lines provided for one sense amplifier is preferably $2^n$. Where the number of bit lines is determined as $2^n$, the number of $\phi_t$ gates required is also $2^n$, thus simplifying the control operation. In addition, since one sense amplifier is shared by a number of bit lines, the sense amplifiers can be easily laid out.

Figure 68:
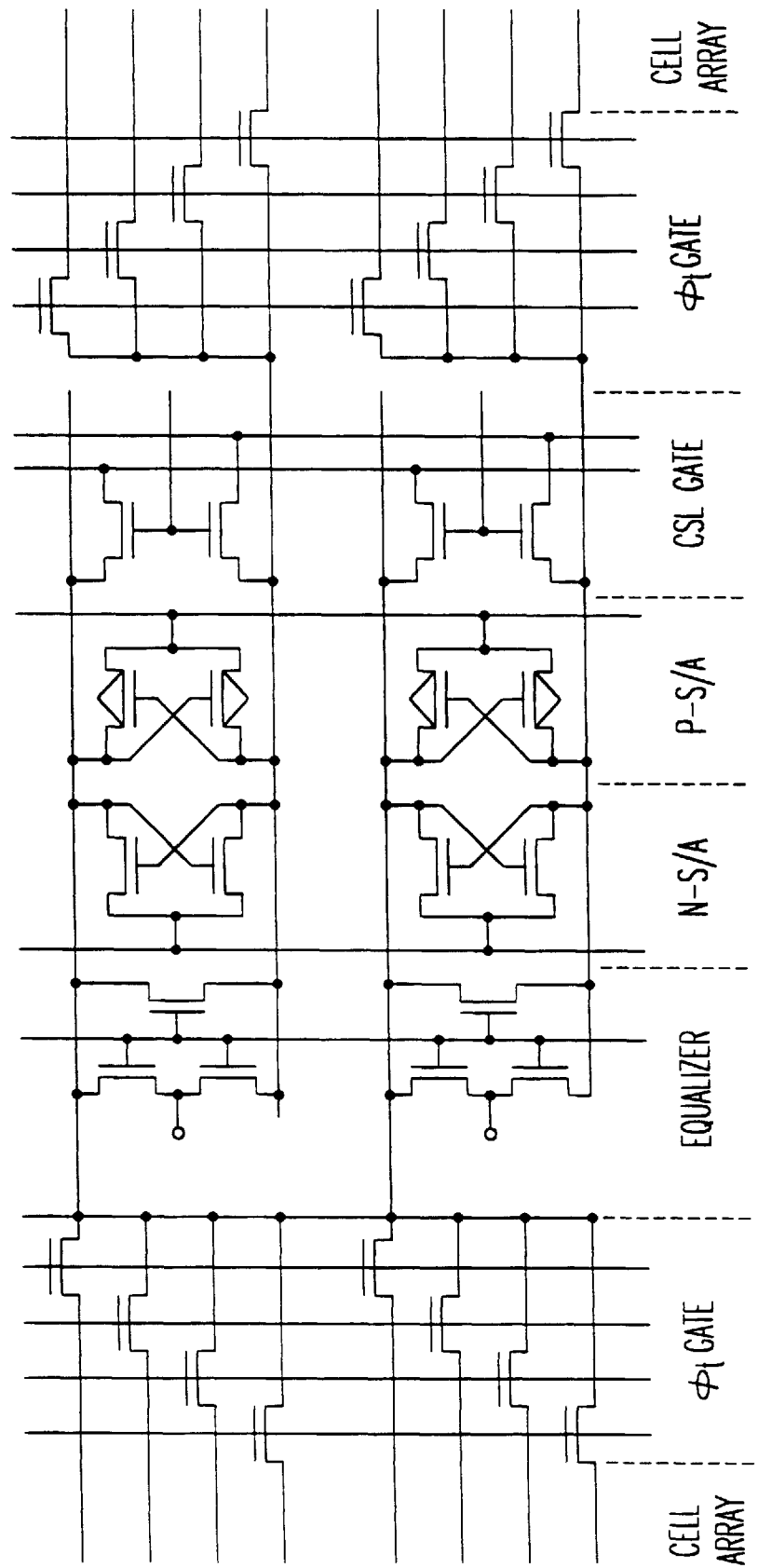
FIG. 68 is a diagram showing the construction of a sixth embodiment of a DRAM according to this invention.

FIG. 68 shows the construction of a sixth embodiment of a DRAM according to this invention. In the construction shown in FIG. 68, one sense amplifier is provided for four bit lines, so as to reduce the area required on a chip.

FIGS. 69A to 69C are circuit diagrams respectively showing the case where two bit lines share one sense amplifier, the case where four bit lines share one sense amplifier, and the case where eight bit lines share one sense amplifier.

Where, as is shown in FIG. 69A, one sense amplifier is shared by two bit lines, the sense amplifiers cannot be easily arranged at the same pitch as that of the two bit lines. Therefore, the sense amplifiers are arranged at the same pitch as that of four bit lines in such a manner that the sense amplifiers are located at each side of the cell array. With this arrangement, the area required for the sense amplifiers is twice as wide as the area required in the case of the arrangement shown in FIG. 69B, wherein one sense amplifier is shared by four bit lines.

Where, as shown in FIG. 69C, one sense amplifier is shared by eight bit lines, sense amplifiers (P-S/A, N-S/A), an equalizer gate, and a CSL gate can be laid out in the area corresponding to eight bit lines. Although this area is somewhat limited in width, the number of $\phi_t$ gates is doubled. As a result, the area (width) required for the layout of the sense amplifiers is wider than the area required in the case where one sense amplifier is shared by four bit lines.

The relationships between the area (width) required for the layout of sense amplifiers and the number of bit lines sharing one sense amplifier are shown in FIGS. 70A and 70B. Even where one sense amplifier (P-S/A) is shared by eight or more bit lines, the width of the sense amplifier remains the same since the N-type well surrounding the sense amplifier cannot be reduced in width. Since each of the other elements, namely the CSL gate, sense amplifier (N-S/A) and the equalizer gate, cannot be designed to be smaller than the minimum area (width) for one transistor, the width of the area required for the layout of the sense amplifier remains substantially the same even where one sense amplifier is shared by the eight or more bit lines. In the case where one sense amplifier is used in common to eight bit lines, the area required for the layout of that sense amplifier will be wide as a whole, due to an increase in the number of $\phi_t$ gates required. Therefore, the arrangement wherein one sense amplifier is shared by four bit lines is most advantageous in reducing the area required on the chip.

Figure 71:
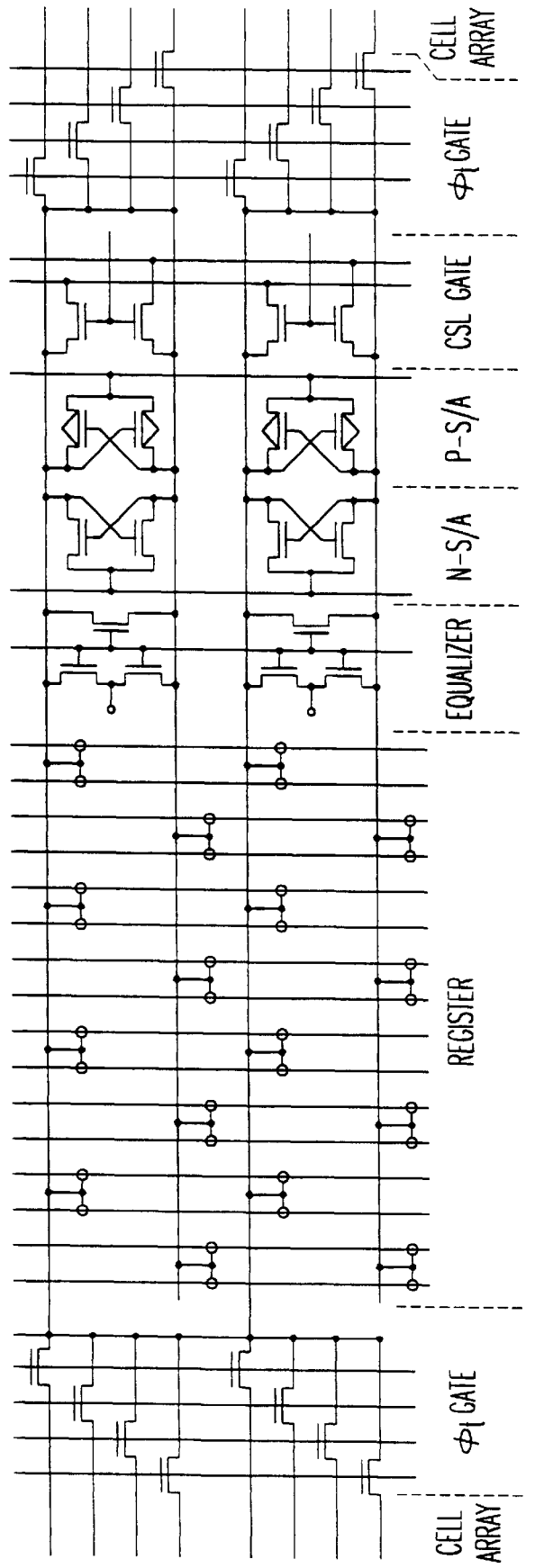
FIG. 71 is a diagram showing the construction of a seventh embodiment of a DRAM according to this invention, i.e., the embodiment wherein four of the memory cells of a memory cell array are connected in series.

FIG. 71 is a diagram showing the construction of a seventh embodiment of a DRAM according to this invention, i.e., the embodiment wherein four of the memory cells of a memory cell array are connected in series.

In the embodiment shown in FIG. 71, sixteen register cells (4[bit lines]×4[cells connected in series]) are connected to one sense amplifier. The number of register cells may be varied in accordance with the cell structure. For example, when two cells are connected in series, eight register cells are employed (4×2). When the cells are not connected in series, four register cells are employed (4>1).

In the embodiment shown in FIG. 71, eight of the cells of the registers are arranged between bit lines BL (which are connected to a sense-amplified node) and bit lines BL in a folded manner, so as to store 16-bit data.

With this cell arrangement, the capacitances of the adjacent bit lines in the sense amplifier can be balanced well, and the generation of noise can be suppressed. in addition, the area for the register can be as narrow as possible.

FIGS. 72A to 72C are circuit diagrams respectively showing the case where one sense amplifier is shared by two bit lines, the case where one sense amplifier is shared by four bit lines, and the case where one sense amplifier is shared by eight bit lines. FIGS. 73A and 73B show how the areas for the sense amplifiers can be narrowed in each of the cases shown in FIGS. 72A to 72C. As can be understood from these Figures, the arrangement wherein one sense amplifier is shared by four bit lines is most advantageous in reducing the area required on the chip, as in the case of the fifth embodiment mentioned above.

In each of the embodiments described above, reference was made of the case where four cells are connected in series. However, dynamic cells of conventional types may be connected in series, in which case four cells constitute a register.

This invention is not limited to the above embodiments and can be variously modified without departing from the technical scope thereof.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A dynamic semiconductor memory device comprising:
a first memory sub-block which includes a first plurality of memory cell arrays;
a second memory sub-block which includes a second plurality of memory cell arrays;
a plurality of first signal lines connected to said first and second memory sub-blocks and connected to a plurality of first gates connected between said first and second memory sub-blocks;
a third memory sub-block which includes a third plurality of memory cell arrays;
a fourth memory sub-block which includes a fourth plurality of memory cell arrays;
a plurality of second signal lines connected to said third and fourth memory sub-blocks and connected to a plurality of second gates connected between said third and fourth memory sub-blocks; and
an input/output register receiving a select signal and connected between said second and third memory sub-blocks for inputting/outputting data into/from one of said first to fourth memory sub-blocks based on said select signal.

2. A dynamic semiconductor memory device according to claim 1, wherein said plurality of first gates are turned on if said first memory sub-block is selected.

3. A dynamic semiconductor memory device according to claim 1, wherein said plurality of second gates are turned on if said fourth memory sub-block is selected.

4. A dynamic semiconductor memory device according to claim 1, wherein said plurality of first and second gates are turned off if one of said second and third memory sub-block are selected.

5. A dynamic semiconductor memory device according to claim 1, further comprising a plurality of sense amplifiers connected between adjacent two of said memory cell arrays.

6. A dynamic semiconductor memory device comprising:
a first memory sub-block which includes a first plurality of memory cell arrays;
a second memory sub-block which includes a second plurality of memory cell arrays;
a plurality of first signal lines connected to said first and second memory sub-blocks and connected to a plurality of first gates connected between said first and second memory sub-blocks;
a third memory sub-block which includes a third plurality of memory cell arrays;
a fourth memory sub-block which includes a fourth plurality of memory cell arrays;
a plurality of second signal lines connected to said third and fourth memory sub-blocks and connected to a plurality of second gates connected between said third and fourth memory sub-blocks;
a first input/output register receiving a select signal and connected between said second and third memory sub-blocks for inputting/output data into/from one of said first and second memory sub-blocks based on said select signal; and
a second input/output register receiving said select signal and connected between said second and third memory sub-blocks for inputting/outputting data into/from one of said third and fourth memory sub-blocks based on said select signal.

7. A dynamic semiconductor memory device according to claim 6, wherein said plurality of first gates are turned on if said first memory sub-block is selected.

8. A dynamic semiconductor memory device according to claim 6, wherein said plurality of second gates are turned on if said fourth memory sub-block is selected.

9. A dynamic semiconductor memory device according to claim 6, wherein said plurality of first and second gates are turned off if one of said second and third memory sub-block are selected.

10. A dynamic semiconductor memory device according to claim 6, further comprising a plurality of sense amplifiers connected between adjacent two of said memory cell arrays.

* * * * *